United States Patent
Choi et al.

(10) Patent No.: US 12,249,606 B2
(45) Date of Patent: *Mar. 11, 2025

(54) INTEGRATED CIRCUIT DEVICE

(71) Applicant: Samsung Electronics Co., Ltd., Suwon-si (KR)

(72) Inventors: Minhee Choi, Suwon-si (KR); Keunhwi Cho, Seoul (KR); Myunggil Kang, Suwon-si (KR); Seokhoon Kim, Suwon-si (KR); Dongwon Kim, Seongnam-si (KR); Pankwi Park, Incheon (KR); Dongsuk Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/414,039

(22) Filed: Jan. 16, 2024

(65) Prior Publication Data

US 2024/0153954 A1    May 9, 2024

Related U.S. Application Data

(63) Continuation of application No. 18/122,253, filed on Mar. 16, 2023, now Pat. No. 11,948,942, which is a
(Continued)

(30) Foreign Application Priority Data

Aug. 12, 2020 (KR) .................. 10-2020-0101392

(51) Int. Cl.
*H01L 27/092* (2006.01)
*H01L 21/02* (2006.01)
(Continued)

(52) U.S. Cl.
CPC .... *H01L 27/0924* (2013.01); *H01L 21/02532* (2013.01); *H01L 21/02579* (2013.01);
(Continued)

(58) Field of Classification Search
CPC ........ H01L 21/02532; H01L 21/02579; H01L 21/02603; H01L 21/0262;
(Continued)

(56) References Cited

U.S. PATENT DOCUMENTS

| | | | |
|---|---|---|---|
| 7,687,357 B2 | 3/2010 | Kim et al. | |
| 8,802,533 B1 | 8/2014 | Qin et al. | |

(Continued)

FOREIGN PATENT DOCUMENTS

| | | |
|---|---|---|
| TW | 201911375 A | 3/2019 |
| TW | 201926681 A | 7/2019 |

(Continued)

OTHER PUBLICATIONS

First OA dated Jan. 16, 2025, for corresponding TW Patent Application No. 110118366.

*Primary Examiner* — David C Spalla
(74) *Attorney, Agent, or Firm* — Muir Patent Law, PLLC

(57) ABSTRACT

An integrated circuit device includes a fin-type active area along a first horizontal direction on a substrate, a device isolation layer on opposite sidewalls of the fin-type active area, a gate structure along a second horizontal direction crossing the first horizontal direction, the gate structure being on the fin-type active area and on the device isolation layer, and a source/drain area on the fin-type active area, the source/drain area being adjacent to the gate structure, and including an outer blocking layer, an inner blocking layer, and a main body layer sequentially stacked on the fin-type active area, and each of the outer blocking layer and the
(Continued)

main body layer including a $Si_{1-x}Ge_x$ layer, where $x \neq 0$, and the inner blocking layer including a Si layer.

20 Claims, 50 Drawing Sheets

Related U.S. Application Data continuation of application No. 17/231,114, filed on Apr. 15, 2021, now Pat. No. 11,631,674.

(51) Int. Cl.
*H01L 29/06* (2006.01)
*H01L 29/08* (2006.01)
*H01L 29/161* (2006.01)
*H01L 29/167* (2006.01)
*H01L 29/423* (2006.01)
*H01L 29/66* (2006.01)
*H01L 29/775* (2006.01)
*H01L 29/78* (2006.01)

(52) U.S. Cl.
CPC ...... *H01L 21/0262* (2013.01); *H01L 29/0673* (2013.01); *H01L 29/0847* (2013.01); *H01L 29/161* (2013.01); *H01L 29/167* (2013.01); *H01L 29/42392* (2013.01); *H01L 29/66439* (2013.01); *H01L 29/66795* (2013.01); *H01L 29/775* (2013.01); *H01L 29/7851* (2013.01)

(58) Field of Classification Search
CPC ..... H01L 21/823431; H01L 21/823821; H01L 21/845; H01L 27/0886; H01L 27/0924; H01L 27/1211; H01L 29/0665; H01L 29/0669; H01L 29/0673; H01L 29/0847; H01L 29/161; H01L 29/167; H01L 29/41791; H01L 29/42392; H01L 29/66439; H01L 29/66636; H01L 29/66795; H01L 29/775; H01L 29/7848; H01L 29/785; H01L 29/7851; H01L 29/7853; H01L 29/7855; H01L 29/78618; H01L 2029/7858

See application file for complete search history.

(56) References Cited

U.S. PATENT DOCUMENTS

| | | |
|---|---|---|
| 9,064,944 B2 | 6/2015 | Kim et al. |
| 9,178,045 B2 | 11/2015 | Obradovic et al. |
| 9,577,100 B2 | 2/2017 | Cheng et al. |
| 9,601,619 B2 | 3/2017 | Sung et al. |
| 9,741,824 B2 | 8/2017 | Tu et al. |
| 10,109,717 B2 | 10/2018 | Lee et al. |
| 11,631,674 B2* | 4/2023 | Choi .................. H01L 29/0847 257/288 |
| 11,948,942 B2* | 4/2024 | Choi .................. H01L 21/0262 |
| 2018/0151732 A1 | 5/2018 | Mehandru et al. |
| 2019/0067490 A1 | 2/2019 | Yang et al. |
| 2019/0295899 A1 | 9/2019 | Seo et al. |
| 2019/0312143 A1 | 10/2019 | Lin et al. |
| 2019/0348500 A1 | 11/2019 | Glass et al. |
| 2019/0348501 A1 | 11/2019 | Glass et al. |
| 2020/0020771 A1 | 1/2020 | Chen et al. |
| 2020/0044045 A1* | 2/2020 | Wang ................ H01L 29/66439 |
| 2020/0168723 A1* | 5/2020 | Hsu ........................ H10B 10/12 |
| 2021/0082914 A1 | 3/2021 | Lee et al. |

FOREIGN PATENT DOCUMENTS

| | | |
|---|---|---|
| TW | 202017059 A | 5/2020 |
| TW | 202020949 A | 6/2020 |

\* cited by examiner

INTEGRATED CIRCUIT DEVICE

CROSS-REFERENCE TO RELATED APPLICATION

This application is a continuation application of U.S. Patent Application Ser. No. 18/122,253, filed Mar. 16, 2023, which is a continuation application of U.S. Patent application Ser. No. 17/231,114 filed Apr. 15, 2021, each of which is incorporated by reference herein in its entirety.

Korean Patent Application No. 10-2020-0101392, filed on Aug. 12, 2020, in the Korean Intellectual Property Office, and entitled: "Integrated Circuit Device," is incorporated by reference herein in its entirety.

BACKGROUND

1. Field

Embodiments relate to an integrated circuit device, and more particularly, to an integrated circuit device including a field-effect transistor.

2. Description of the Related Art

As the size of the integrated circuit device decreases, it is necessary to increase the degree of integration of the field effect transistor on a substrate. Accordingly, a horizontal nanosheet field effect transistor (hNSFET) including a plurality of horizontal nanosheets stacked on the same layout area has been developed.

SUMMARY

According to an aspect of embodiments, there is provided an integrated circuit device including a fin-type active area that is long a first horizontal direction on a substrate, a device isolation layer covering both sidewalls of the fin-type active area on the substrate, a gate structure that is long a second horizontal direction crossing the first horizontal direction on the fin-type active area and the device isolation layer, and a source/drain area arranged on the fin-type active area at a position adjacent to the gate structure, wherein the source/drain area includes an outer blocking layer, an inner blocking layer, and a main body layer sequentially stacked in a direction away from the fin-type active area, wherein each of the outer blocking layer and the main body layer includes a $Si_{1-x}Ge_x$ layer (where $x \neq 0$), and the inner blocking layer includes a Si layer.

According to another aspect of embodiments, there is provided an integrated circuit device including a fin-type active area that is long a first horizontal direction on a substrate, a nanosheet stack including a plurality of nanosheets facing a fin top of the fin-type active area at a position apart from the fin top of the fin-type active area and having different vertical distances from the fin top, and a source/drain areas facing the plurality of nanosheets in the first horizontal direction, wherein the source/drain area includes an outer blocking layer, an inner blocking layer, and a main body layer that are sequentially stacked away from the nanosheet stack in the first horizontal direction, wherein each of the outer blocking layer and the main body layer includes a $Si_{1-x}Ge_x$ layer (where $x \neq 0$), and the inner blocking layer includes a Si layer.

According to another aspect of embodiments, there is provided an integrated circuit device including a first fin-type active area that is long a first horizontal direction on a first area of a substrate, a pair of first nanosheet stacks arranged on the first fin-type active area, and a first source/drain area filling a first recess between the pair of first nanosheet stacks on the first fin-type active area, wherein the first source/drain area includes a first outer blocking layer including a first $Si_{1-x}Ge_x$ layer (where $0<x<0.15$) in contact with the first fin-type active area and the first nanosheet stacks and doped with a first dopant, a first inner blocking layer arranged on the first outer blocking layer in the first recess, having a portion with a width greater than that of the first outer blocking layer on at least a portion of a sidewall of each of the pair of first nanosheet stacks, and including a Si layer, and a first main body layer including a second $Si_{1-x}Ge_x$ layer (where $0.15 \leq x < 0.7$) filling the first recess on the first inner blocking layer and doped with the first dopant.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
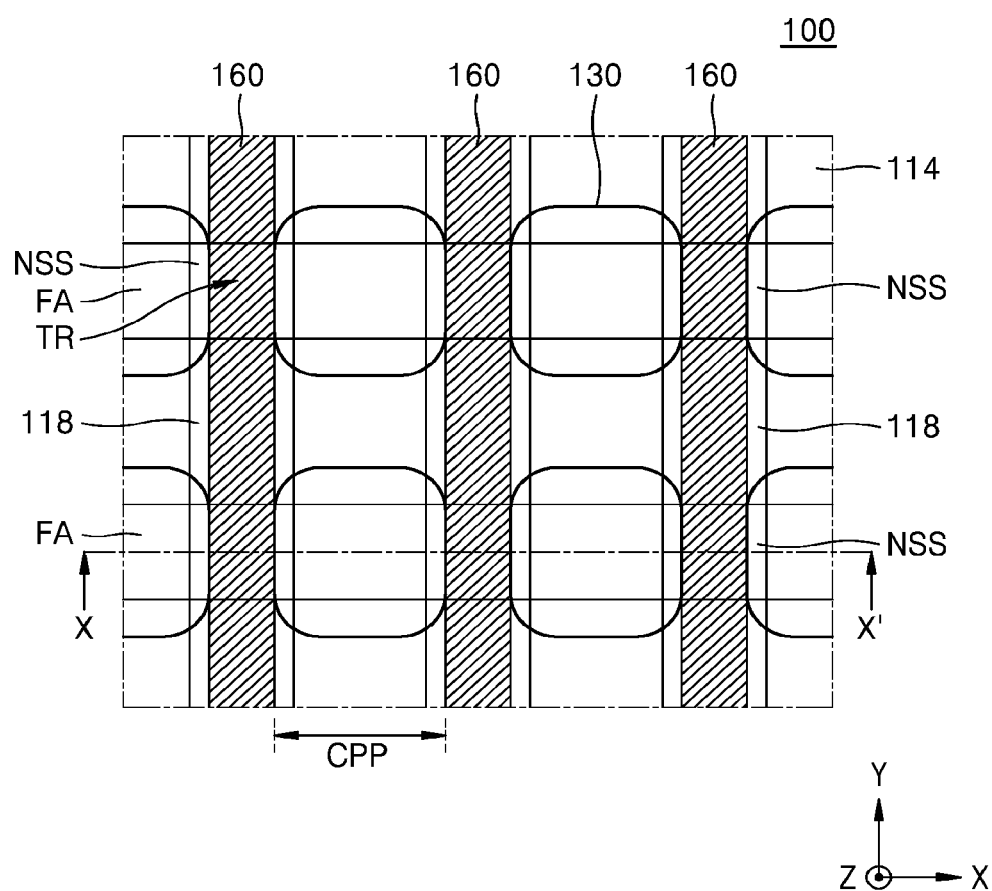
FIG. 1 is a plan layout of an integrated circuit device according to embodiments.
Figure 2A:
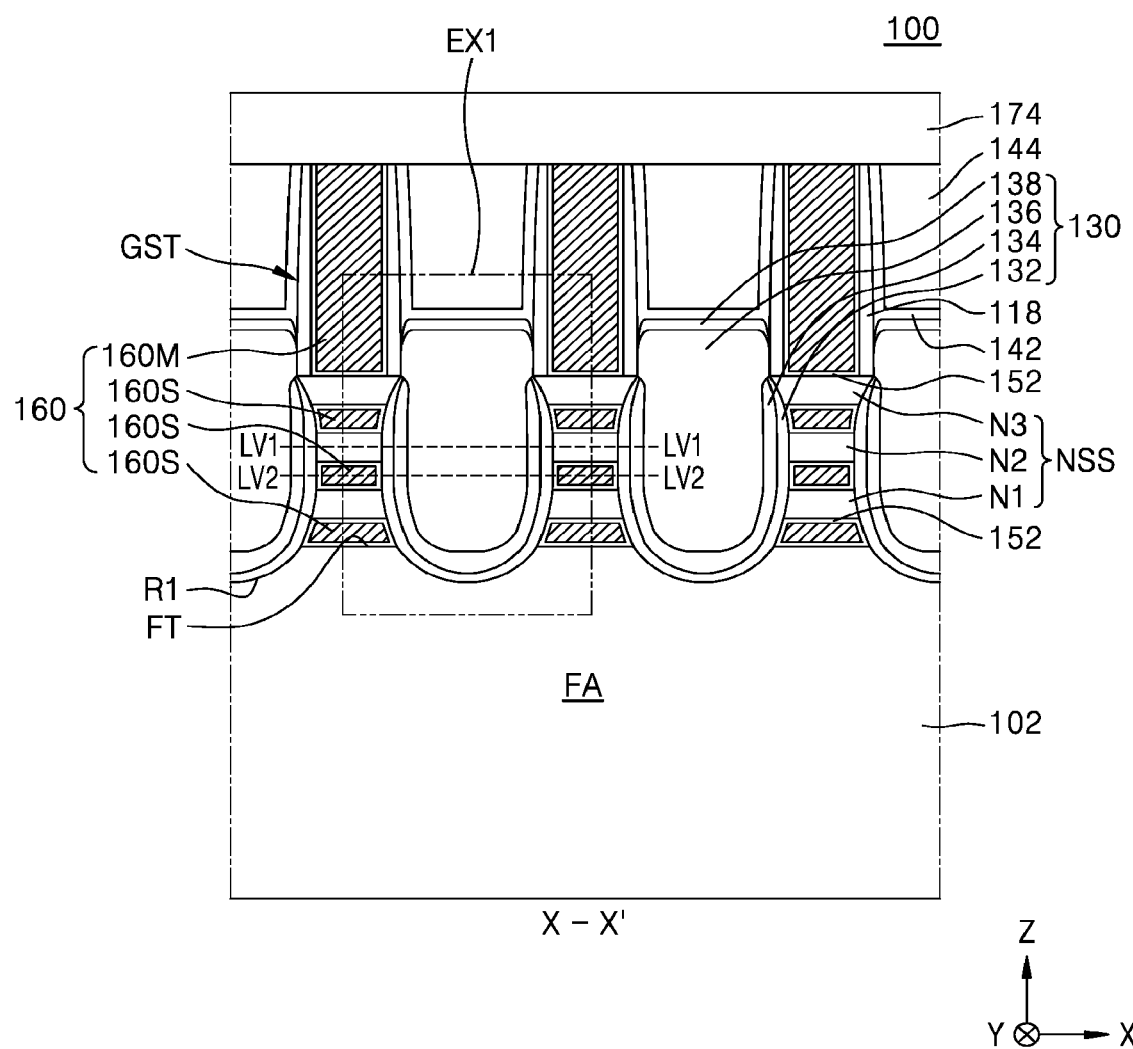
FIG. 2A is a cross-sectional view along line X-X' of FIG. 1.
Figure 2B:
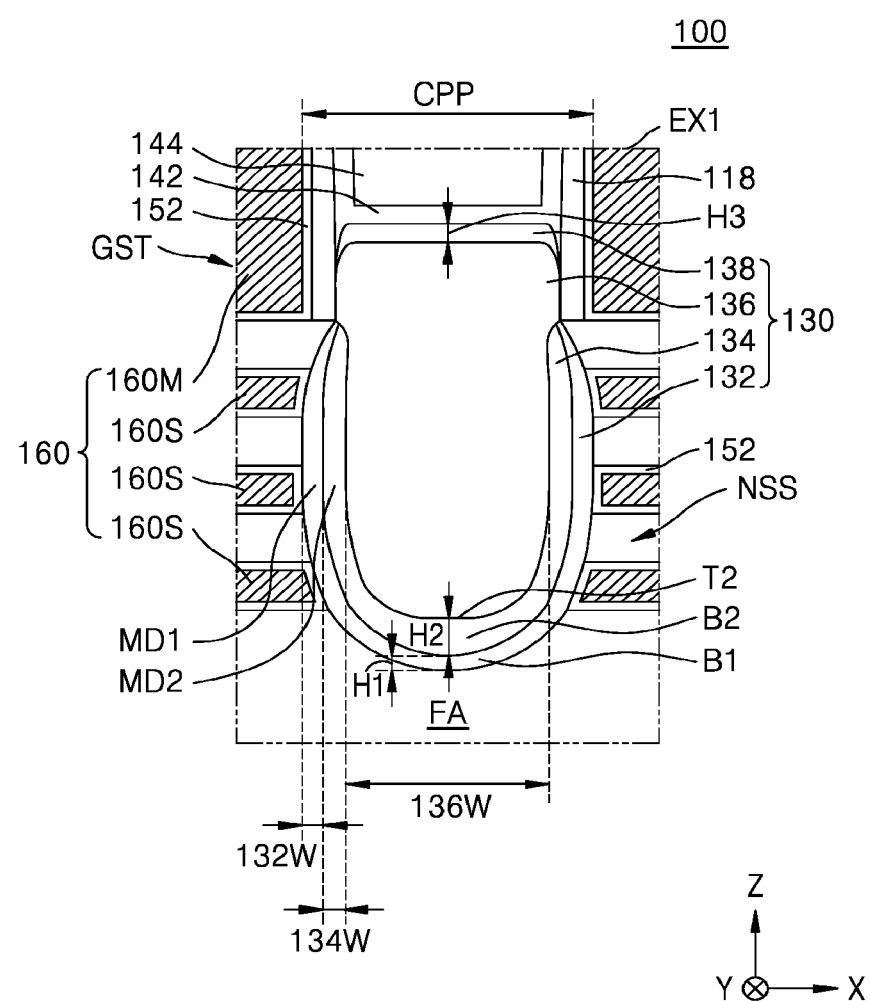
FIG. 2B is an enlarged cross-sectional view of area "EX1" in FIG. 2A.
Figure 2C:
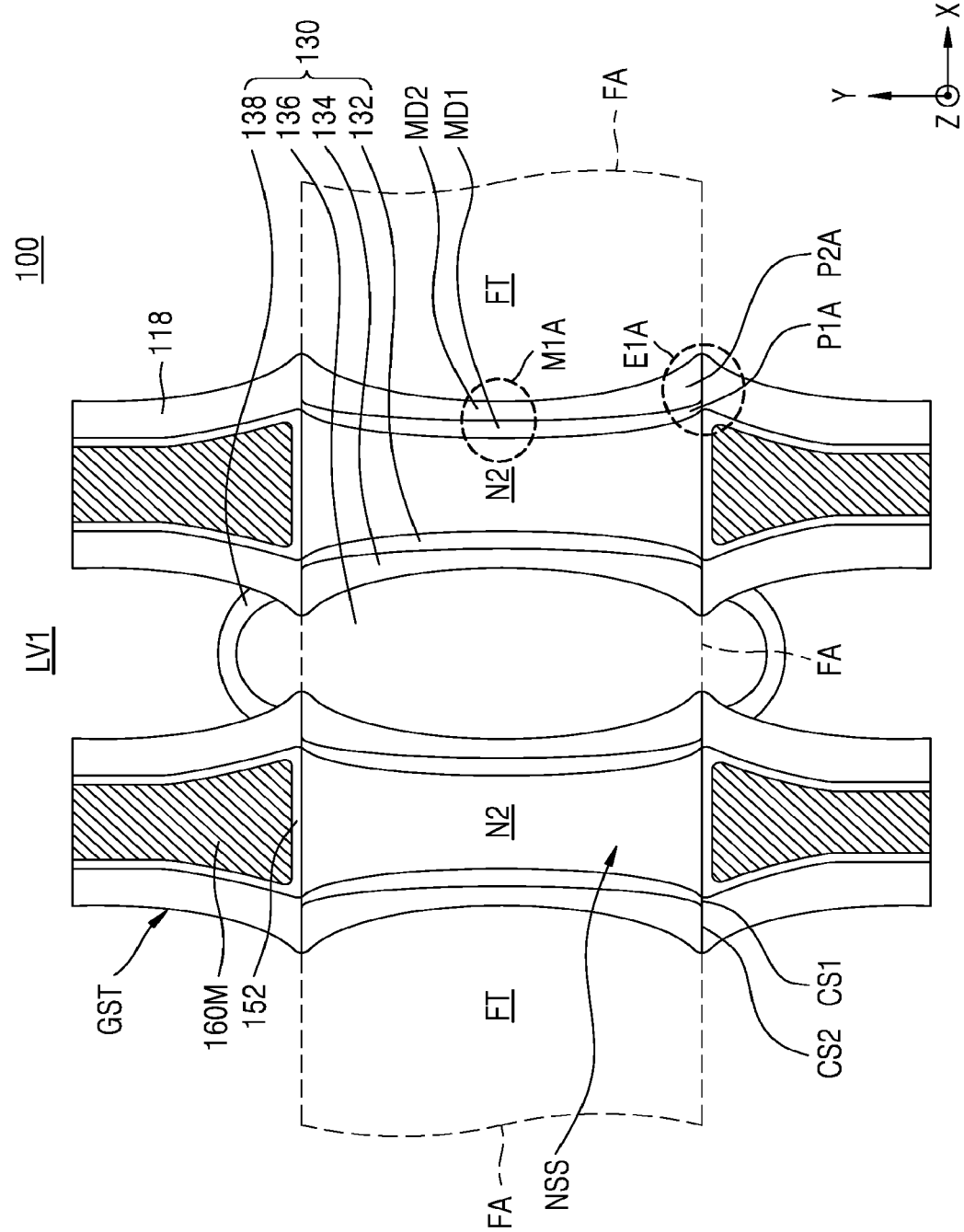
FIG. 2C is an enlarged plan view along a first level LV1-LV1 in FIG. 2A.
Figure 2D:
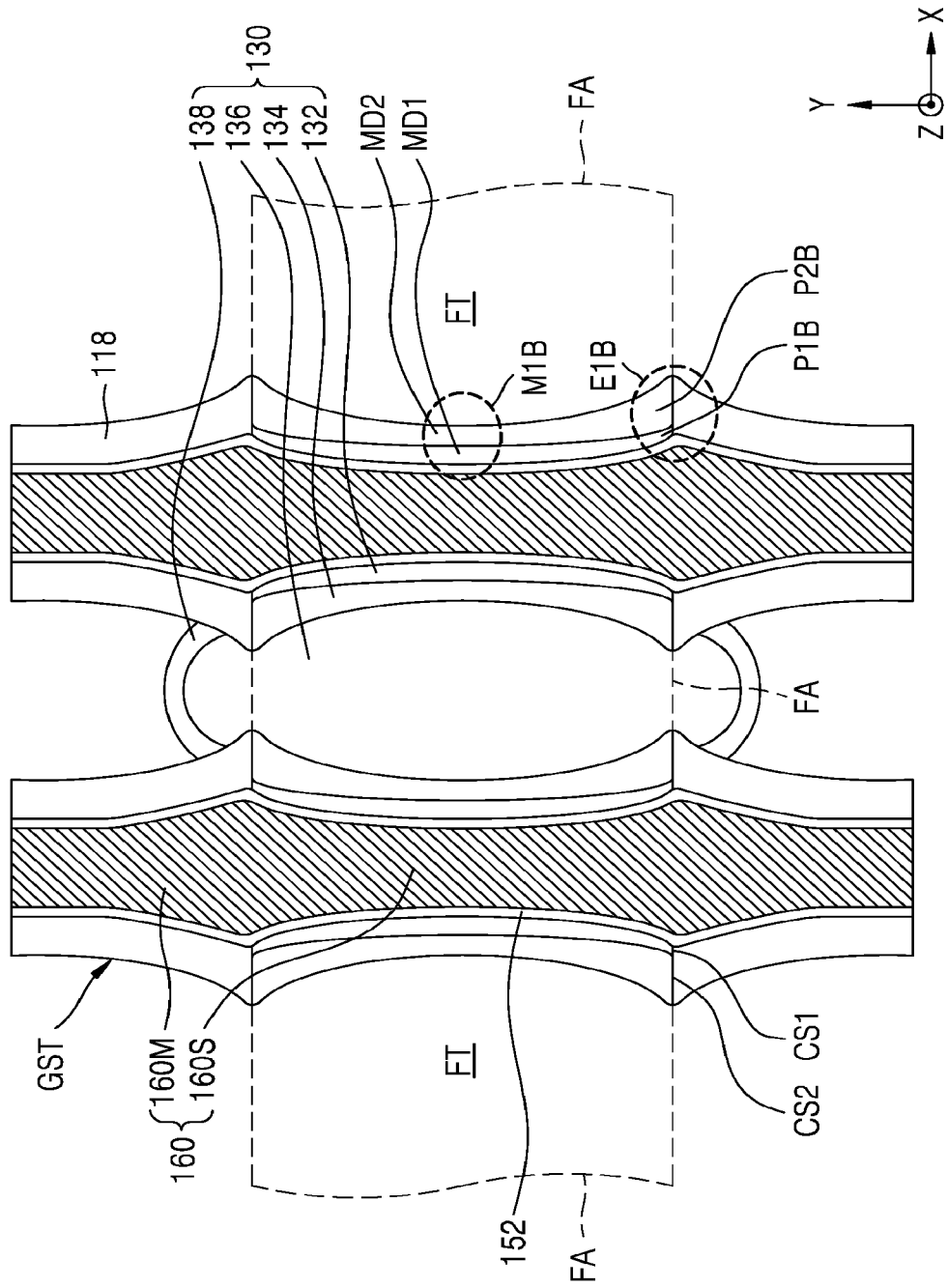
FIG. 2D is an enlarged plan view of a second level LV2-LV2 in FIG. 2A.

FIG. 1 is a plan layout diagram of some components of an integrated circuit device 100 according to embodiments. FIG. 2A is a cross-sectional view along line X-X' of FIG. 1. FIG. 2B is an enlarged cross-sectional view of area "EX1" in FIG. 2A. FIG. 2C is an enlarged plan view at a first level LV1 of FIG. 2A. FIG. 2D is an enlarged plan view at a second level LV2 of FIG. 2A. As used herein, the term "level" refers to a distance in a vertical direction (Z direction or −Z direction) from an upper surface of a substrate 102.

Referring to FIGS. 1 and 2A to 2D, the integrated circuit device 100 may include a plurality of fin-type active areas FA protruding from the substrate 102 in the vertical direction (Z direction) and extending along a first horizontal direction (X direction), and a plurality of nanosheet stacks NSS facing a fin top FT of the plurality of fin-type active areas FA at a position spaced apart from the plurality of fin-type active areas FA. As used herein, the term "nanosheet" refers to a conductive structure having a cross-section substantially perpendicular to a direction in which a current flows. It should be understood that the nanosheet includes a nanowire.

The substrate 102 may include a semiconductor, e.g., silicon (Si) or germanium (Ge), or a compound semiconductor, e.g., silicon germanium (SiGe), silicon carbide (SiC), gallium arsenide (GaAs), indium arsenide (InAs), InGaAs, or indium phosphide (InP). As used herein, the terms "SiGe", "SiC", "GaAs", "InAs", "InGaAs", and "InP" refer to a material composed of elements included in each term, and do not represent a stoichiometric relationship.

A device isolation layer 114 (see FIG. 1) may be on the substrate 102 to cover opposite, e.g., both, sidewalls of each of the plurality of fin-type active areas FA. The device isolation layer 114 may include, e.g., an oxide layer, a nitride layer, or a combination thereof.

A plurality of gate lines 160 may extend in a second horizontal direction (Y direction) crossing the first horizontal direction (X direction) on the plurality of fin-type active areas FA. In areas where the plurality of fin-type active areas FA intersect with the plurality of gate lines 160, the plurality of nanosheet stacks NSS may be arranged on the fin top FT of each of the plurality of fin-type active areas FA. The plurality of nanosheet stacks NSS face the fin top FT at a position spaced apart from the fin-type active areas FA, respectively. Each of the plurality of nanosheet stacks NSS may include a plurality of nanosheets N1, N2, and N3 overlapping each other in the vertical direction (Z direction) on the fin top FT of the fin-type active area FA. The plurality of nanosheets N1, N2, and N3 may have different vertical distances (Z direction distances) from the fin top FT. The plurality of nanosheets N1, N2, and N3 may include the first nanosheet N1, the second nanosheet N2, and the third nanosheet N3 sequentially stacked on the fin top FT of the fin-type active area FA.

FIG. 1 illustrates a case in which a planar shape of a nanosheet stack NSS is rectangular, but is not limited thereto. The nanosheet stack NSS may have various planar shapes according to a planar shape of each of the fin-type active area FA and a gate line 160. The present example describes a configuration in which the plurality of nanosheet stacks NSS and the plurality of gate lines 160 are formed on the single fin-type active area FA, and the plurality of nanosheet stacks NSS are arranged on the single fin-type active area FA in a line in the first horizontal direction (X direction). However, the number of nanosheet stacks NSS and the number of gate lines 160 arranged on the single fin-type active area FA is not limited.

Each of the nanosheets N1, N2, and N3 may include a channel area. For example, each of the nanosheets N1, N2, and N3 may have a thickness of about 4 nm to about 6 nm, but is not limited thereto. The thickness of the plurality of nanosheets N1, N2, and N3 means a size in the vertical direction (Z direction). In example embodiments, the plurality of nanosheets N1, N2, and N3 may have substantially the same thickness in the vertical direction (Z direction). In other example embodiments, at least some of the plurality of nanosheets N1, N2, and N3 may have different thicknesses in the vertical direction (Z direction).

In some embodiments, at least some of the plurality of nanosheets N1, N2, and N3 may have different sizes in the first horizontal direction (X direction). For example, as illustrated in FIG. 2A, among the plurality of nanosheets N1, N2, and N3 in the first horizontal direction (X direction), lengths of the first and second nanosheets N1 and N2 relatively close to the fin top FT may be less than a length of the third nanosheet N3 farthest from the fin top FT. In this case, an effective channel length of a channel formed in the first nanosheet N1 and the second nanosheet N2 relatively close to the fin top FT may be less than an effective channel length of a channel formed in the third nanosheet N3. Accordingly, the amount of current flowing through the first nanosheet N1 and the second nanosheet N2 may be increased under the same operating voltage. In some other embodiments, unlike illustrated in FIG. 2A, at least some of the plurality of nanosheets N1, N2, and N3 may have different sizes in the first horizontal direction (X direction).

A plurality of recesses R1 may be formed on the fin-type active area FA. FIG. 2A illustrates a case in which a level of the lowermost surface of each of the plurality of recesses R1 is less than a level of the fin top FT of the fin-type active area FA, e.g., relative to a bottom of the substrate 102, but embodiments are not limited thereto. The level of the lowermost surface of each of the plurality of recesses R1 may be substantially the same as or similar to the level of the fin top FT of the fin-type active area FA. In example embodiments, a vertical distance between the level of the lowermost surface of each of the plurality of recesses R1 and the level of the fin top FT of the fin-type active area FA may be, e.g., about 0 nm to about 20 nm.

A plurality of source/drain areas 130 may be formed on the plurality of recesses R1. The plurality of source/drain areas 130 may include epitaxially grown semiconductor layers, e.g., the plurality of source/drain areas 130 may include a combination of a group IV element semiconductor and a group IV compound semiconductor.

At least a portion of each of the plurality of source/drain areas 130 may be doped with a p-type dopant. In example embodiments, the p-type dopant may be, e.g., at least one of boron (B) and gallium (Ga).

Each of the plurality of source/drain areas 130 may include an outer blocking layer 132, an inner blocking layer 134, a main body layer 136, and a capping layer 138 that are sequentially stacked on the fin-type active area FA in the vertical direction (Z direction). Each of the outer blocking layer 132 and the main body layer 136 may include a $Si_{1-x}Ge_x$ layer (where x≠0), and the inner blocking layer 134 may include a Si layer. In example embodiments, each of the outer blocking layer 132 and the main body layer 136 may include a $Si_{1-x}Ge_x$ layer (where 0<x<0.7), and Ge content in the main body layer 136 may be greater than Ge content in the outer blocking layer 132. The term "Si layer" as used herein may be a layer composed of only Si elements, or a Si layer including at least one dopant of B, Ga, phosphorus (P), arsenic (As), and antimony (Sb).

The inner blocking layer 134 may not include a Ge element. In example embodiments, the inner blocking layer 134 may include an undoped Si layer. In other example embodiments, the inner blocking layer 134 may include a Si layer doped with a p-type dopant, e.g., at least one of B and Ga. For example, the inner blocking layer 134 may include a Si layer doped with B. The inner blocking layer 134 may be spaced apart from the fin-type active area FA with the outer blocking layer 132 therebetween.

In portions of the plurality of source/drain areas 130 facing a sidewall of the nanosheet stack NSS, at least a portion of the inner blocking layer 134 may have a width greater than that of the outer blocking layer 132 in the first horizontal direction (X direction). In the present specification, a width in a specific direction means a size or thickness in the specific direction, and the width and thickness may be used with the same meaning.

In example embodiments, in each of the outer blocking layer 132 and the inner blocking layer 134, a width of the portion facing a sidewall of the nanosheet stack NSS in the first horizontal direction (X direction) may be less than about ⅕ of a separation distance CPP between the plurality of gate lines 160 in the first horizontal direction (X direction). In other example embodiments, in each of the outer blocking layer 132 and the inner blocking layer 134, the width of the portion facing the sidewall of the nanosheet stack NSS in the first horizontal direction (X direction) may be less than about ⅕ of a maximum width of the source/drain area 130 in the first horizontal direction (X direction). For example, in each of the outer blocking layer 132 and the inner blocking layer 134, the width of the portion facing the sidewall of the nanosheet stack NSS in the first horizontal direction (X direction) may be about 1 nm to about 10 nm.

As illustrated in FIG. 2B, the outer blocking layer 132 may include a first bottom portion B1 in contact with the fin-type active area FA, and the inner blocking layer 134 may include a second bottom portion B2 in contact with the first bottom portion B1 of the outer blocking layer 132. A thickness H2 of the second bottom portion B2 in the vertical direction (Z direction) may be greater than a thickness H1 of the first bottom portion B1. At least a portion of an upper surface T2 of the second bottom portion B2 of the inner blocking layer 134 in contact with the main body layer 136 may extend flatly in a horizontal direction, e.g., in the first horizontal direction (X direction) and/or the second horizontal direction (Y direction).

The thickness H2 of the second bottom portion B2 of the inner blocking layer 134 may be greater than the width of the portion facing the sidewall of the nanosheet stack NSS in the first horizontal direction (X direction). As such, because the second bottom portion B2 of the inner blocking layer 134 has a greater thickness than other portions, it may help block a potential leakage current from the fin-type active area FA at a bottom of the source/drain area 130 facing the fin-type active area FA. In addition, a portion of the inner blocking layer 134 facing the sidewall of the nanosheet stack NSS may have a relatively thin thickness, thereby contributing to increasing the volume of the main body layer 136 in the recess R1. As the volume of the main body layer 136 increases, it may be advantageous in that strain caused by the main body layer 136 is relatively uniformly applied to each of the plurality of nanosheets N1, N2, and N3.

In example embodiments, each of the thickness H1 of the first bottom portion B1 of the outer blocking layer 132 and the thickness H2 of the second bottom portion B2 of the inner blocking layer 134 may be less than about ⅕ of the height of the recess R1 corresponding to a length from a level of a bottom surface of the recess R1 to a level of an upper surface of the nanosheet stack NSS in the vertical direction (Z direction), respectively. For example, each of the thickness H1 of the first bottom portion B1 and the thickness H2 of the second bottom portion B2 may be about 1 nm to about 10 nm.

In each of the plurality of source/drain areas 130, a level of an uppermost surface of the main body layer 136 may be higher than the level of the upper surface of the nanosheet stack NSS. A maximum thickness of the main body layer 136 in the vertical direction (Z direction) may be greater than a value obtained by subtracting the thickness H1 of the first bottom portion B1 and the thickness H2 of the second bottom portion B2 from the height of the recess R1.

In each of the plurality of source/drain areas 130, the capping layer 138 may cover an upper surface of the main body layer 136 at a level higher in the vertical direction (Z direction) than an upper surface level of the nanosheet stack NSS. A bottom surface of the capping layer 138 may contact the upper surface of the main body layer 136. The capping layer 138 may be spaced apart from the inner blocking layer 134 with the main body layer 136 therebetween. The capping layer 138 may be spaced apart from the outer blocking layer 132 with the inner blocking layer 134 and the main body layer 136 therebetween. In the vertical direction (Z direction), a thickness H3 of the capping layer 138 may be greater than 0, e.g., the thickness H3 may be about 0.1 nm to about 10 nm.

The gate line 160 may be long in the second horizontal direction (Y direction) on the fin-type active area FA and the device isolation layer 114. The gate line 160 may surround each of the plurality of nanosheets N1, N2, and N3 while covering the nanosheet stack NSS on the fin-type active area FA.

Each of the plurality of gate lines 160 may include a main-gate portion 160M and a plurality of sub-gate portions 160S. The main-gate portion 160M may cover the upper surface of the nanosheet stack NSS and extend in the second horizontal direction (Y direction). The plurality of sub-gate portions 160S are integrally connected to the main-gate portion 160M and may be arranged one by one between the plurality of nanosheets N1, N2, and N3 and between the fin-type active area FA and the first nanosheet N1.

In the vertical direction (Z direction), a thickness of each of the plurality of sub-gate portions 160S may be less than a thickness of the main-gate portion 160M. The plurality of nanosheets N1, N2, and N3 may be surrounded by the gate line 160.

The gate line 160 may include a metal, metal nitride, metal carbide, or a combination thereof. The metal may be at least one of, e.g., titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be at least one of, e.g., titanium nitride (TiN) or tantalum nitride (TaN). The metal carbide may be, e.g., titanium aluminum carbon (TiAlC).

A gate dielectric layer 152 may be between the nanosheet stack NSS and the gate line 160. In example embodiments, the gate dielectric layer 152 may be formed of a stack structure of an interface layer and a high dielectric layer. The interface layer may include a low dielectric material layer having a dielectric constant of 9 or less, e.g., a silicon oxide layer, a silicon oxynitride layer, or a combination thereof. In example embodiments, the interface layer may be omitted.

The high dielectric layer may include a material having a dielectric constant greater than that of the silicon oxide layer. For example, the high dielectric layer may have a dielectric constant of about 10 to about 25. The high dielectric film may include, e.g., hafnium oxide, but is not limited thereto.

A plurality of nanosheet transistors TR may be formed on the substrate 102 at portions where the plurality of fin-type active areas FA and the plurality of gate lines 160 cross each other, respectively.

In example embodiments, the plurality of nanosheets N1, N2, and N3 may include semiconductor layers made of the same element. In an example, each of the plurality of nanosheets N1, N2, and N3 may include a Si layer. The plurality of nanosheets N1, N2, and N3 may be doped with a dopant having the same conductivity type as that of the source/drain area 130. In an example, the plurality of nanosheets N1, N2, and N3 may include a Si layer doped with a p-type dopant. The p-type dopant may include, e.g., B, Ga, or a combination thereof.

Both sidewalls of each of the plurality of gate lines 160 on the fin-type active area FA and the device isolation layer 114 may be covered with a plurality of outer insulating spacers 118. The plurality of outer insulating spacers 118 may cover both sidewalls of the main-gate portion 160M on an upper surface of the plurality of nanosheet stacks NSS. Each of the plurality of outer insulating spacers 118 may be spaced apart from the gate line 160 with the gate dielectric layer 152 therebetween. The plurality of outer insulating spacers 118 may include, e.g., silicon nitride, silicon oxide, SiCN, SiBN, SiON, SiOCN, SiBCN, SiOC, or a combination thereof. As used herein, the terms "SiCN", "SiBN", "SiON", "SiOCN", "SiBCN", and "SiOC" refer to a material composed of elements included in each term, and do not represent a stoichiometric relationship.

As illustrated in FIGS. 2A and 2B, each of the plurality of source/drain areas 130 may include a portion overlapping the outer insulating spacer 118 in the vertical direction (Z direction). For example, a first horizontal (X direction) width of a portion of the plurality of source/drain areas 130 that overlaps the outer insulating spacer 118 in the vertical direction (Z direction) may be about 0 nm to about 4 nm. In example embodiments, each of the plurality of source/drain areas 130 may not include a portion overlapping the main-gate portion 160M in the vertical direction (Z direction).

Between the plurality of nanosheets N1, N2, and N3, and between the fin-type active area FA and the first nanosheet N1, both sidewalls of each of the plurality of sub-gate portions 160S may be apart from the source/drain area 130 with the gate dielectric layer 152 therebetween. The gate dielectric layer 152 may include a portion in contact with the outer blocking layer 132 of the source/drain area 130.

The gate line 160, the gate dielectric layer 152, and the outer insulating spacer 118 may form a gate structure GST. The gate structure GST may be long in the second horizontal direction (Y direction) on the fin-type active area FA and the device isolation layer 114. Each of the plurality of source/drain areas 130 may be arranged on the fin-type active area FA at a position adjacent to the gate structure GST in the first horizontal direction (X direction).

Each of the plurality of source/drain areas 130 may face the nanosheet stack NSS and the plurality of sub-gate portions 160S in the first horizontal direction (X direction). The inner blocking layer 134 of each of the plurality of source/drain areas 130 may be spaced apart from the nanosheet stack NSS and the plurality of sub-gate portions 160S with the outer blocking layer 132 therebetween. The outer blocking layer 132 of each of the plurality of source/drain areas 130 may be between the inner blocking layer 134 and the gate dielectric layer 152. Portions of the outer blocking layer 132 facing the plurality of sub-gate portions 160S may not contact the gate dielectric layer 152.

FIGS. 2C and 2D illustrate a planar shape of the fin-type active area FA by dashed lines in order to help understand relative positions and shapes of components of the integrated circuit device 100. As illustrated in FIGS. 2C and 2D, in each of the plurality of source/drain areas 130, the outer blocking layer 132 may have a first contact surface CS1 in contact with the gate structure GST at a position adjacent to both ends of the fin top FT of the fin-type active area FA in the second horizontal direction (Y direction) and at an upper portion thereof in the vertical direction (Z direction). The inner blocking layer 134 may have a second contact surface CS2 in contact with the gate structure GST at the position adjacent to both ends of the fin top FT of the fin-type active area FA in the second horizontal direction (Y direction) and at the upper portion thereof in the vertical direction (Z direction). In example embodiments, the area of the second contact surface CS2 may be greater than the area of the first contact surface CS1.

As indicated by a dashed area E1A in FIG. 2C, the outer blocking layer 132 includes a first edge portion P1A covering an end corner closest to the main-gate portion 160M of the nanosheet stack NSS. The inner blocking layer 134 includes a second edge portion P2A covering the end corner of the nanosheet stack NSS. In the first horizontal direction (X direction), a width of the second edge portion P2A may be greater than a width of the first edge portion P1A. The second edge portion P2A may contact the first edge portion P1A.

As indicated by a dashed area E1B in FIG. 2D, the outer blocking layer 132 includes a first edge portion P1B covering a sub-gate portion 160S at a position adjacent to a point where the main-gate portion 160M and the sub-gate portion 160S of the gate line 160 meet. The inner blocking layer 134 includes a second edge portion P2B covering the sub-gate portion 160S at the position adjacent to the point where the main-gate portion 160M and the sub-gate portion 160S of the gate line 160 meet. The first edge portion P1B may cover an end portion of the sub-gate portion 160S closest to the main-gate portion 160M. The second edge portion P2B may cover the first edge portion P1B at a position adjacent to the end portion of the sub-gate portion 160S. The first edge portion P1B is in contact with the gate dielectric layer 152, and the second edge portion P2B may be spaced apart from the gate dielectric layer 152 with the first edge portion P1B therebetween. In the first horizontal direction (X direction), the width of the second edge portion P2B may be greater than the width of the first edge portion P1B.

As indicated by a dashed area M1A in FIG. 2C and a dashed area M1B in FIG. 2D, the outer blocking layer 132 may include a first middle portion MD1 covering the nanosheet stack NSS and the sub-gate portion 160S approximately on the center of the fin top FT of the fin-type active area FA in the second horizontal direction (Y direction). The inner blocking layer 134 may include a second middle portion MD2 covering the nanosheet stack NSS and the sub-gate portion 160S approximately on the center of the fin top FT of the fin-type active area FA in the second horizontal direction (Y direction). The second middle portion MD2 may contact the first middle portion MID.

As illustrated in FIGS. 2B, 2C, and 2D, a width 134W of the second middle portion MD2 in the first horizontal direction (X direction) may be equal to or greater than a width 132W of the first middle portion MD1. For example, the width of the second middle portion MD2 in the first horizontal direction (X direction) may be less than the width of the first middle portion MD1. More specific examples for this will be described later with reference to FIGS. 6, 7A, and 7B. A width 136W of the main body layer 136 in the first horizontal direction (X direction) may be equal to or less than the separation distance CPP between the plurality of gate lines 160 in the first horizontal direction (X direction).

In example embodiments, in each of the plurality of source/drain areas 130, the outer blocking layer 132 may include a first $Si_{1-x}Ge_x$ layer (where 0<x<0.15) doped with a p-type dopant, e.g., doped with B. In each of the plurality of source/drain areas 130, the main body layer 136 may include a second $Si_{1-x}Ge_x$ layer (where 0.15≤x<0.7) doped with a p-type dopant, e.g., doped with B. For example, Ge content in the outer blocking layer 132 may be about 0.02 atomic % to about 0.10 atomic %, and Ge content in the main body layer 136 may be about 0.20 atomic % to about 0.60 atomic %, but are not limited to the described examples.

In example embodiments, the main body layer 136 of each of the plurality of source/drain areas 130 may include at least two portions having different Ge contents. In this case, a portion of the main body layer 136 adjacent to the inner blocking layer 134 may include an outer $Si_{1-x}Ge_x$ layer (where 0.15≤x<0.4) doped with a p-type dopant, and a portion of the main body layer 136 adjacent to the capping layer 138 may include an inner $Si_{1-x}Ge_x$ layer (where 0.4≤x<0.7) doped with a p-type dopant.

The capping layer 138 may not include a Ge element. In example embodiments, the capping layer 138 may include an undoped Si layer. In other example embodiments, the capping layer 138 may include a Si layer doped with a p-type dopant, e.g., B or Ga. For example, the capping layer 138 may include a Si layer doped with B. In example embodiments, each of the inner blocking layer 134 and the capping layer 138 may include an undoped Si layer. In other example embodiments, each of the inner blocking layer 134 and the capping layer 138 may include a Si layer doped with B. In other example embodiments, the capping layer 138 may be omitted.

As illustrated in FIG. 2A, the plurality of outer insulating spacers 118 and the plurality of source/drain areas 130 may be covered with a protective insulating layer 142. The protective insulating layer 142 may include, e.g., silicon nitride, silicon oxide, SiCN, SiBN, SiON, SiOCN, SiBCN, SiOC, or a combination thereof. The protective insulating layer 142 may be omitted.

An inter-gate insulating layer 144 and an interlayer insulating layer 174 may be sequentially formed on the protective insulating layer 142. The inter-gate insulating layer 144 may include, e.g., a silicon nitride layer, a silicon oxide layer, SiON, SiOCN, or a combination thereof. The interlayer insulating layer 174 may include a silicon oxide layer.

In the integrated circuit device 100 illustrated in FIGS. 1 and 2A to 2D, the main body layer 136 of each of the plurality of source/drain areas 130 may apply strain to each of the plurality of nanosheets N1, N2, and N3 of the nanosheet stack NSS. As the Ge content in the main body layer 136 increases, greater strain is applied to the plurality of nanosheets N1, N2, and N3, thereby improving the carrier mobility in the plurality of nanosheets N1, N2, and N3. Each of the outer blocking layer 132, the inner blocking layer 134, and the capping layer 138 may protect the main body layer 136. For example, each of the outer blocking layer 132 and the inner blocking layer 134 may prevent penetration of chemical substances from the outside to the main body layer 136.

Because each of the plurality of source/drain areas 130 includes a double-layered blocking layer including the outer blocking layer 132 and the inner blocking layer 134, chemical substances may be prevented from penetrating into the main body layer 136 from the outside and attacking the main body layer 136. In particular, as the inner blocking layer 134 does not include a Ge element, damage to the inner blocking layer 134 during manufacturing may be minimized, and therefore, protection of the main body layer 136 from chemical substances may be increased.

Figure 18:
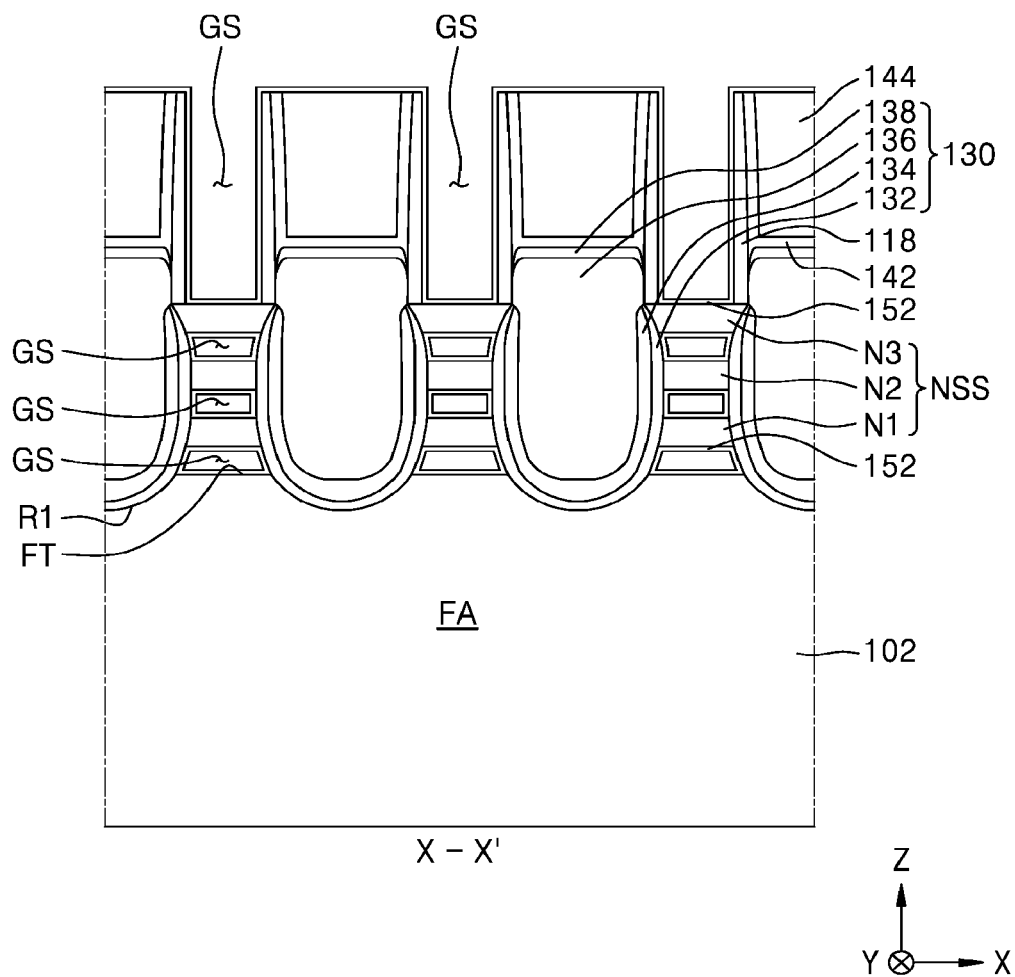

In detail, a semiconductor layer including a Ge element among the plurality of source/drain areas 130 may be damaged when contacting an etchant for removing a SiGe layer, e.g., a plurality of sacrificial semiconductor layers 104 illustrated in FIG. 18, during a manufacturing process of the integrated circuit device 100. However, because the inner blocking layer 134 does not include a Ge element, the inner blocking layer 134 may not be damaged by the etchant for removing the plurality of sacrificial semiconductor layers 104, thereby providing sufficient protection to the main body layer 136 during manufacturing. Accordingly, during the manufacturing process of the integrated circuit device 100, the main body layer 136 may be protected from external attack or damage by the inner blocking layer 134.

In addition, the inner blocking layer 134 may have various shapes and thicknesses by overcoming a thickness limit due to a facet of an epitaxial growth layer. Accordingly, by including a facet in the outer blocking layer 132, even when a portion susceptible to attack from the outside is provided, a weak portion in the outer blocking layer 132 may be selectively reinforced by the inner blocking layer 134. Accordingly, during the manufacturing process of the integrated circuit device 100, it is possible to suppress occurrence of defects, e.g., deterioration of main portions of the source/drain area 130 due to external attack, or occurrence of a short circuit between the source/drain area 130 and a conductive area adjacent thereto, e.g., the gate line 160, and the reliability of the integrated circuit device 100 may be improved.

FIGS. 3A to 3G are graphs showing various examples of an exemplary Ge content change according to a vertical distance (Z direction) from a lowermost surface of the source/drain area 130 in contact with the fin-type active area FA to an uppermost surface of the source/drain area 130, in the integrated circuit device 100 illustrated in FIGS. 1 and 2A to 2D. In FIGS. 3A to 3G, section "A" corresponds to the outer blocking layer 132, section "B" corresponds to the inner blocking layer 134, section "C" corresponds to the main body layer 136, and section "D" corresponds to the capping layer 138.

Figure 3A:
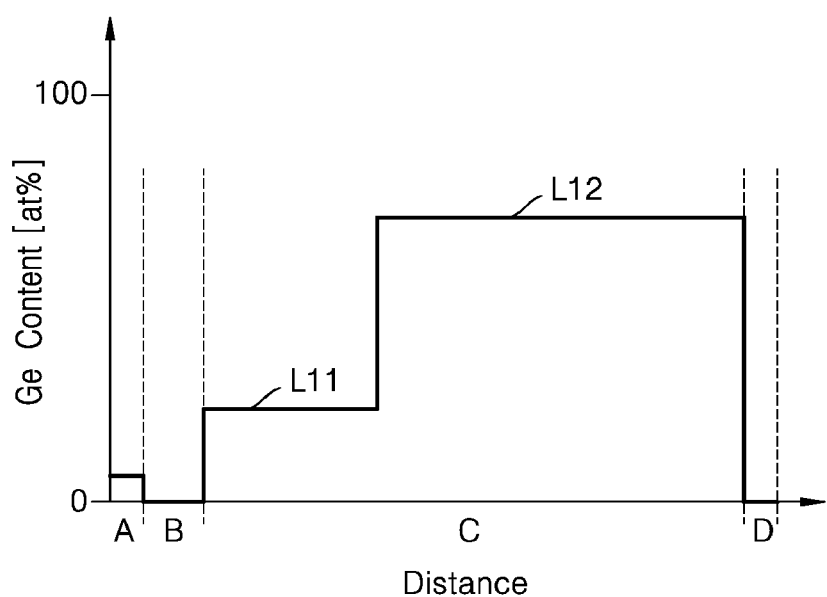
FIGS. 3A to 3G are graphs of an exemplary Ge content change according to a distance from the lowermost surface of a source/drain area, according to embodiments.

Referring to FIG. 3A, in the source/drain area 130, the outer blocking layer 132 includes a first $Si_{1-x}Ge_x$ layer (where 0<x<0.15) doped with a p-type dopant. The Ge content in the outer blocking layer 132 may be greater than 0 atomic % over the total thickness of the outer blocking layer 132 in the vertical direction (Z direction) (see FIG. 2A), and may have a substantially constant value. The Ge content in the inner blocking layer 134 may be about 0 atomic %. The main body layer 136 includes a second $Si_{1-x}Ge_x$ layer (where 0.15≤x<0.7) doped with a p-type dopant. The Ge content in the main body layer 136 may be greater than 0 atomic % over the total thickness of the main body layer 136 in the vertical direction (Z direction) (see FIG. 2A), and may have one abrupt change, e.g., a stepwise profile, in the Ge content as the vertical distance within the main body layer 136 increases from the inner blocking layer 134 as exemplified by straight lines "L11" and "L12". The Ge content in the capping layer 138 may be about 0 atomic %.

Figure 3B:
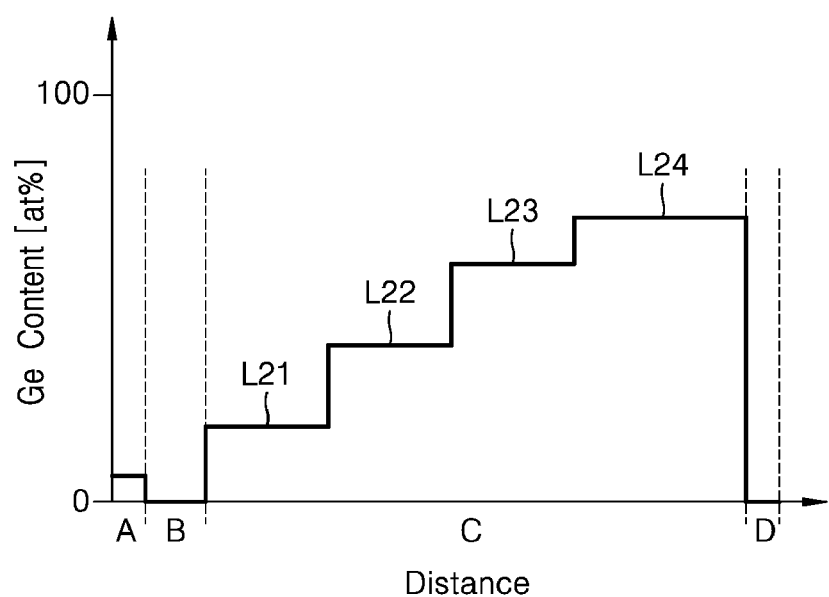

Referring to FIG. 3B, changes in the Ge content of the outer blocking layer 132, the inner blocking layer 134, and the capping layer 138 of the source/drain area 130 may be substantially the same as illustrated in FIG. 3A. The main body layer 136 includes a second $Si_{1-x}Ge_x$ layer (where $0.15<x<0.7$) doped with a p-type dopant, and may have a plurality of abrupt changes, e.g., a stepwise profile, in the Ge content as the vertical distance within the main body layer 136 increases from the inner blocking layer 134 as exemplified by straight lines "L21", "L22", "L23", and "L24".

Figure 3C:
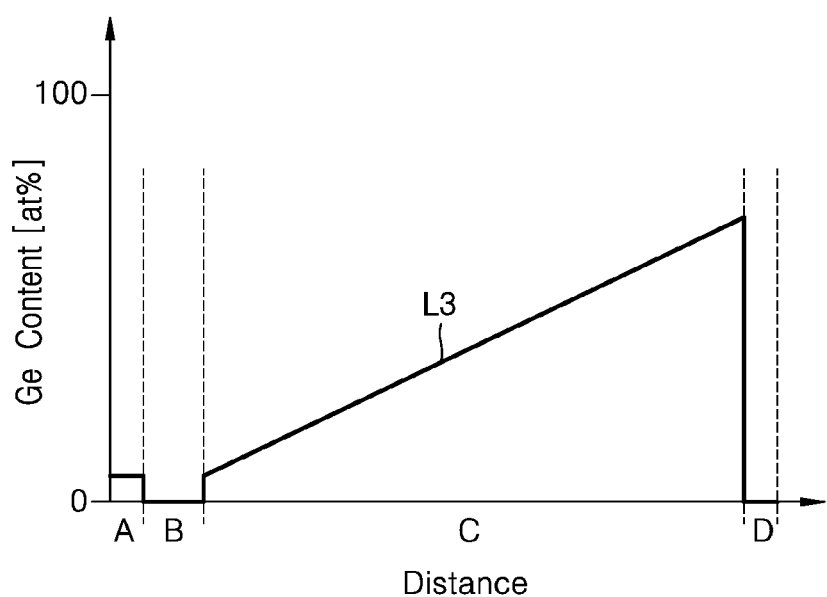

Referring to FIG. 3C, changes in the Ge content of the outer blocking layer 132, the inner blocking layer 134, and the capping layer 138 of the source/drain area 130 may be substantially the same as illustrated in FIG. 3A. The main body layer 136 includes a second $Si_{1-x}Ge_x$ layer (where $0.15 \le x<0.7$) doped with a p-type dopant, and the Ge content may linearly increase as the vertical distance within the main body layer 136 increases from the inner blocking layer 134 as exemplified by a straight line "L3".

Figure 3D:
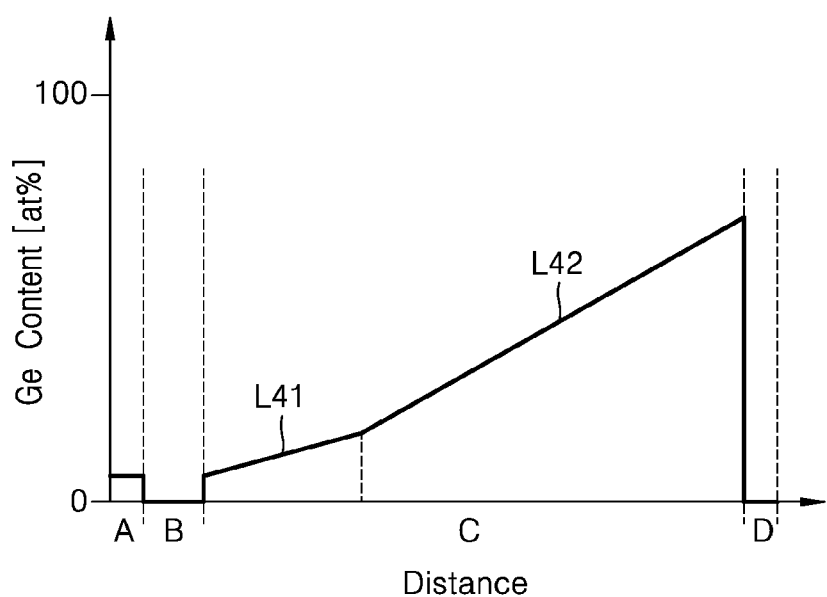

Referring to FIG. 3D, changes in the Ge content of the outer blocking layer 132, the inner blocking layer 134, and the capping layer 138 of the source/drain area 130 may be substantially the same as illustrated in FIG. 3A. The main body layer 136 includes a second $Si_{1-x}Ge_x$ layer (where $0.15 \le x<0.7$) doped with a p-type dopant, and the Ge content may linearly increase as the vertical distance within the main body layer 136 increases from the inner blocking layer 134 as exemplified by straight lines "L41" and "L42". The rate of change in the Ge content according to a vertical distance may vary depending on the distance from the inner blocking layer 134.

Figure 3E:
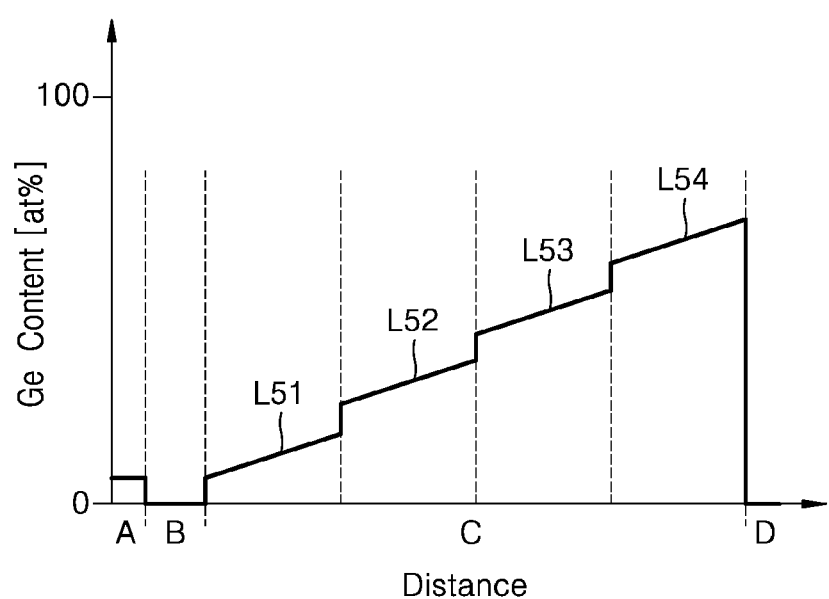

Referring to FIG. 3E, changes in the Ge content of the outer blocking layer 132, the inner blocking layer 134, and the capping layer 138 of the source/drain area 130 may be substantially the same as illustrated in FIG. 3A. The main body layer 136 includes a second $Si_{1-x}Ge_x$ layer (where $0.15 \le x<0.7$) doped with a p-type dopant, and may have a plurality of abrupt changes in the Ge content as the vertical distance within the main body layer 136 increases from the inner blocking layer 134 as exemplified by inclined straight lines "L51", "L52", "L53", and "L54".

Figure 3F:
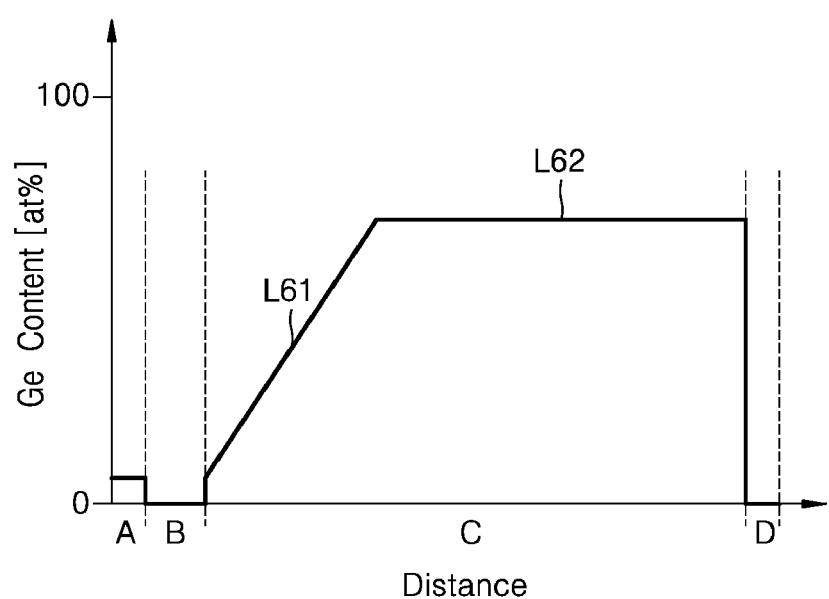

Referring to FIG. 3F, changes in the Ge content of the outer blocking layer 132, the inner blocking layer 134, and the capping layer 138 of the source/drain area 130 may be substantially the same as illustrated in FIG. 3A. The main body layer 136 includes a second $Si_{1-x}Ge_x$ layer (where $0.15 \le x<0.7$) doped with a p-type dopant, and may include a first portion in which the Ge content linearly increases as the distance within the main body layer 136 increases from the inner blocking layer 134 as exemplified by a straight line "L61", and a second portion in which the Ge content is constant as the vertical distance within the main body layer 136 increases from the inner blocking layer 134 as exemplified by a straight line "L62".

Figure 3G:
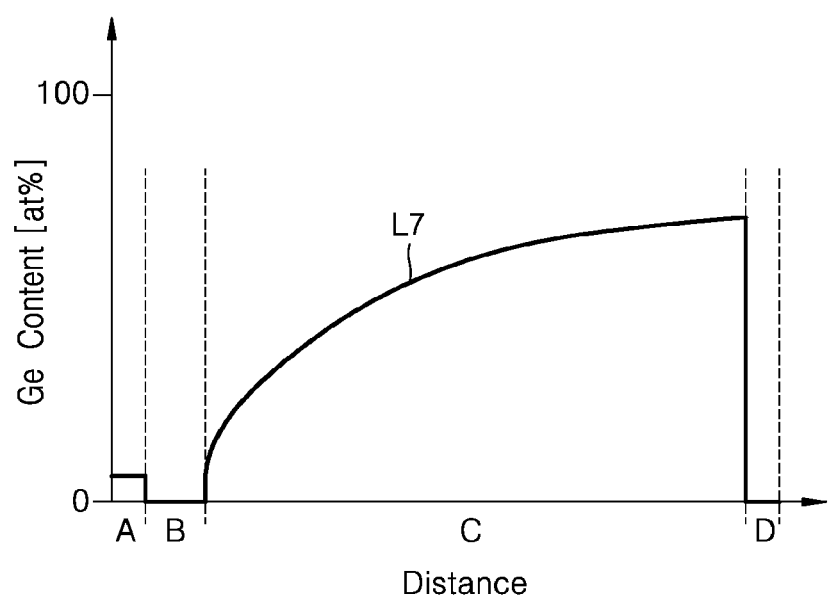

Referring to FIG. 3G, changes in the Ge content of the outer blocking layer 132, the inner blocking layer 134, and the capping layer 138 of the source/drain area 130 may be substantially the same as illustrated in FIG. 3A. The main body layer 136 includes a second $Si_{1-x}Ge_x$ layer (where $0.15 \le x<0.7$) doped with a p-type dopant, and the Ge content may nonlinearly increase as the vertical distance within the main body layer 136 increases from the inner blocking layer 134 as exemplified by a straight line "L7". For example, the Ge content in the main body layer 136 may increase in the form of a log function as the vertical distance within the main body layer 136 increases from the inner blocking layer 134.

Figure 4A:
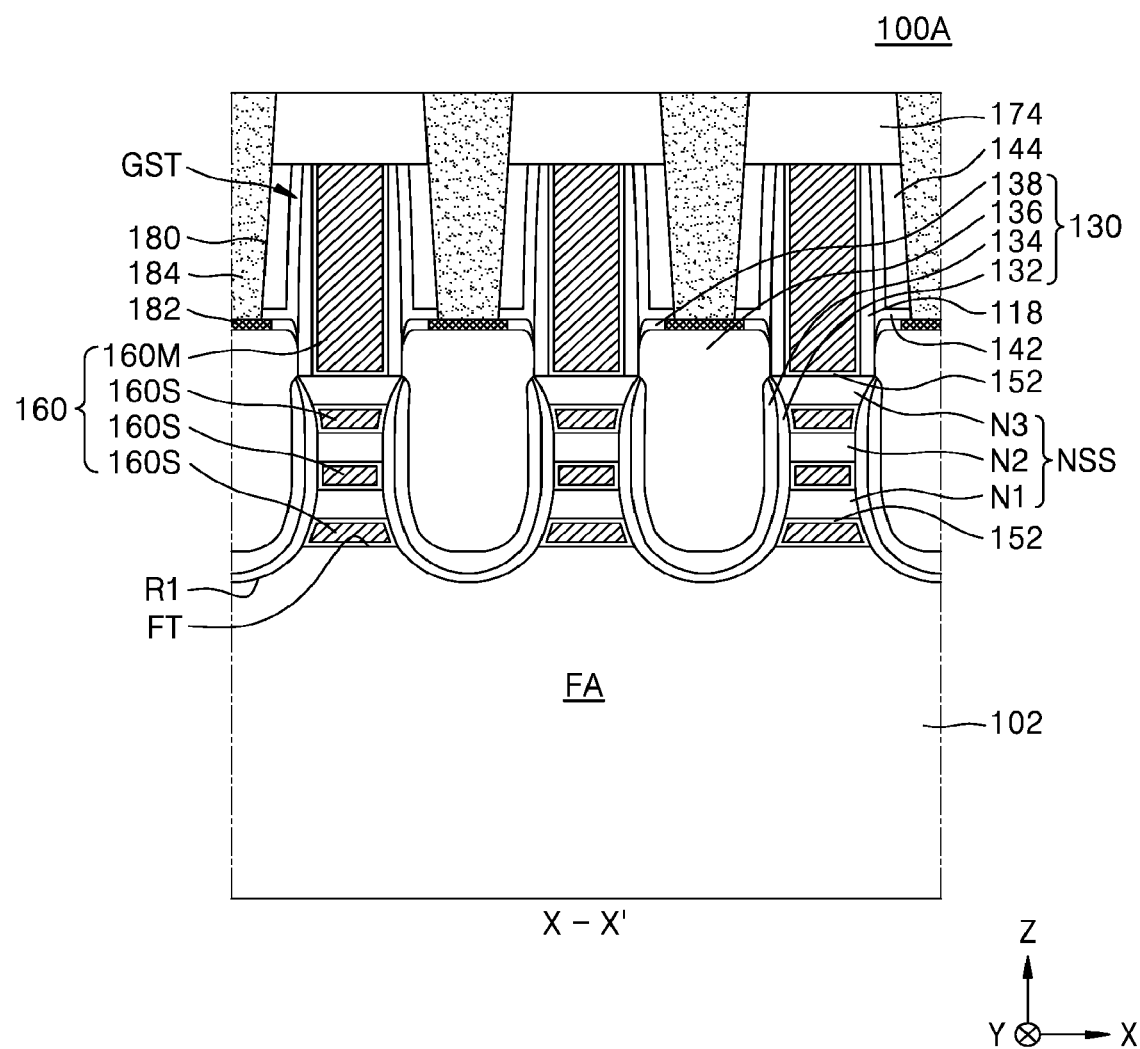
FIG. 4A is a cross-sectional view of an integrated circuit device according to other embodiments.

FIG. 4A is a cross-sectional view of an integrated circuit device according to other embodiments. FIG. 4A illustrates a partial configuration of a portion corresponding to the cross-section of line X-X' in FIG. 1.

Referring to FIG. 4A, an integrated circuit device 100A may have substantially the same configuration as that of the integrated circuit device 100 described with reference to FIGS. 1 and 2A to 2D. However, the integrated circuit device 100A may further include a metal silicide layer 182 formed on an upper surface of each of the plurality of source/drain areas 130 and a plurality of contact plugs 184. Each of the plurality of contact plugs 184 may be formed in a contact hole 180 penetrating the interlayer insulating layer 174, the inter-gate insulating layer 144, and the protective insulating layer 142. The plurality of contact plugs 184 may be connected to the main body layer 136 of the plurality of source/drain areas 130 through the plurality of metal silicide layers 182.

The metal silicide layer 182 may be formed by a silicide reaction between a portion of the capping layer 138 of the source/drain area 130 and a metal. For example, the metal silicide layer 182 may include titanium silicide, but is not limited thereto. In some example embodiments, the metal silicide layer 182 may be omitted.

Each of the plurality of contact plugs 184 may include a metal, conductive metal nitride, or a combination thereof. For example, each of the plurality of contact plugs 184 may include W, copper (Cu), Al, Ti, tantalum (Ta), TiN, TaN, an alloy thereof, or a combination thereof.

Figure 4B:
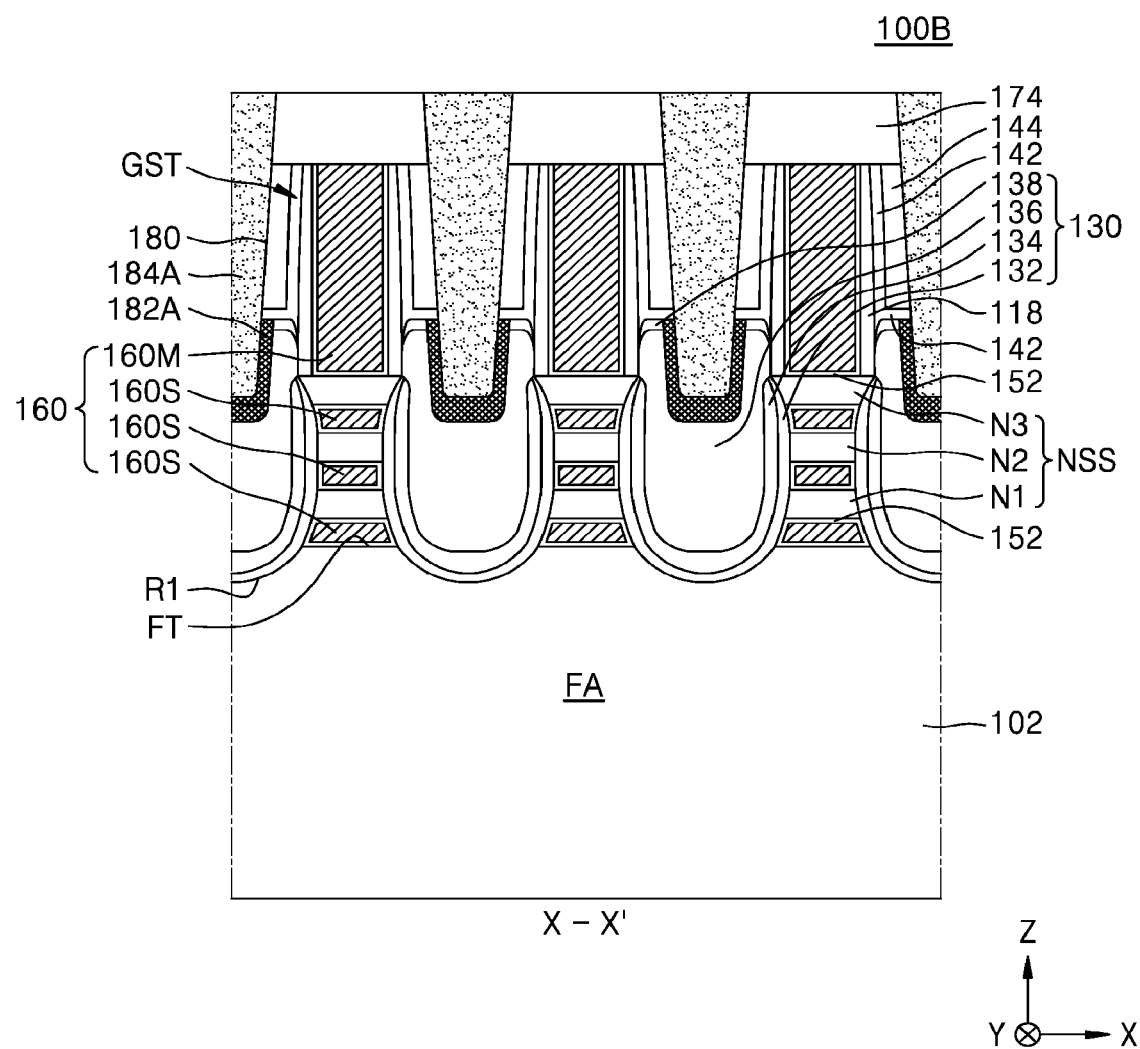
FIG. 4B is a cross-sectional view of an integrated circuit device according to other embodiments.

FIG. 4B is a cross-sectional view of an integrated circuit device according to other embodiments. FIG. 4B illustrates a partial configuration of a portion corresponding to the cross-section of line X-X' in FIG. 1.

Referring to FIG. 4B, an integrated circuit device 100B may have substantially the same configuration as that of the integrated circuit device 100A described with reference to FIG. 4A. However, the integrated circuit device 100B includes a plurality of metal silicide layers 182A and a plurality of contact plugs 184A instead of the plurality of metal silicide layers 182 and the plurality of contact plugs 184.

The plurality of metal silicide layers 182A and the plurality of contact plugs 184A have substantially the same configuration as described for the plurality of metal silicide layers 182 and the plurality of contact plugs 184 with reference to FIG. 4A. However, the lowermost surface level of the plurality of contact plugs 184A may be lower than the uppermost level of the main body layer 136 included in the source/drain area 130. A lower portion of each of the plurality of contact plugs 184A may be surrounded by a metal silicide layer 182A. The metal silicide layer 182A may be formed by a silicide reaction between a portion of each of the capping layer 138 and the main body layer 136 of the source/drain area 130 and a metal. In some embodiments, the metal silicide layer 182A may be omitted.

Figure 5A:
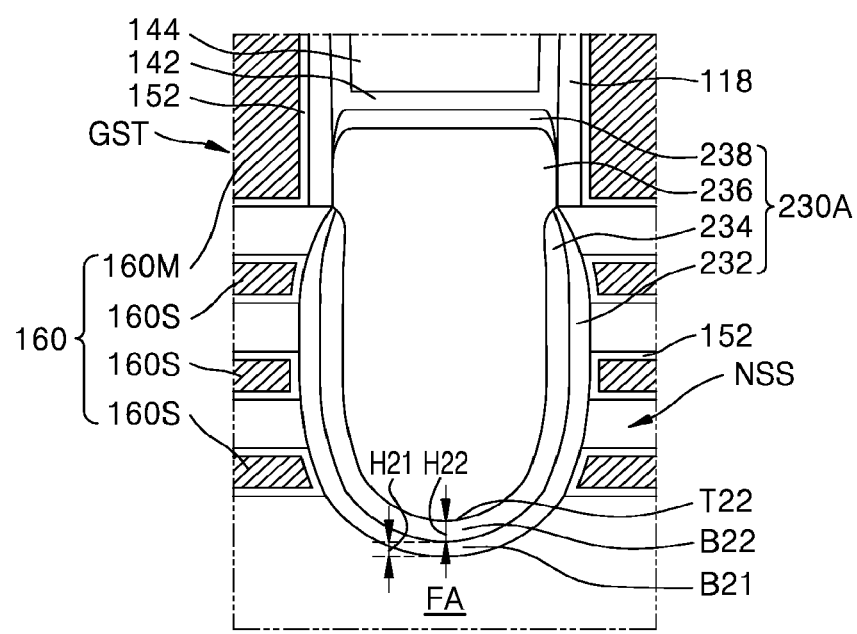
FIG. 5A is a cross-sectional view of an integrated circuit device according to other embodiments.

FIG. 5A is a cross-sectional view of an integrated circuit device according to other embodiments. FIG. 5A illustrates an enlarged cross-sectional configuration of some components of a portion corresponding to area "EX1" of FIG. 2A.

Referring to FIG. 5A, an integrated circuit device 200A may have substantially the same configuration as that of the integrated circuit device 100 described with reference to FIGS. 1 and 2A to 2D. However, the integrated circuit device 200A includes a source/drain area 230A instead of the source/drain area 130 of the integrated circuit device 100.

The source/drain area 230A of the integrated circuit device 200A may include an outer blocking layer 232, an inner blocking layer 234, a main body layer 236, and a capping layer 238 that are sequentially stacked on the fin-type active area FA in the vertical direction (Z direction) and sequentially cover a sidewall of the nanosheet stack NSS. The outer blocking layer 232, the inner blocking layer 234, the main body layer 236, and the capping layer 238 may have substantially the same configuration as those of the outer blocking layer 132, the inner blocking layer 134, the main body layer 136, and the capping layer 138 that are described with reference to FIGS. 1 and 2A to 2D. However, in the source/drain area 230A, the outer blocking layer 232 may include a first bottom portion B21 in contact with the fin-type active area FA, and the inner blocking layer 234 may include a second bottom portion B22 in contact with the first bottom portion B21 of the outer blocking layer 232. A thickness H22 of the second bottom portion B22 in the vertical direction (Z direction) may be substantially the same as or similar to a thickness H21 of the first bottom portion B21. An upper surface T22 of the second bottom portion B22 of the inner blocking layer 234 in contact with the main body layer 236 may extend nonlinearly in a horizontal direction, e.g., in the first horizontal direction (X direction) and/or the second horizontal direction (Y direction). The thickness H22 of the second bottom portion B2 of the inner blocking layer 234 may be the same as or different from a width of a portion facing the nanosheet stack NSS in the first horizontal direction (X direction).

Figure 5B:
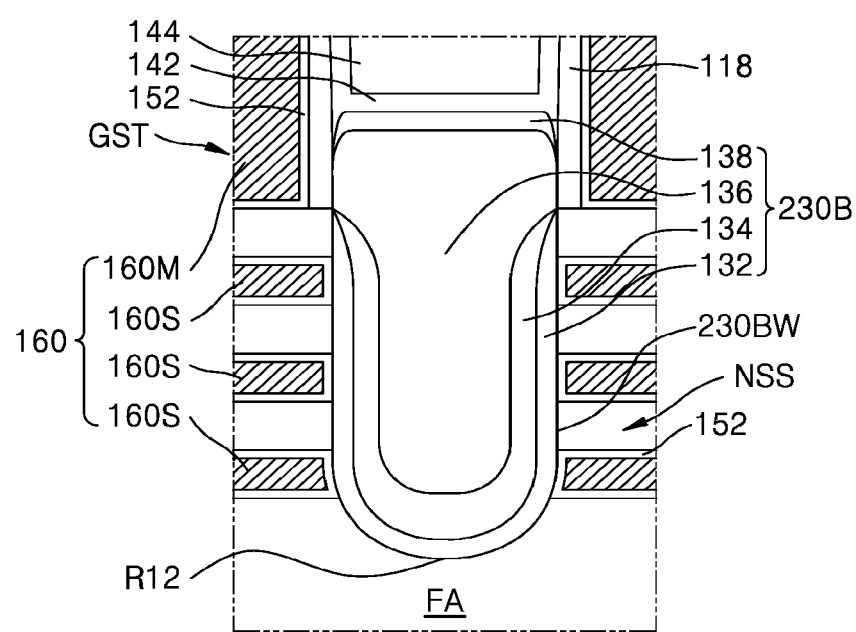
FIG. 5B is a cross-sectional view of an integrated circuit device according to other embodiments.

FIG. 5B is a cross-sectional view of an integrated circuit device according to other embodiments. FIG. 5B illustrates an enlarged cross-sectional configuration of some components of a portion corresponding to area "EX1" of FIG. 2A.

Referring to FIG. 5B, an integrated circuit device 200B may have substantially the same configuration as that of the integrated circuit device 100 described with reference to FIGS. 1 and 2A to 2D. However, the integrated circuit device 200B includes a source/drain area 230B instead of the source/drain area 130 of the integrated circuit device 100.

The source/drain area 230B may be formed on a recess R12. The recess R12 may not include a portion overlapping the main-gate portion 160M of the gate line 160 and the outer insulating spacer 118 in the vertical direction (Z direction). A portion of the source/drain area 230B filling the recess R12 may not overlap the main-gate portion 160M of the gate line 160 and the outer insulating spacer 118 in the vertical direction (Z direction). In example embodiments, at least a portion of a sidewall 230BW of the source/drain area 230B facing the nanosheet stack NSS may be on an extension line of a sidewall of the outer insulating spacer 118 facing the source/drain area 230B in the vertical direction (Z direction). In example embodiments, a maximum width of the recess R12 in the first horizontal direction (X direction) is equal to or less than a minimum separation distance between a pair of outer insulating spacers 118 apart from each other with the source/drain area 230B therebetween.

Figure 6A:
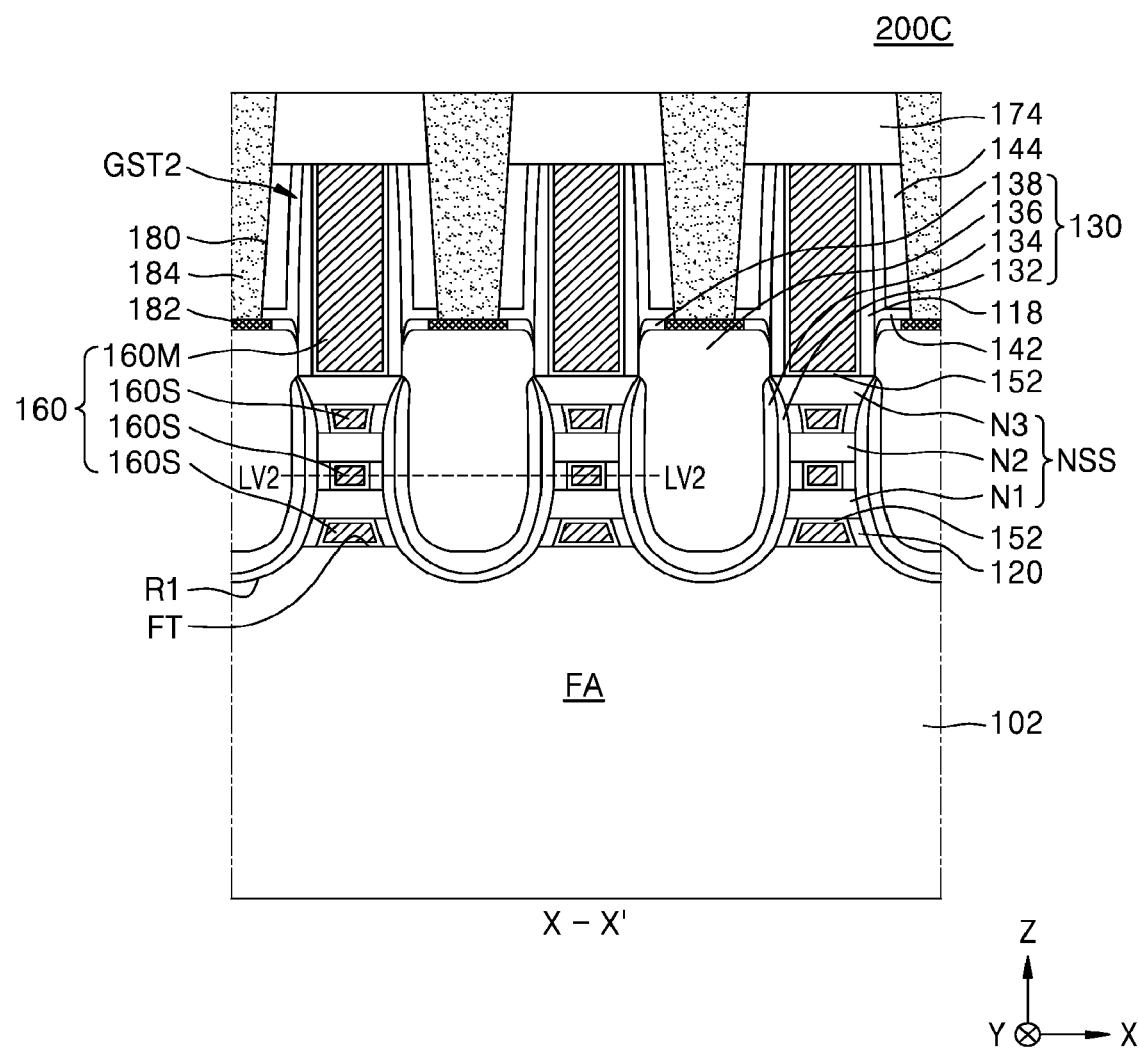
FIG. 6A is a cross-sectional view of an integrated circuit device according to other embodiments.

FIG. 6A is a cross-sectional view of an integrated circuit device according to other embodiments. FIG. 6A illustrates a partial configuration of a portion corresponding to the cross-section of line X-X' in FIG. 1.

Referring to FIG. 6A, an integrated circuit device 200C may have substantially the same configuration as that of the integrated circuit device 100 described with reference to FIGS. 1 and 2A to 2D. However, the integrated circuit device 200C further includes a plurality of inner insulating spacers 120 between the plurality of sub-gate portions 160S and the source/drain area 130, between each of the plurality of nanosheets N1, N2 and N3, and between the fin-type active area FA and the first nanosheet N1.

Both sidewalls of each of the plurality of sub-gate portions 160S may be covered with an inner insulating spacer 120 with the gate dielectric layer 152 therebetween. Each of the plurality of sub-gate portions 160S may be apart from the source/drain area 130 with the gate dielectric layer 152 and the inner insulating spacer 120 therebetween. Each of the plurality of inner insulating spacers 120 may contact the outer blocking layer 132 of the source/drain area 130. At least some of the plurality of inner insulating spacers 120 may overlap the outer insulating spacers 118 in the vertical direction (Z direction).

The inner insulating spacers 120 may include, e.g., silicon nitride, silicon oxide, SiCN, SiBN, SiON, SiOCN, SiBCN, SiOC, or a combination thereof. The inner insulating spacer 120 may further include an air gap. In example embodiments, the inner insulating spacer 120 may include the same material as that of the outer insulating spacer 118. In other example embodiments, the outer insulating spacer 118 and the inner insulating spacer 120 may include different materials.

The gate line 160, the gate dielectric layer 152, the outer insulating spacer 118, and the inner insulating spacer 120 may constitute a gate structure GST2. The gate structure GST2 may be long in the second horizontal direction (Y direction) on the fin-type active area FA and the device isolation layer 114 (see FIG. 1). Each of the plurality of source/drain areas 130 may be arranged on the fin-type active area FA at a position adjacent to the gate structure GST2 in the first horizontal direction (X direction).

The plurality of source/drain areas 130 may respectively face the plurality of sub-gate portions 160S with the inner insulating spacer 120 therebetween in the first horizontal direction (X direction). The plurality of source/drain areas 130 may not include portions in contact with the gate dielectric layer 152.

The inner blocking layer 134 of each of the plurality of source/drain areas 130 may be apart from the inner insulating spacer 120 with the outer blocking layer 132 therebetween. The outer blocking layer 132 of each of the plurality of source/drain areas 130 may be between the inner blocking layer 134 and the inner insulating spacer 120.

Figure 6B:
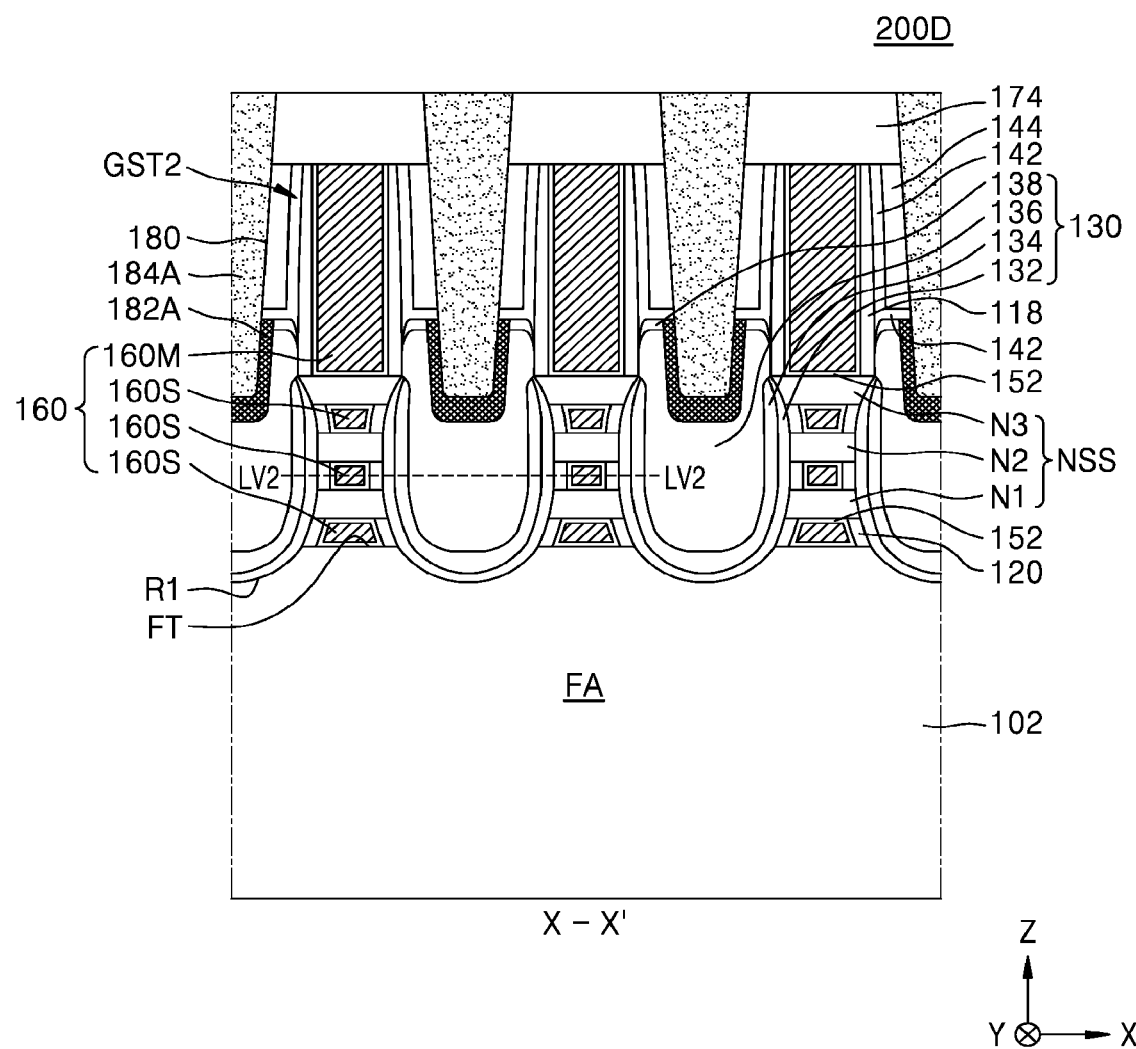
FIG. 6B is a cross-sectional view of an integrated circuit device according to other embodiments.

FIG. 6B is a cross-sectional view of an integrated circuit device according to other embodiments. FIG. 6B illustrates a partial configuration of a portion corresponding to the cross-section of line X-X' in FIG. 1.

Referring to FIG. 6B, an integrated circuit device 200D may have substantially the same configuration as that of the integrated circuit device 200C described with reference to FIG. 6A. However, the integrated circuit device 200D includes the plurality of metal silicide layers 182A and the plurality of contact plugs 184A instead of the plurality of metal silicide layers 182 and the plurality of contact plugs 184. A more detailed configuration of the plurality of metal silicide layers 182A and the plurality of contact plugs 184A is substantially the same as described with reference to FIG. 4B.

Figure 6C:
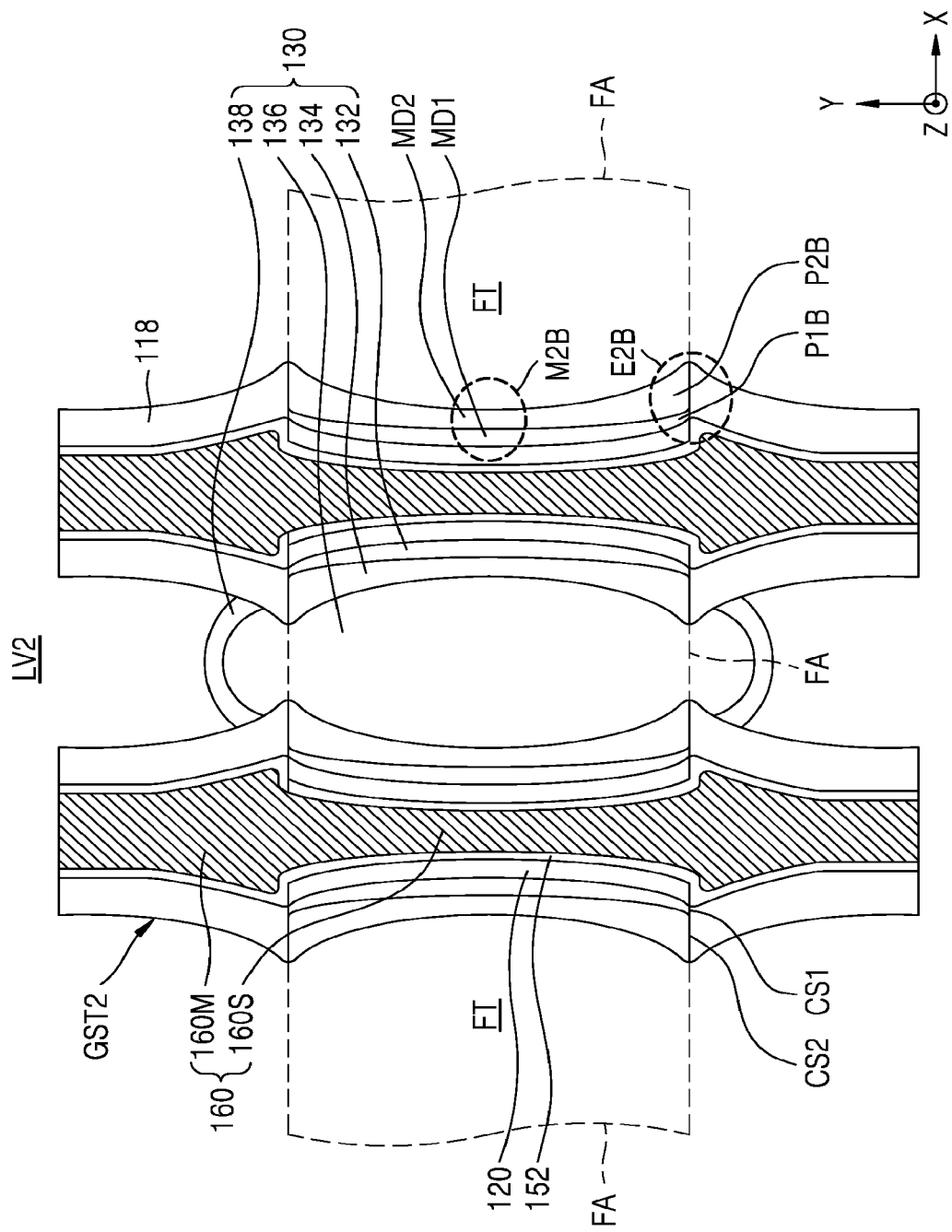
FIG. 6C is an enlarged plan view of each of FIGS. 6A and 6B.

FIG. 6C is an enlarged plan view of some components at the second level LV2 of each of FIGS. 6A and 6B. FIG. 6C illustrates a planar shape of the fin-type active area FA by dashed lines.

Referring to FIG. 6C, both sidewalls of the sub-gate portion 160S may be covered with the inner insulating spacer 120 with the gate dielectric layer 152 therebetween. The sub-gate portion 160S may be spaced apart from the source/drain area 130 with the gate dielectric layer 152 and the inner insulating spacer 120 therebetween. The inner insulating spacer 120 may contact the outer blocking layer 132 of the source/drain area 130.

The gate structure GST2 including the gate line 160, the gate dielectric layer 152, the outer insulating spacer 118, and the inner insulating spacer 120 may be long in the second horizontal direction (Y direction) on the fin-type active area FA. The outer blocking layer 132 of each of the plurality of source/drain areas 130 may be between the inner blocking layer 134 and the inner insulating spacer 120.

As indicated by a dashed area E2B in FIG. 6C, the outer blocking layer 132 includes the first edge portion P1B covering the inner insulating spacer 120 at a position adjacent to a point where the main-gate portion 160M and the sub-gate portion 160S of the gate line 160 meet. The inner blocking layer 134 includes the second edge portion P2B covering the inner insulating spacer 120 at the position adjacent to the point where the main-gate portion 160M and the sub-gate portion 160S of the gate line 160 meet. The first edge portion P1B may cover an end portion of the inner insulating spacer 120 closest to the main-gate portion 160M. The second edge portion P2B may cover the first edge portion P1B at a position adjacent to the end portion of the inner insulating spacer 120. The second edge portion P2B may be spaced apart from the inner insulating spacer 120 with the first edge portion P1B therebetween. In the first horizontal direction (X direction), the width of the second edge portion P2B may be greater than the width of the first edge portion P1B.

As indicated by a dashed area M2B in FIG. 6C, the outer blocking layer 132 may include the first middle portion MID covering the inner insulating spacer 120 approximately on the center of the fin top FT of the fin-type active area FA in the second horizontal direction (Y direction). The inner blocking layer 134 may include the second middle portion MD2 covering the inner insulating spacer 120 approximately on the center of the fin top FT of the fin-type active area FA in the second horizontal direction (Y direction). The second middle portion MD2 may contact the first middle portion MD1. The width of the second middle portion MD2 in the first horizontal direction (X direction) may be equal to or greater than the width of the first middle portion MD1. For example, the width of the second middle portion MD2 in the first horizontal direction (X direction) may be less than the width of the first middle portion MD1.

Figure 7:
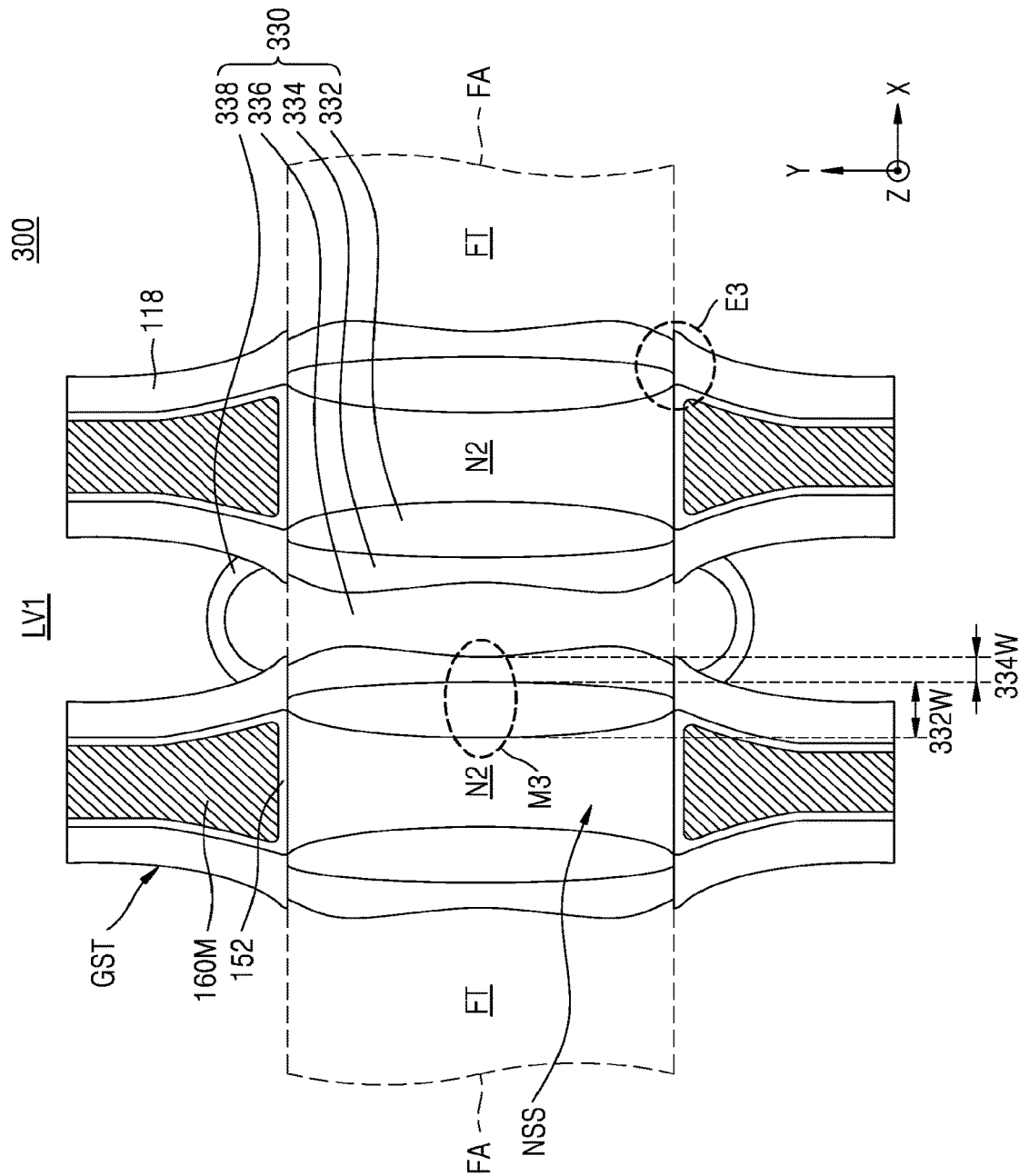
FIG. 7 is a plan view of an integrated circuit device according to other embodiments.

FIG. 7 is a plan view of an integrated circuit device according to other embodiments. FIG. 7 illustrates an enlarged planar configuration of some components of a portion corresponding to the first level LV1 of FIG. 2A, similar to that of FIG. 2C. FIG. 7 illustrates a planar shape of the fin-type active area FA by dashed lines.

Referring to FIG. 7, an integrated circuit device 300 may have substantially the same configuration as that of the integrated circuit device 100 described with reference to FIGS. 1 and 2A to 2D. However, the integrated circuit device 300 includes a source/drain area 330 instead of the source/drain area 130 of the integrated circuit device 100.

The source/drain areas 330 of the integrated circuit device 300 may include an outer blocking layer 332, an inner blocking layer 334, a main body layer 336, and a capping layer 338 that are sequentially stacked on the fin-type active area FA in the vertical direction (Z direction) and sequentially cover a sidewall of the nanosheet stack NSS. The outer blocking layer 332, the inner blocking layer 334, the main body layer 336, and the capping layer 338 may have substantially the same configuration as those of the outer blocking layer 132, the inner blocking layer 134, the main body layer 136, and the capping layer 138 that are described with reference to FIGS. 1 and 2A to 2D. A contact area between the inner blocking layer 334 and the gate structure GST may be greater than a contact area between the outer blocking layer 332 and the gate structure GST at the position adjacent to the both ends of the fin top FT of the fin-type active area FA in the second horizontal direction (Y direction) and at the upper portion thereof in the vertical direction (Z direction).

In the integrated circuit device 300, as indicated by a dashed area E3, a width of an edge portion of the inner blocking layer 334 may be greater than a width of an edge portion of the outer blocking layer 332 in the first horizontal direction (X direction). As indicated by a dashed area M3, a width 334W of a middle portion of the inner blocking layer 334 may be less than a width 332W of a middle portion of the outer blocking layer 332.

FIGS. 8A to 8E are plan views of source/drain areas of various configurations that can be employed in an integrated circuit device according to other embodiments. FIGS. 8A to 8E illustrate an enlarged planar configuration of some components of a portion corresponding to the first level LV1 of FIG. 2A, similar to that of FIG. 2C. FIGS. 8A to 8E illustrate a planar shape of the fin-type active area FA by dashed lines.

Figure 8A:
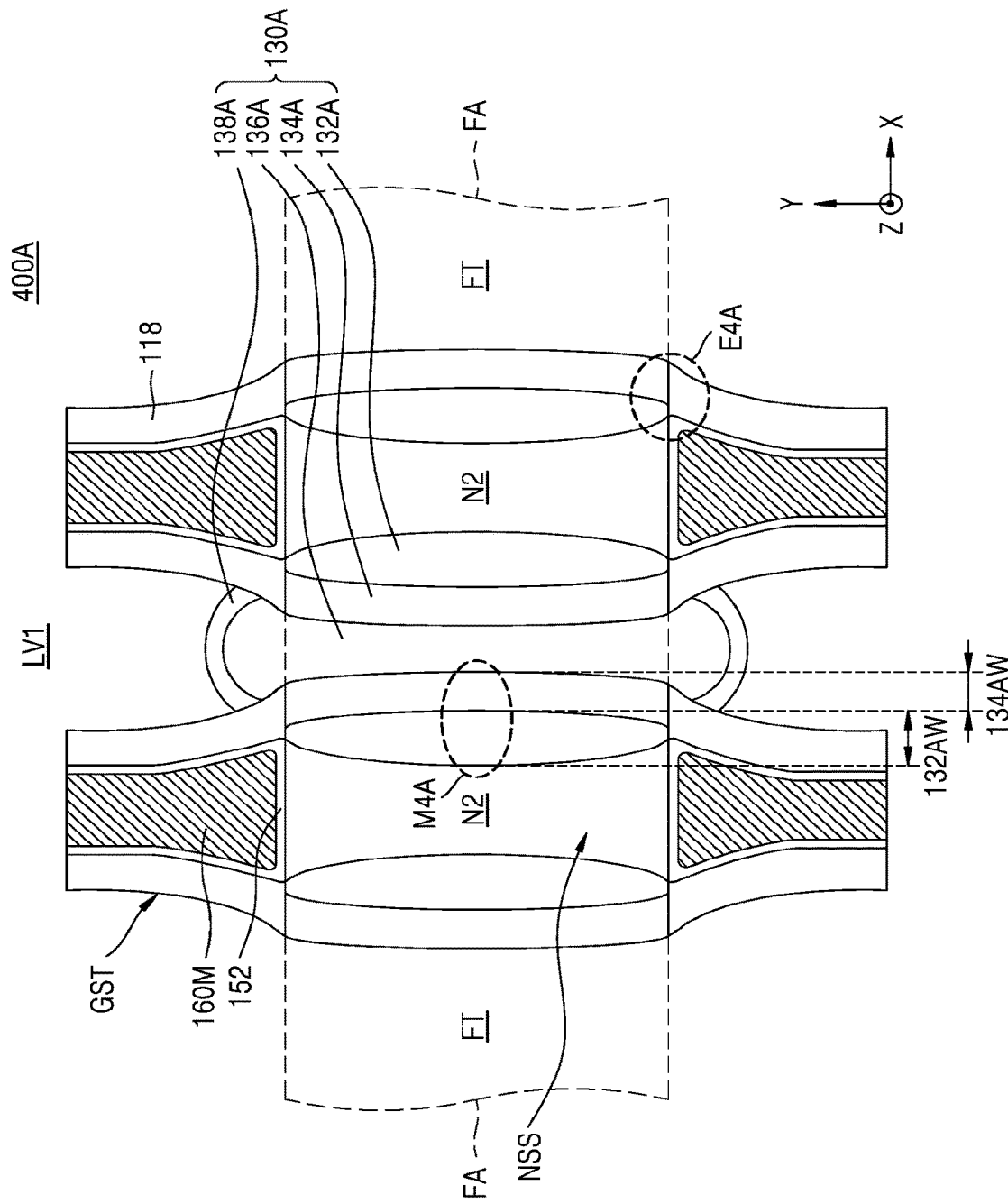
FIGS. 8A to 8E are plan views of source/drain areas of various configurations that can be employed in an integrated circuit device according to other embodiments.

Referring to FIG. 8A, an integrated circuit device 400A may have substantially the same configuration as that of the integrated circuit device 100 described with reference to FIGS. 1 and 2A to 2D. However, the integrated circuit device 400A includes a source/drain area 130A instead of the source/drain area 130 of the integrated circuit device 100.

The source/drain area 130A of the integrated circuit device 400A may include an outer blocking layer 132A, an inner blocking layer 134A, a main body layer 136A, and a capping layer 138A that are sequentially stacked on the fin-type active area FA in the vertical direction (Z direction) and sequentially cover a sidewall of the nanosheet stack NSS. The outer blocking layer 132A, the inner blocking layer 134A, the main body layer 136A, and the capping layer 138A may have substantially the same configuration as those of the outer blocking layer 132, the inner blocking layer 134, the main body layer 136, and the capping layer 138 that are described with reference to FIGS. 1 and 2A to 2D. A contact area between the inner blocking layer 134A and the gate structure GST may be greater than a contact area between the outer blocking layer 132A and the gate structure GST at the position adjacent to both ends of the fin top FT of the fin-type active area FA in the second horizontal direction (Y direction) and at the upper portion thereof in the vertical direction (Z direction).

In the integrated circuit device 400A, as indicated by a dashed area E4A, a width of an edge portion of the inner blocking layer 134A may be greater than a width of an edge portion of the outer blocking layer 132A in the first horizontal direction (X direction). As indicated by a dashed area M4A, a width 134AW of a middle portion of the inner blocking layer 134A may be less than a width 132AW of a middle portion of the outer blocking layer 132A.

Figure 8B:
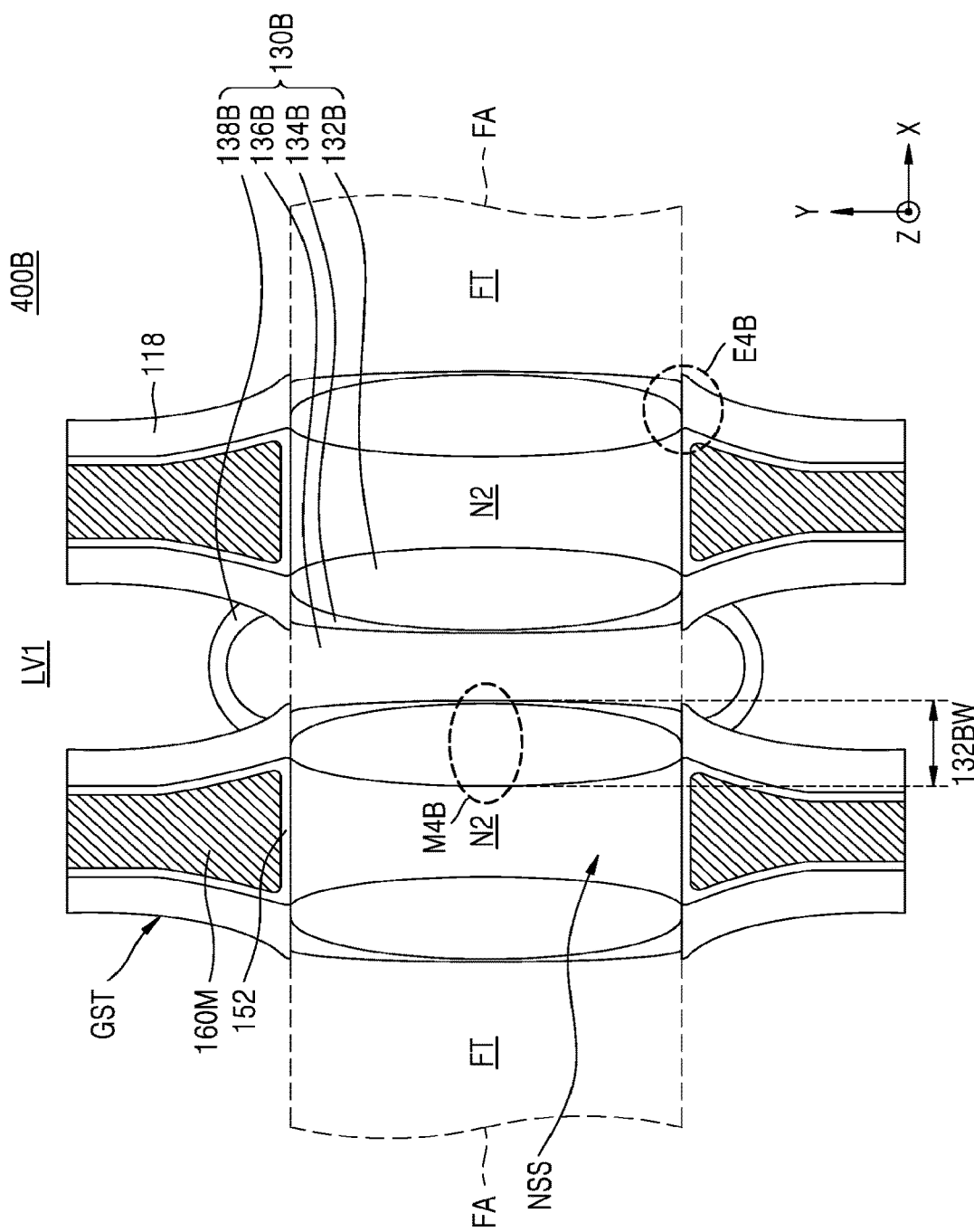

Referring to FIG. 8B, an integrated circuit device 400B may have substantially the same configuration as that of the integrated circuit device 100 described with reference to FIGS. 1 and 2A to 2D. However, the integrated circuit device 400B includes a source/drain area 130B instead of the source/drain area 130 of the integrated circuit device 100.

The source/drain area 130B of the integrated circuit device 400B may include an outer blocking layer 132B, an inner blocking layer 134B, a main body layer 136B, and a capping layer 138B that are sequentially stacked on the fin-type active area FA in the vertical direction (Z direction) and sequentially cover a sidewall of the nanosheet stack NSS. The outer blocking layer 132B, the inner blocking layer 134B, the main body layer 136B, and the capping layer 138B may have substantially the same configuration as those of the outer blocking layer 132, the inner blocking layer 134, the main body layer 136, and the capping layer 138 that are described with reference to FIGS. 1 and 2A to 2D. A contact area between the inner blocking layer 134B and the gate structure GST may be greater than a contact area between the outer blocking layer 132B and the gate structure GST at the position adjacent to both ends of the fin top FT of the fin-type active area FA in the second horizontal direction (Y direction) and at the upper portion thereof in the vertical direction (Z direction).

In the integrated circuit device 400B, as indicated by a dashed area E4B, a width of an edge portion of the inner blocking layer 134B may be greater than a width of an edge portion of the outer blocking layer 132B in the first horizontal direction (X direction). As indicated by a dashed area M4B, a width of a middle portion of the inner blocking layer 134B may be less than a width 132BW of a middle portion of the outer blocking layer 132A. In example embodiments, at least a portion of the middle portion of the inner blocking layer 134B may have a width of about 0 nm to about 2 nm.

Figure 8C:
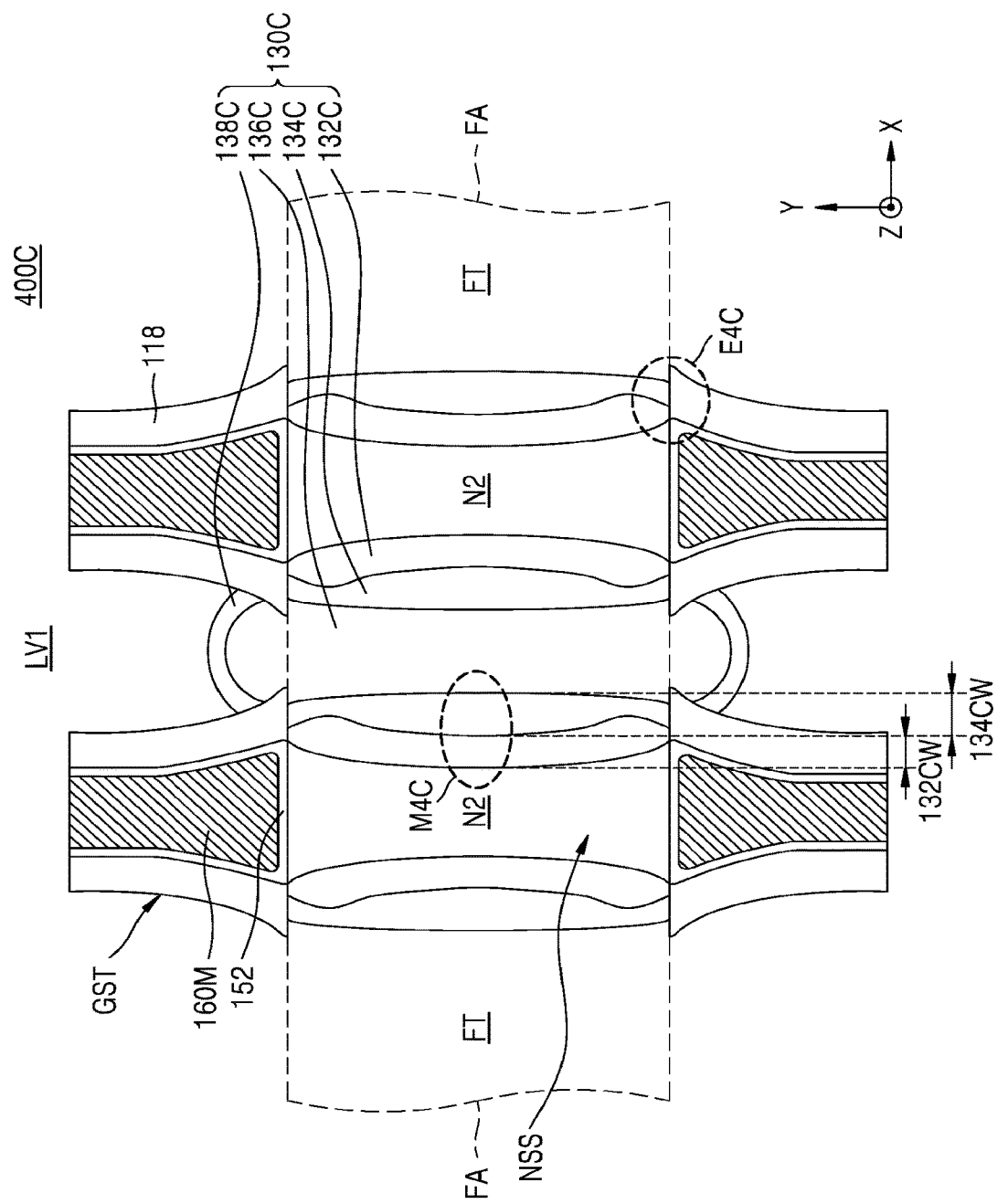

Referring to FIG. 8C, an integrated circuit device 400C may have substantially the same configuration as that of the integrated circuit device 100 described with reference to FIGS. 1 and 2A to 2D. However, the integrated circuit device 400C includes a source/drain area 130C instead of the source/drain area 130 of the integrated circuit device 100.

The source/drain area 130C of the integrated circuit device 400C may include an outer blocking layer 132C, an inner blocking layer 134C, a main body layer 136C, and a capping layer 138C that are sequentially stacked on the fin-type active area FA in the vertical direction (Z direction) and sequentially cover a sidewall of the nanosheet stack NSS. The outer blocking layer 132C, the inner blocking layer 134C, the main body layer 136C, and the capping layer 138C may have substantially the same configuration as those of the outer blocking layer 132, the inner blocking layer 134, the main body layer 136, and the capping layer 138 that are described with reference to FIGS. 1 and 2A to 2D. A contact area between the inner blocking layer 134C and the gate structure GST may be greater than a contact area between the outer blocking layer 132C and the gate structure GST at the position adjacent to both ends of the fin top FT of the fin-type active area FA in the second horizontal direction (Y direction) and at the upper portion thereof in the vertical direction (Z direction).

In the integrated circuit device 400C, as indicated by a dashed area E4C, a width of an edge portion of the inner blocking layer 134C may be greater than a width of an edge portion of the outer blocking layer 132C in the first horizontal direction (X direction). As indicated by a dashed area M4C, a width 134CW of a middle portion of the inner blocking layer 134C may be less than a width 132CW of a middle portion of the outer blocking layer 132C.

Figure 8D:
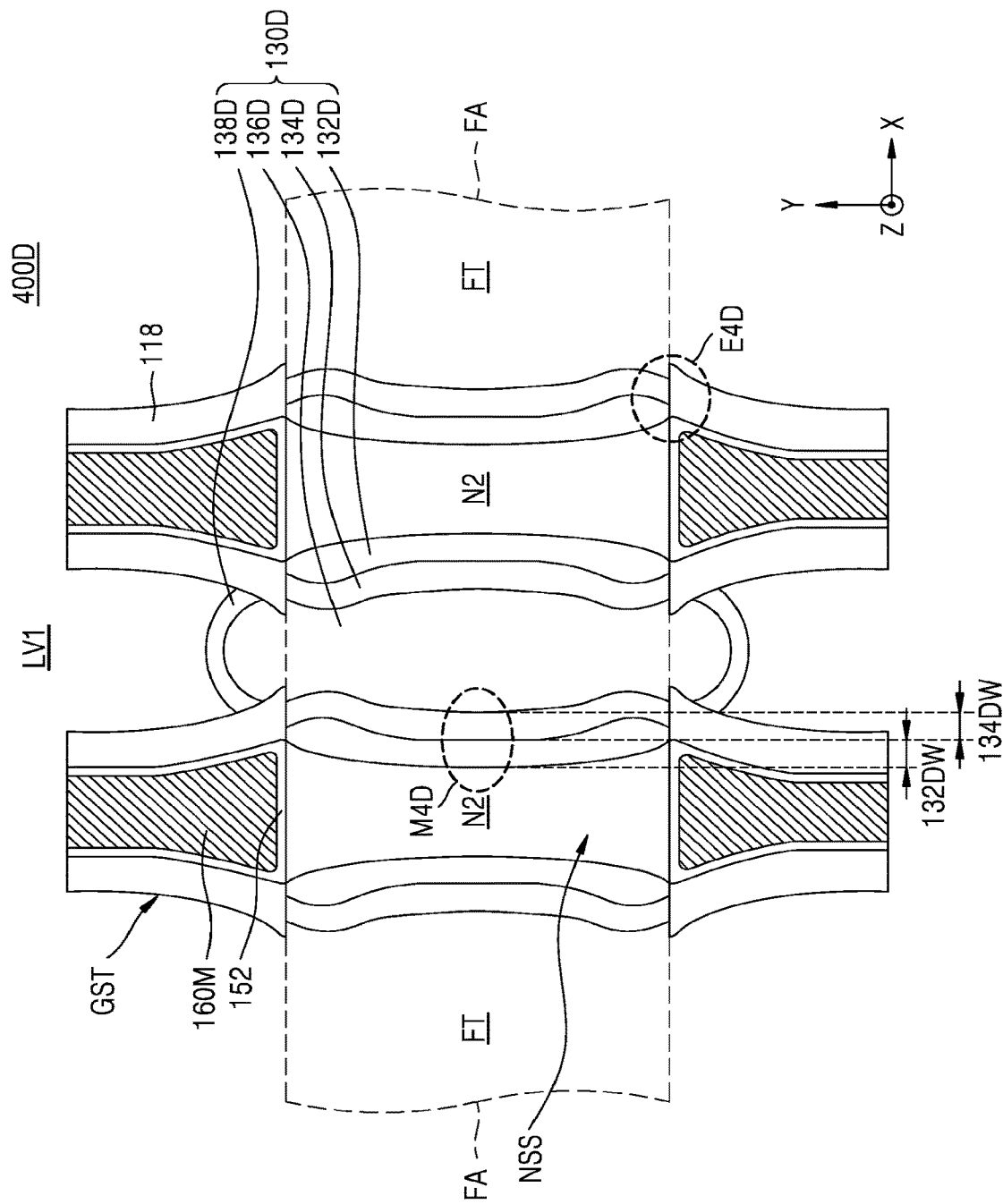

Referring to FIG. 8D, an integrated circuit device 400D may have substantially the same configuration as that of the integrated circuit device 100 described with reference to FIGS. 1 and 2A to 2D. However, the integrated circuit device 400D includes a source/drain area 130D instead of the source/drain area 130 of the integrated circuit device 100.

The source/drain area 130D of the integrated circuit device 400D may include an outer blocking layer 132D, an inner blocking layer 134D, a main body layer 136D, and a capping layer 138D that are sequentially stacked on the fin-type active area FA in the vertical direction (Z direction) and sequentially cover a sidewall of the nanosheet stack NSS. The outer blocking layer 132D, the inner blocking layer 134D, the main body layer 136D, and the capping layer 138D may have substantially the same configuration as those of the outer blocking layer 132, the inner blocking layer 134, the main body layer 136, and the capping layer 138 that are described with reference to FIGS. 1 and 2A to 2D. A contact area between the inner blocking layer 134D and the gate structure GST may be greater than a contact area between the outer blocking layer 132D and the gate structure GST at the position adjacent to the both ends of the fin top FT of the fin-type active area FA in the second horizontal direction (Y direction) and at the upper portion thereof in the vertical direction (Z direction).

In the integrated circuit device 400D, as indicated by a dashed area E4D, a width of an edge portion of the inner blocking layer 134D may be greater than a width of an edge portion of the outer blocking layer 132D in the first horizontal direction (X direction). As indicated by a dashed area M4D, a width 132DW of a middle portion of the outer blocking layer 132D and a width 134DW of a middle portion of the inner blocking layer 134D may be substantially the same or similar.

Figure 8E:
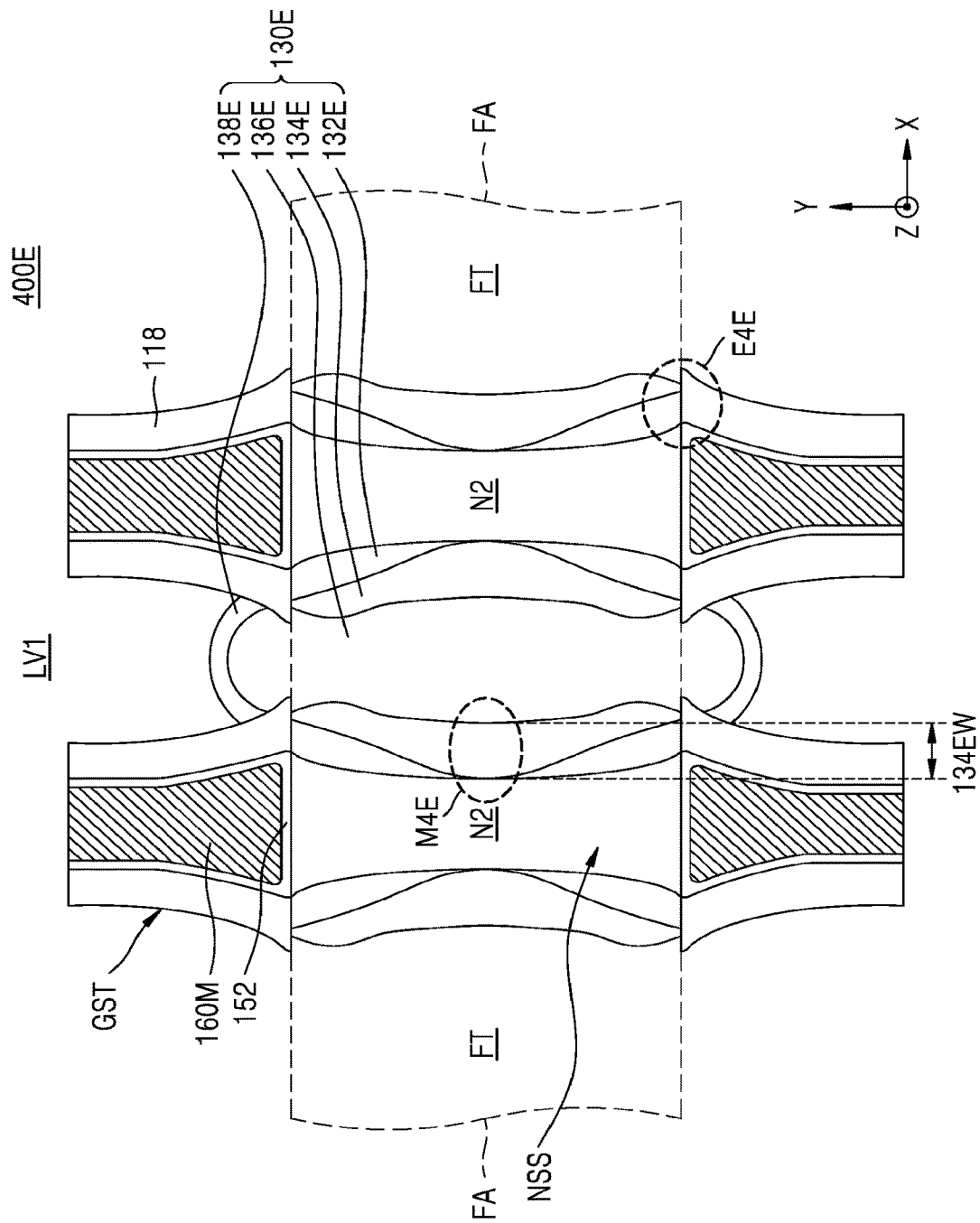

Referring to FIG. 8E, an integrated circuit device 400E may have substantially the same configuration as that of the integrated circuit device 100 described with reference to FIGS. 1 and 2A to 2D. However, the integrated circuit device 400E includes a source/drain area 130E instead of the source/drain area 130 of the integrated circuit device 100.

The source/drain area 130E of the integrated circuit device 400E may include an outer blocking layer 132E, an inner blocking layer 134E, a main body layer 136E, and a capping layer 138E that are sequentially stacked on the fin-type active area FA in the vertical direction (Z direction) and sequentially cover a sidewall of the nanosheet stack NSS. The outer blocking layer 132E, the inner blocking layer 134E, the main body layer 136E, and the capping layer 138E may have substantially the same configuration as those of the outer blocking layer 132, the inner blocking layer 134, the main body layer 136, and the capping layer 138 that are described with reference to FIGS. 1 and 2A to 2D. However, a contact area between the inner blocking layer 134E and the gate structure GST may be less than a contact area between the outer blocking layer 132E and the gate structure GST at the position adjacent to the both ends of the fin top FT of the fin-type active area FA in the second horizontal direction (Y direction) and at the upper portion thereof in the vertical direction (Z direction).

In the integrated circuit device 400E, as indicated by a dashed area E4E, a width of an edge portion of the inner blocking layer 134E may be less than a width of an edge portion of the outer blocking layer 132E in the first horizontal direction (X direction). As indicated by a dashed area M4E, a width 134EW of a middle portion of the inner blocking layer 134E may be greater than a width of a middle portion of the outer blocking layer 132E. In some embodiments, at least a portion of the middle portion of the outer blocking layer 132E may have a width of about 0 nm to about 2 nm.

In the integrated circuit devices according to embodiments described with reference to FIGS. 1 to 8E, a source/drain area includes a double-layered blocking layer including an inner blocking layer and an outer blocking layer to protect a main body layer. The inner blocking layer does not include a material susceptible to attack from the outside during a manufacturing process of an integrated circuit device, e.g., a Ge element. In addition, the inner blocking layer may compensate for a weak portion having a smaller width or thickness due to facets included in the outer blocking layer or other causes. To this end, the inner blocking layer may cover the weak portion of the outer blocking layer with a relatively large thickness.

For example, a width of at least a portion of the outer blocking layer may be reduced due to the facets included in the outer blocking layer or other causes at a position adjacent to both ends of the fin top FT in a width direction of a fin-type active area in the source/drain area, i.e., in the second horizontal direction (Y direction), and at an upper portion thereof in the vertical direction (Z direction) in FIG. 1, or at an arbitrary position between both ends of the fin top FT. When the source/drain area does not include an inner blocking layer, in a subsequent process, e.g., a process described later with reference to FIG. 17, an etchant used to remove a dummy gate layer D124 and the plurality of sacrificial semiconductor layers 104 may penetrate into the main body layer in the source/drain area through the weak portion of the outer blocking layer, and a portion of the main body layer may be removed or deteriorated.

In an integrated circuit device according to embodiments, an inner blocking layer in a source/drain area covers a weak portion of an outer blocking layer with a relatively large thickness. Because an inner blocking layer does not include a material susceptible to an etchant, e.g., a Ge element, when removing the dummy gate layer D124 and the plurality of sacrificial semiconductor layers 104 in a subsequent process, e.g., a process described later with reference to FIG. 17, the inner blocking layer may have relatively high etching resistance to an etchant. Accordingly, penetration of an etchant to a main body layer of the source/drain area through the weak portion of the outer blocking layer may be effectively prevented by the inner blocking layer.

As such, in an integrated circuit device according to embodiments, an inner blocking layer included in a source/drain area selectively reinforces a portion susceptible to external attacks in an outer blocking layers, thereby suppressing the occurrence of defects such as deterioration of the source/drain area due to external attacks during a manufacturing process of the integrated circuit device or a short circuit between the source/drain area and the adjacent conductive area, e.g., a gate line, and improving the reliability of the integrated circuit device.

Figure 9A:
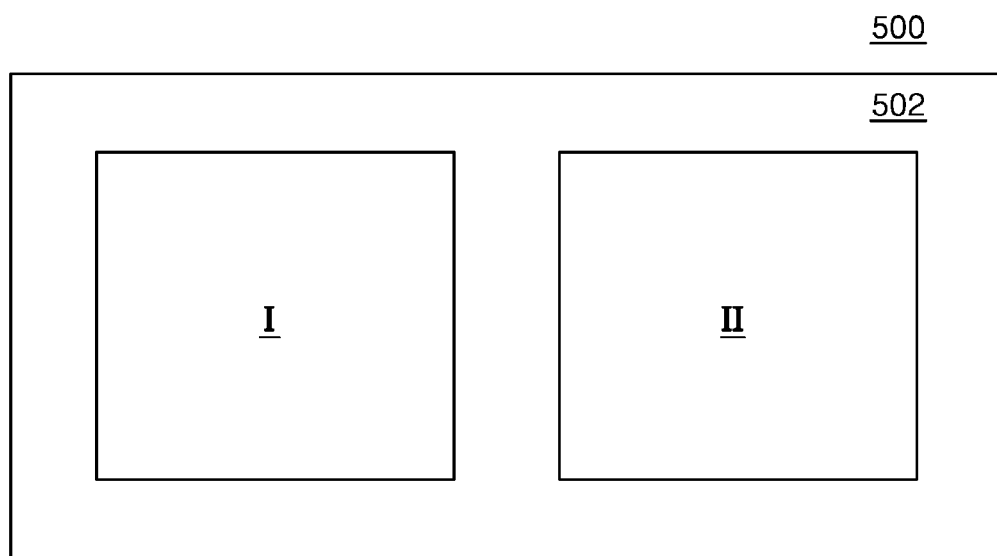
FIG. 9A is a block diagram of an integrated circuit device according to embodiments.

FIG. 9A is a block diagram of an integrated circuit device according to embodiments.

Referring to FIG. 9A, an integrated circuit device 500 may include a substrate 502 having a first area I and a second area II. The substrate 502 may have substantially the same configuration as described for the substrate 102 with reference to FIG. 2A.

The first area I and the second area II of the substrate 502 refer to different areas of the substrate 502, and may perform different operations on the substrate 502. The first area I and the second area II may be spaced apart from each other or may be connected to each other. The first area I and the second area II may require different threshold voltages. For example, the first area I may be a PMOS area in which a p-type channel is formed, and the second area II may be an NMOS area in which an n-type channel is formed.

Figure 9B:
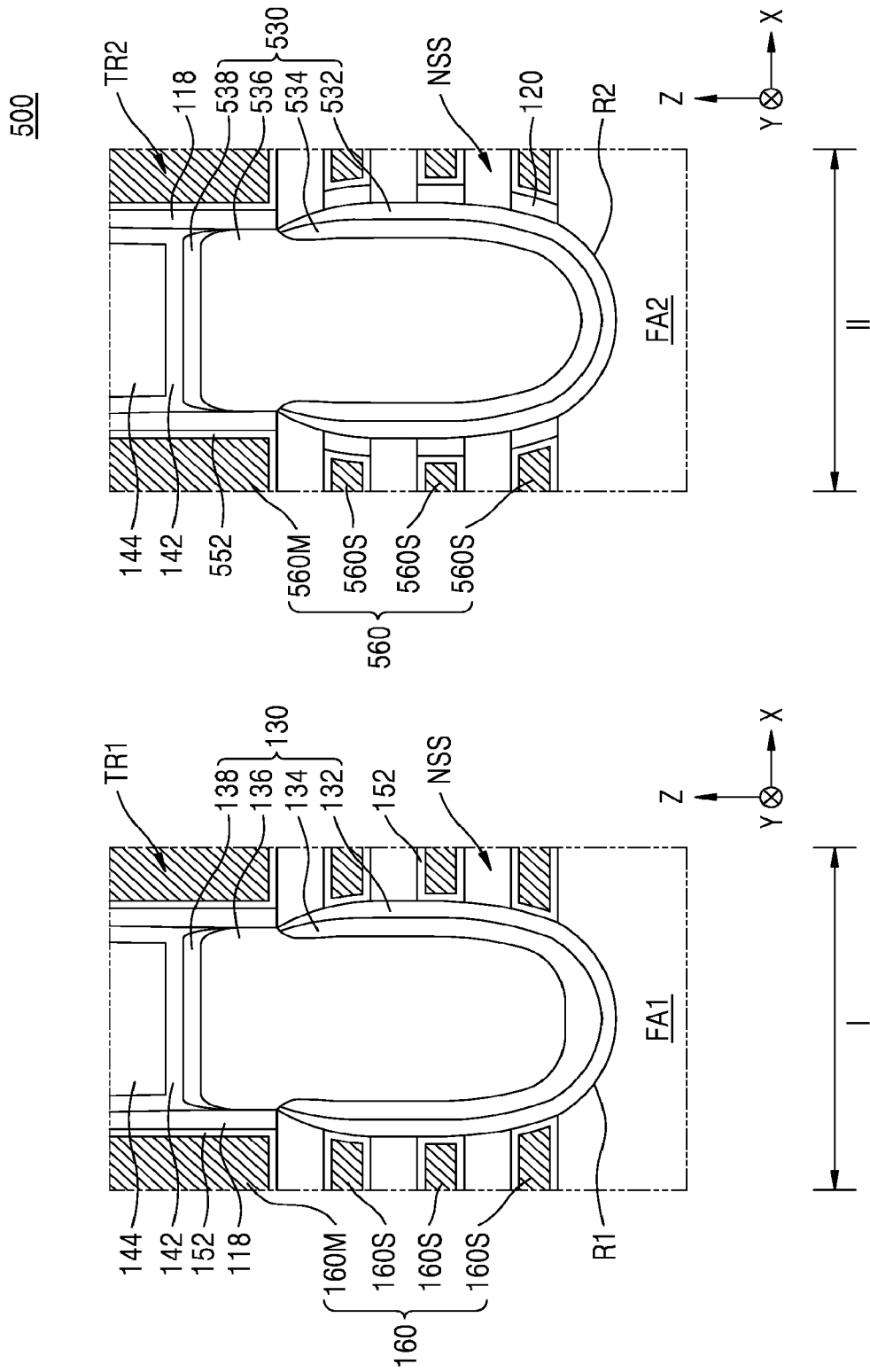
FIGS. 9B and 9C are a cross-sectional view and a plan view of some configurations of the integrated circuit device illustrated in FIG. 9A, respectively.
Figure 9C:
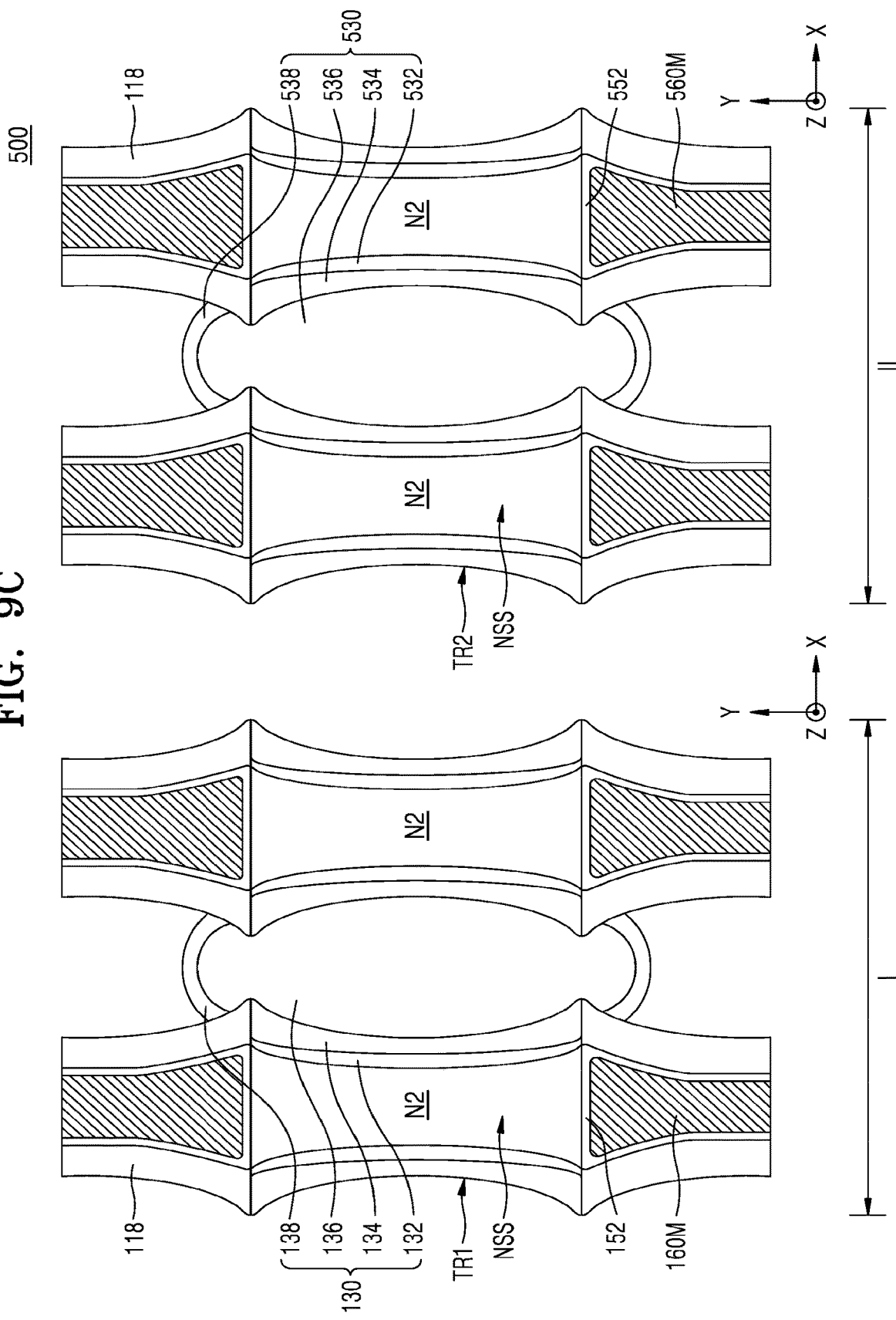

FIG. 9B is a cross-sectional view of some configurations of each of the first area I and the second area II of the integrated circuit device 500 illustrated in FIG. 9A, and FIG. 9C is a plan view of partial configurations of each of the first area I and the second area II of the integrated circuit device 500. Each of the first area I and the second area II of FIG. 9B illustrates an enlarged cross-sectional configuration of some components of a portion corresponding to the local area indicated by "EX1" of FIG. 2A. Each of the first area I and the second area II of FIG. 9C illustrates an enlarged planar configuration of some components of a portion corresponding to the first level LV1 of FIG. 2A, similar to that of FIG. 2C. In FIGS. 9B and 9C, the same reference numerals as in FIGS. 1 to 2D denote the same elements, and a duplicate description thereof will not be given herein.

Referring to FIGS. 9B and 9C, the integrated circuit device 500 includes a first transistor TR1 formed on the first area I of the substrate 502 (See FIG. 9A) and a second transistor TR2 formed on the second area II of the substrate 502. The first transistor TR1 and the second transistor TR2 may have different channel types. For example, the first transistor TR1 may be a PMOS transistor in which a p-type channel is formed, and the second transistor TR2 may be an NMOS transistor in which an n-type channel is formed.

The first transistor TR1 may include a first fin-type active area FA1 that extends along the first horizontal direction (X direction) on the first area I of the substrate 502, the nanosheet stack NSS on the first fin-type active area FA1, the gate line 160 including the main-gate portion 160M and the plurality of sub-gate portions 160S, the gate dielectric layer 152 between the nanosheet stack NSS and the gate line 160, and a pair of source/drain areas 130 on both sides of the nanosheet stack NSS on the first fin-type active area FA1.

The first fin-type active area FA1 may have substantially the same configuration as described for the fin-type active area FA with reference to FIGS. 1 and 2A to 2D.

The source/drain area 130 on the first area I may include the outer blocking layer 132, the inner blocking layer 134, the main body layer 136, and the capping layer 138 as described with reference to FIGS. 1 and 2A to 2D. Each of the outer blocking layer 132 and the main body layer 136 may include a $Si_{1-x}Ge_x$ layer (where x≠0), and the inner blocking layer 134 and the capping layer 138 may include a Si layer.

In example embodiments, the source/drain area 130 on the first area I is in contact with a sidewall of the nanosheet stack NSS on the first fin-type active area FA1, and may fill the recess R1 arranged adjacent to the nanosheet stack NSS.

In the source/drain area 130, the outer blocking layer 132 is in contact with the sidewall of the nanosheet stack NSS, and may include a first $Si_{1-x}Ge_x$ layer doped with a p-type dopant (where 0<x<0.15). The inner blocking layer 134 is on the outer blocking layer 132 in the recess R1, and may have a width greater than a width of the outer blocking layer 132 on at least a portion of the sidewall of the nanosheet stack NSS. A width of at least a portion of the inner blocking layer 134 on the sidewall of the nanosheet stack NSS in the first horizontal direction (X direction) may be greater than a width of the outer blocking layer 132 in the first horizontal direction (X direction). A thickness of a bottom portion of the inner blocking layer 134 in the vertical direction (Z direction) may be greater than a thickness of a bottom portion of the outer blocking layer 132 in the vertical direction (Z direction).

The inner blocking layer 134 may include an undoped Si layer or a Si layer doped with a p-type dopant, e.g., B or Ga. The main body layer 136 may fill the recess R1 on the inner blocking layer 134. The main body layer 136 may include a second Si1-xGex layer (where 0.15≤x<0.7) doped with a p-type dopant. More detailed configurations of the outer blocking layer 132, the inner blocking layer 134, the main body layer 136, and the capping layer 138 are as described with reference to FIGS. 1 and 2A to 2D.

In other example embodiments, the substrate 502 may have the same structure as any of the source/drain areas 130A, 130B, 130C, 130D, 130E, 230A, 230B, and 330 illustrated in FIGS. 5A, 5B, 7, and 8A to 8E, and other source/drain areas having various structures modified and changed therefrom within the scope on the first area I, instead of the source/drain area 130 illustrated in FIGS. 9B and 9C.

The second transistor TR2 may include a second fin-type active area FA2 that is long the first horizontal direction (X direction) on the second area II of the substrate 502, the nanosheet stack NSS on the second fin-type active area FA2, a gate line 560 including a main-gate portion 560M and a plurality of sub-gate portions 560S, a gate dielectric layer 552 between the nanosheet stack NSS and the gate line 560, and a pair of source/drain areas 530 on both sides of the nanosheet stack NSS on the second fin-type active area FA2. The gate line 560 and the gate dielectric layer 552 may have substantially the same configuration as described for the gate line 160 and the gate dielectric layer 152 with reference to FIGS. 1 and 2A to 2D. However, the gate line 160 on the first area I and the gate line 560 on the second area II may include different materials. The gate dielectric layer 152 on the first area I and the gate dielectric layer 552 on the second area II may include different materials.

The second fin-type active area FA2 may have substantially the same configuration as described for the fin-type active area FA with reference to FIGS. 1 and 2A to 2D. FIG. 9B illustrates a case in which the second fin-type active area FA2 extends in the first horizontal direction (X direction) in the same direction as the extension direction of the first fin-type active area FA1 in the first area I, but embodiments are not limited thereto. The second fin-type active area FA2 may extend in another horizontal direction crossing the first horizontal direction (X direction).

The source/drain area 530 on the second area II may have substantially the same configuration as that of the source/drain area 130 on the first area I. However, the source/drain area 530 may include an outer blocking layer 532, an inner blocking layer 534, a main body layer 536, and a capping layer 538.

In example embodiments, the source/drain area 530 on the second area II is in contact with a sidewall of the nanosheet stack NSS on the second fin-type active area FA2, and may fill a recess R2 arranged adjacent to the nanosheet stack NSS.

The second transistor TR2 on the second area II of the integrated circuit device 500 may further include the plurality of inner insulating spacers 120 between a plurality of sub-gate portions 560S and the source/drain areas 530.

In the source/drain area 530, the outer blocking layer 532 may contact the sidewall of the nanosheet stack NSS. The inner blocking layer 534 is on the outer blocking layer 532 in the recess R2, and may have a width greater than a width of the outer blocking layer 532 on at least a portion of the sidewall of the nanosheet stack NSS. A width of at least a portion of the inner blocking layer 534 on the sidewall of the nanosheet stack NSS in the first horizontal direction (X direction) may be greater than a width of the outer blocking layer 532 in the first horizontal direction (X direction). The inner blocking layer 534 may be apart from the nanosheet stack NSS in a first horizontal direction (X direction) with the outer blocking layer 532 therebetween. The main body layer 536 may fill the recess R2 on the inner blocking layer 534.

Each of the outer blocking layer 532 and the main body layer 536 may include a Si layer doped with an n-type dopant. The inner blocking layer 534 may include a SiGe layer. The SiGe layer constituting the inner blocking layer 534 may be an undoped SiGe layer or a SiGe layer doped with an n-type dopant. The n-type dopant may be at least one of P, As, and Sb, but is not limited thereto. In example embodiments, the inner blocking layer 534 may include a $Si_{1-x}Ge_x$ layer (where x≠0). For example, the inner blocking layer 534 may include a $Si_{1-x}Ge_x$ layer (where 0<x<0.7), but is not limited thereto. The capping layer 538 may include a Si layer doped with an n-type dopant or an undoped Si layer. In some embodiments, the capping layer 538 may be omitted.

The outer blocking layer 532, the inner blocking layer 534, the main body layer 536, and the capping layer 538 constituting the source/drain areas 530 may be deformed to have various shapes, respectively. Further details of modifications of the various shapes of each of the outer blocking layer 532, the inner blocking layer 534, the main body layer 536, and the capping layers 538 are substantially the same as those described for the outer blocking layer 132, the inner blocking layer 134, the main body layer 136, and the capping layer 138 with reference to FIGS. 1 and 2A to 2D.

In other example embodiments, each of the outer blocking layer 532, the inner blocking layer 534, the main body layer 536, and the capping layer 538 constituting the source/drain area 530 may be deformed to have various shapes similar to those described for the source/drain areas 130A, 130B, 130C, 130D, 130E, 230A, 230B, and 330 illustrated in FIGS. 5A and 5B, 7, and 8A to 8E.

Each of FIGS. 9A and 9B illustrates a configuration in which the first transistor TR1 having substantially the same structure as the structure described with reference to FIGS. 1 and 2A to 2D is formed on the first area I of the integrated circuit device 500, but embodiments are not limited thereto. For example, the first transistor TR1 arranged on the first area I of the integrated circuit device 500 may further include the plurality of inner insulating spacers 120 between the plurality of sub-gate portions 160S and the source/drain area 130 similar to that described with reference to FIGS. 6A and 6B.

According to the integrated circuit device 500 described with reference to FIGS. 9A to 9C, in the first transistor TR1 and the second transistor TR2 having different channel types, each source/drain area includes a double-layered blocking layer for protecting a main body layer. In the double-layered blocking layer, an inner blocking layer selectively reinforces a portion susceptible to external attacks in an outer blocking layer, thereby preventing a source/drain area from deteriorating during a manufacturing process of an integrated circuit device. Accordingly, it is possible to suppress occurrence of defects such as a short circuit between the source/drain area and the adjacent conductive area, e.g., a gate line, and improve reliability of the integrated circuit device.

Figure 10:
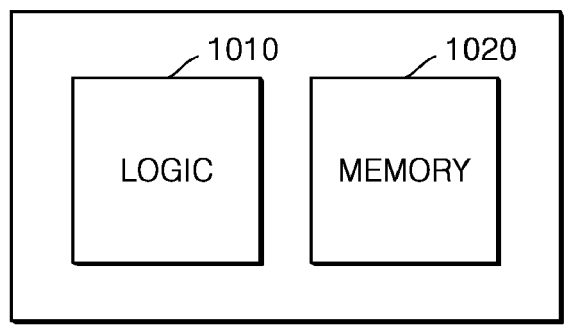
FIG. 10 is a block diagram of an electronic device according to embodiments.

FIG. 10 is a block diagram of an electronic device 1000 according to embodiments.

Referring to FIG. 10, the electronic device 1000 may include a logic area 1010 and a memory area 1020.

The logic area 1010 may include various kinds of logic cells including a plurality of circuit elements, e.g., transistors, registers, etc., as standard cells performing desired logic functions such as a counter, a buffer, etc. The logic cell may configure, e.g., AND, NAND, OR, NOR, XOR (exclusive OR), XNOR (exclusive NOR), INV (inverter), ADD (adder), BUF (buffer), DLY (delay), FILL (filter), multiplexer (MXT/MXIT), OAI (OR/AND/INVERTER), AO (AND/OR), AOI (AND/OR/INVERTER), D flip-flop, reset flip-flop, master-slaver flip-flop, latch, etc.

The memory area 1020 may include at least one of static random access memory (SRAM), dynamic RAM (DRAM), magnetic RAM (MRAM), resistive RAM (RRAM), and phase-change RAM (PRAM), but is not limited thereto.

In the electronic device 1000, at least one of the logic area 1010 and the memory area 1020 may include at least one of the integrated circuit devices 100, 100A, 200A, 200B, 200C, 200D, 300, 400A, 400B, 400C, 400D, 400E, and 500 described with reference to FIGS. 1 to 9C and other semiconductor devices having various structures modified and changed therefrom within the scope.

FIGS. 11A to 21 are views of stages in a method of manufacturing an integrated circuit device according to embodiments. In detail, FIGS. 11A to 14A are plan views of stages in the method of manufacturing the integrated circuit device, FIGS. 11B to 14B are cross-sectional views along line X-X' in FIGS. 11A to 14A, respectively, and FIGS. 15 to 21 are cross-sectional views of stages subsequent to those in FIG. 14B. FIGS. 15 to 21 illustrate partial configurations of a portion corresponding to the cross-section of line X-X' line of FIG. 1. An exemplary method of manufacturing the integrated circuit devices 100 and 100A will be described with reference to FIGS. 11A to 21. In FIGS. 11A to 21, the same reference numerals as in FIGS. 1, 2A to 2D, and 4A denote the same members.

Figure 11A:
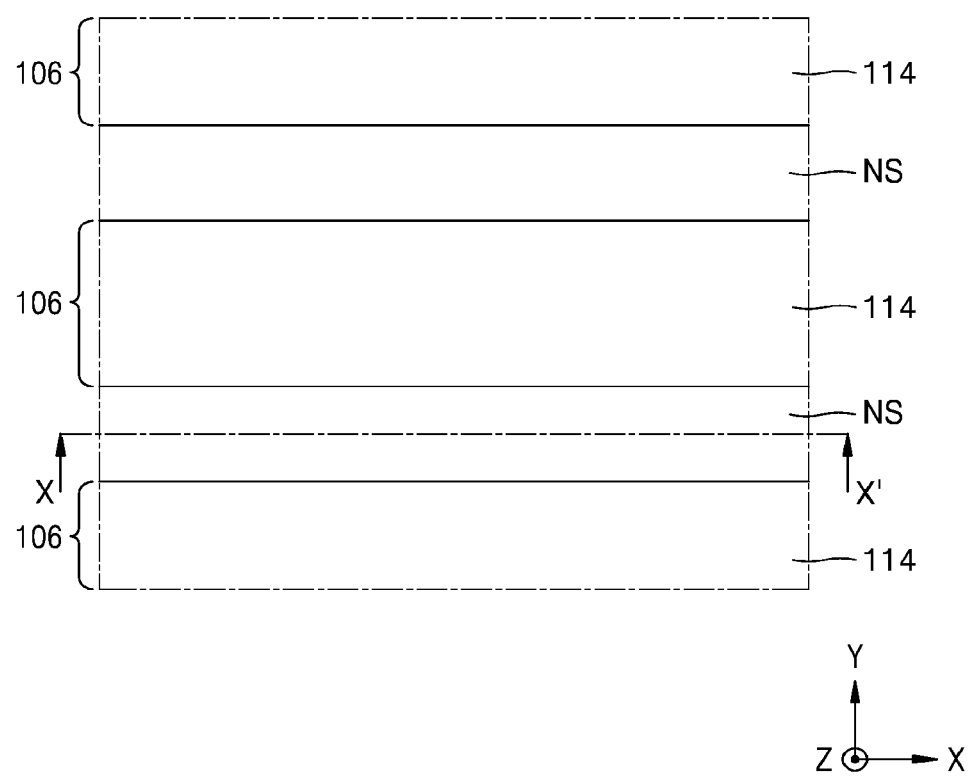
FIGS. 11A to 21 are views of stages in a method of manufacturing an integrated circuit device according to embodiments.
Figure 11B:
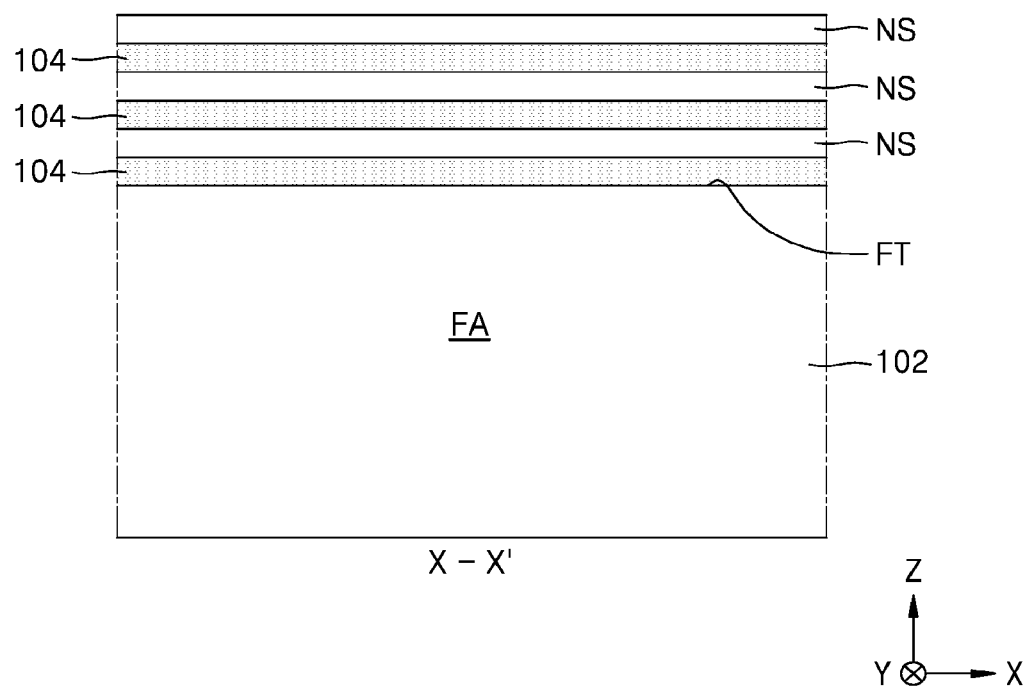

Referring to FIGS. 11A and 111B, after the plurality of sacrificial semiconductor layers 104 and a plurality of nanosheet semiconductor layers NS are alternately stacked on the substrate 102 one by one, the plurality of sacrificial semiconductor layers 104, the plurality of nanosheet semiconductor layers NS, and a portion of the substrate 102 are etched to form a device isolation trench 106. The plurality of fin-type active areas FA may be defined in the substrate 102 by the device isolation trench 106. After that, the device isolation layer 114 is formed by filling an insulating material in the device isolation trench 106. An upper surface of the device isolation layer 114 may be at a level substantially the same as or similar to the fin top FT of the fin-type active area FA.

A stack structure of the plurality of sacrificial semiconductor layers 104 and the plurality of nanosheet semiconductor layers NS may remain on the fin top FT of each of the plurality of fin-type active areas FA.

The plurality of sacrificial semiconductor layers 104 and the plurality of nanosheet semiconductor layers NS may include semiconductor materials having different etch selectivities. In example embodiments, the plurality of nanosheet semiconductor layers NS may include a Si layer, and the plurality of sacrificial semiconductor layers 104 may include a SiGe layer. In example embodiments, Ge content in the plurality of sacrificial semiconductor layers 104 may be constant. The SiGe layer constituting the plurality of sacrificial semiconductor layers 104 may have constant Ge content of about 5 atomic % to about 60 atomic %, e.g., about 10 atomic % to about 40 atomic %. The Ge content in the SiGe layer constituting the plurality of sacrificial semiconductor layers 104 may be variously selected as necessary.

Figure 12A:
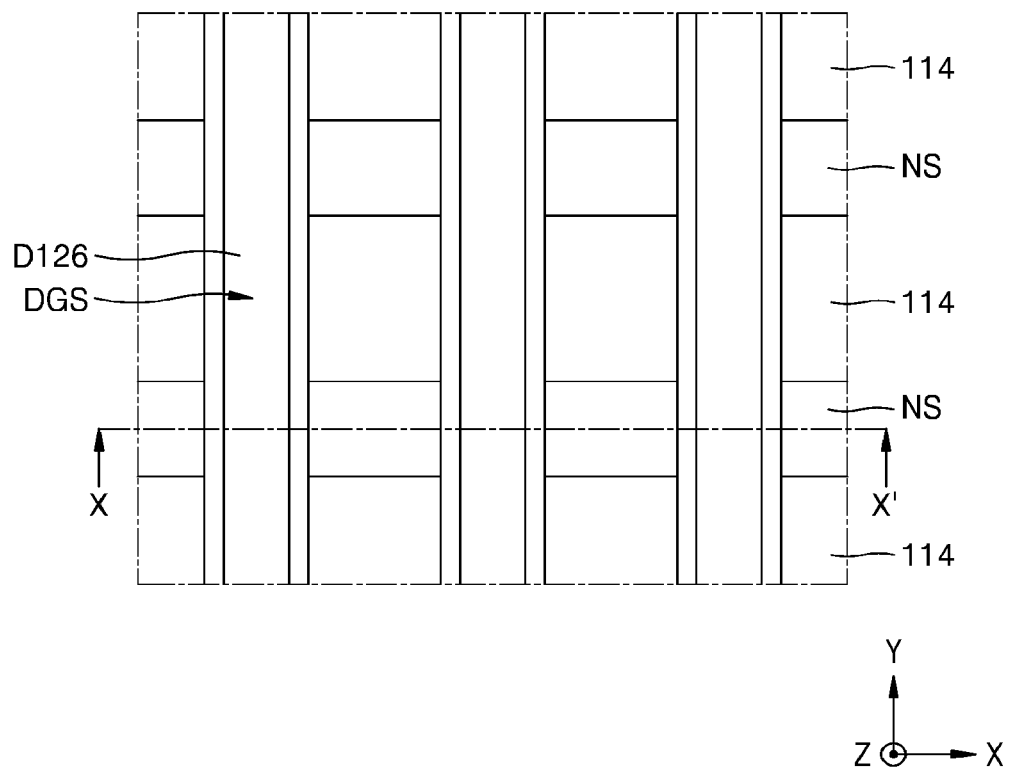
Figure 12B:
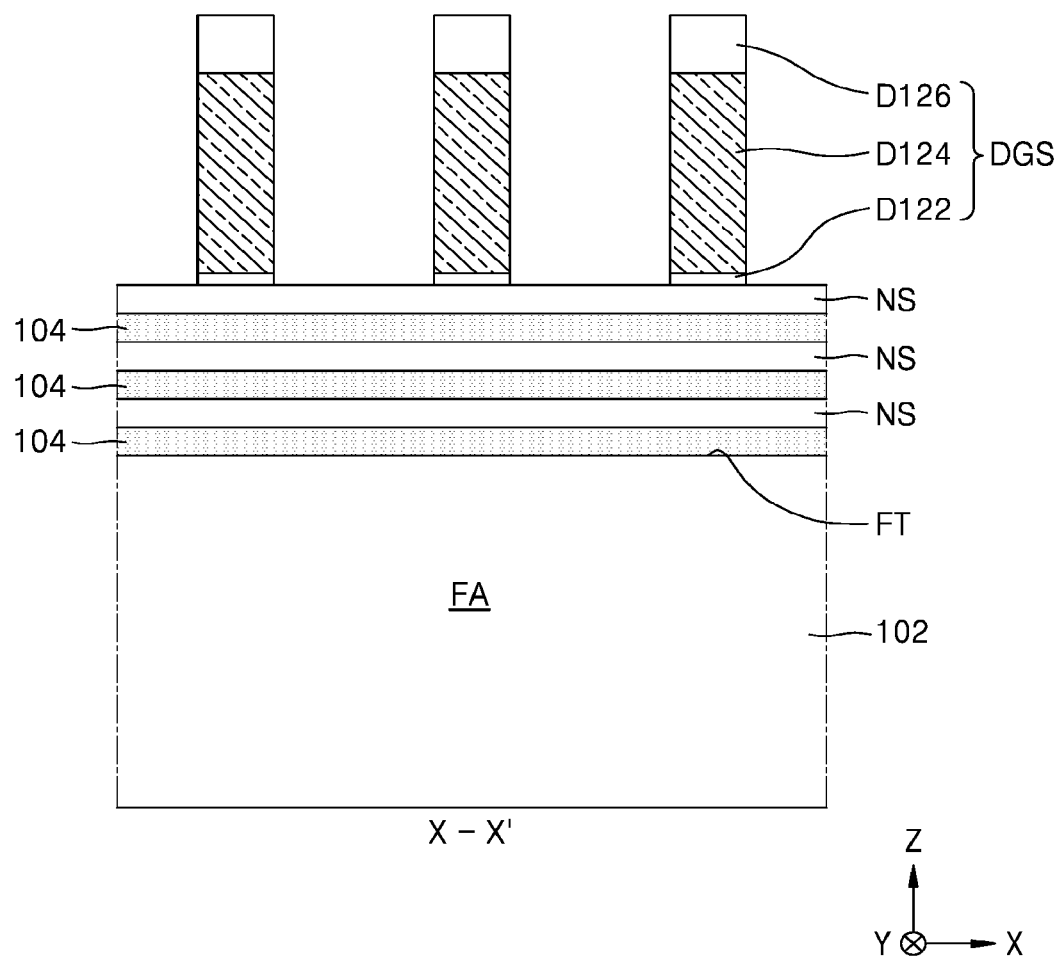

Referring to FIGS. 12A and 12B, a plurality of dummy gate structures DGS are formed on a stack structure of the plurality of sacrificial semiconductor layers 104 and the plurality of nanosheet semiconductor layers NS remaining on the fin-type active area FA.

Each of the plurality of dummy gate structures DGS may be long in the second horizontal direction (Y direction). Each of the dummy gate structures DGS may have a structure in which an oxide layer D122, the dummy gate layer D124, and a capping layer D126 are sequentially stacked. In example embodiments, the dummy gate layer D124 may include polysilicon, and the capping layer D126 may include a silicon nitride layer.

Figure 13A:
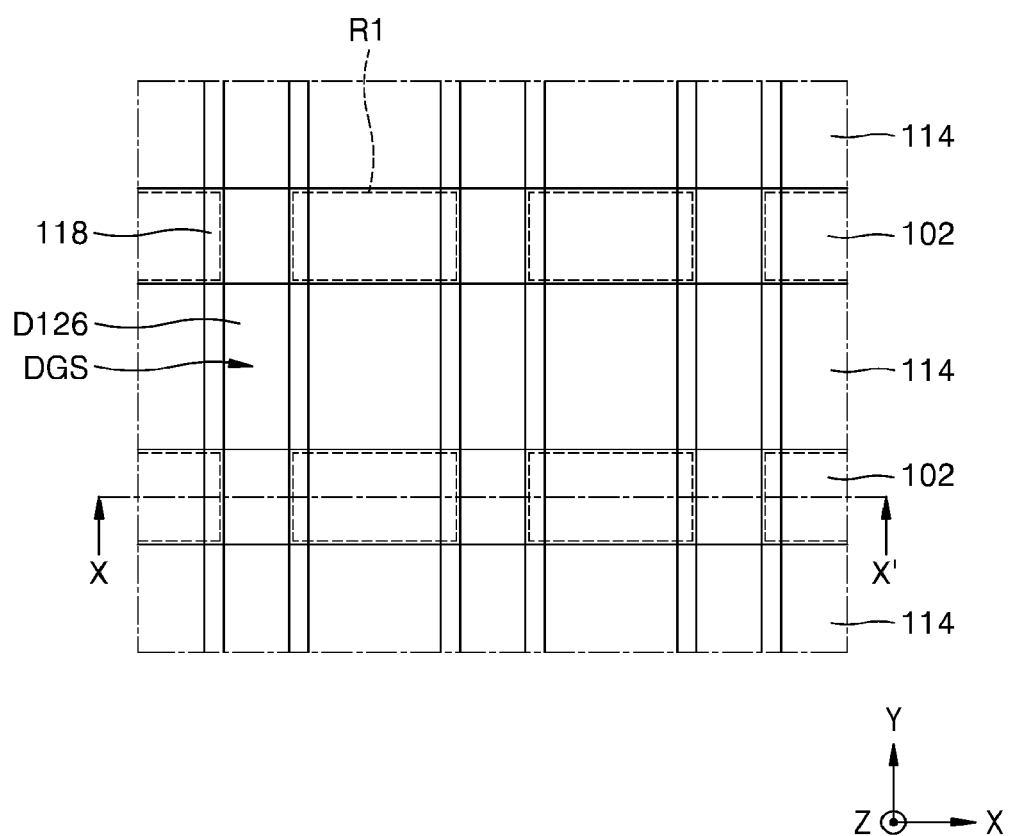
Figure 13B:
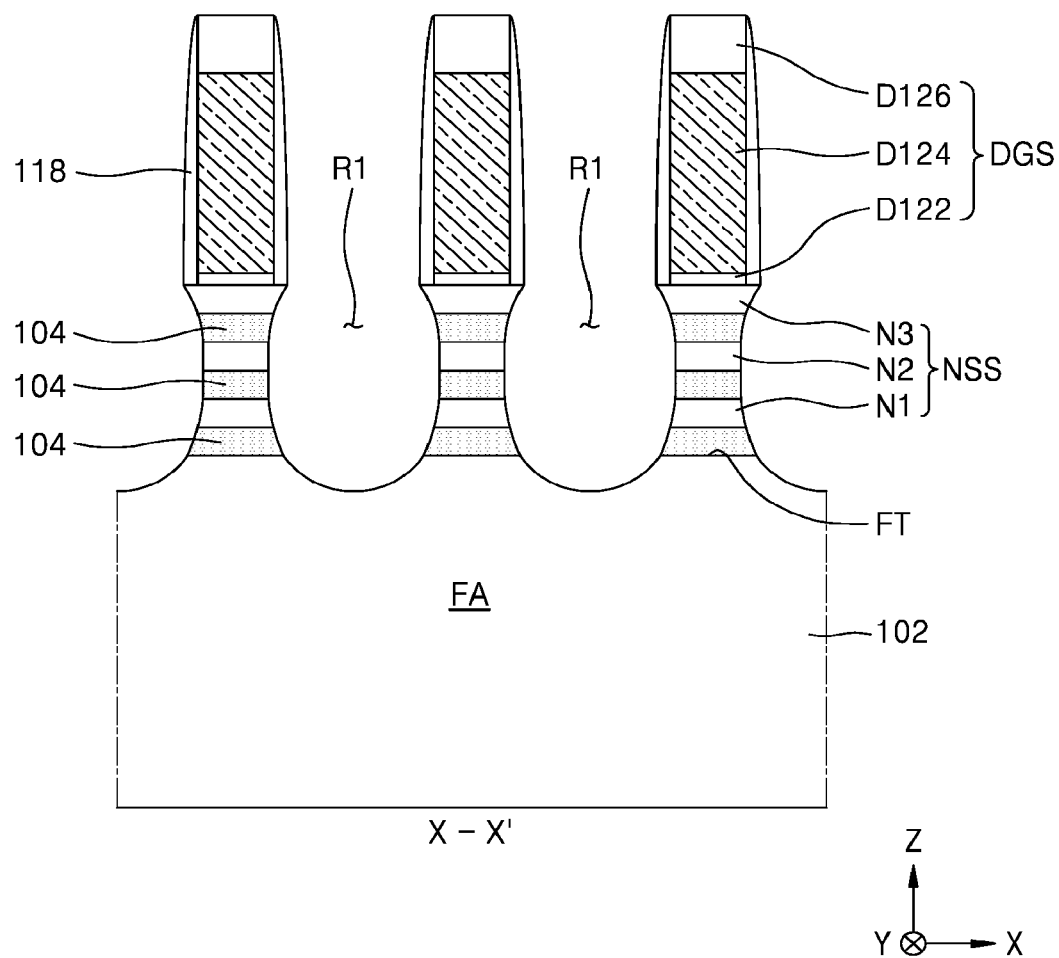

Referring to FIGS. 13A and 13B, after the plurality of outer insulating spacers 118 covering both sidewalls of each of the plurality of dummy gate structures DGS are formed, a portion of each of the plurality of sacrificial semiconductor layers 104 and the plurality of nanosheet semiconductor layers NS is removed using the plurality of dummy gate structures DGS and the plurality of outer insulating spacers 118 as an etching mask, the plurality of nanosheet semiconductor layers NS are divided into the plurality of nanosheet stacks NSS. Each of the plurality of nanosheet stacks NSS may include the plurality of nanosheets N1, N2, and N3. The plurality of recesses R1 may be formed on the fin-type active area FA by etching the fin-type active area FA exposed between each of the plurality of nanosheet stacks NSS. In order to form the plurality of recesses R1, the fin-type active area FA may be etched using a dry method, a wet method, or a combination thereof.

Figure 14A:
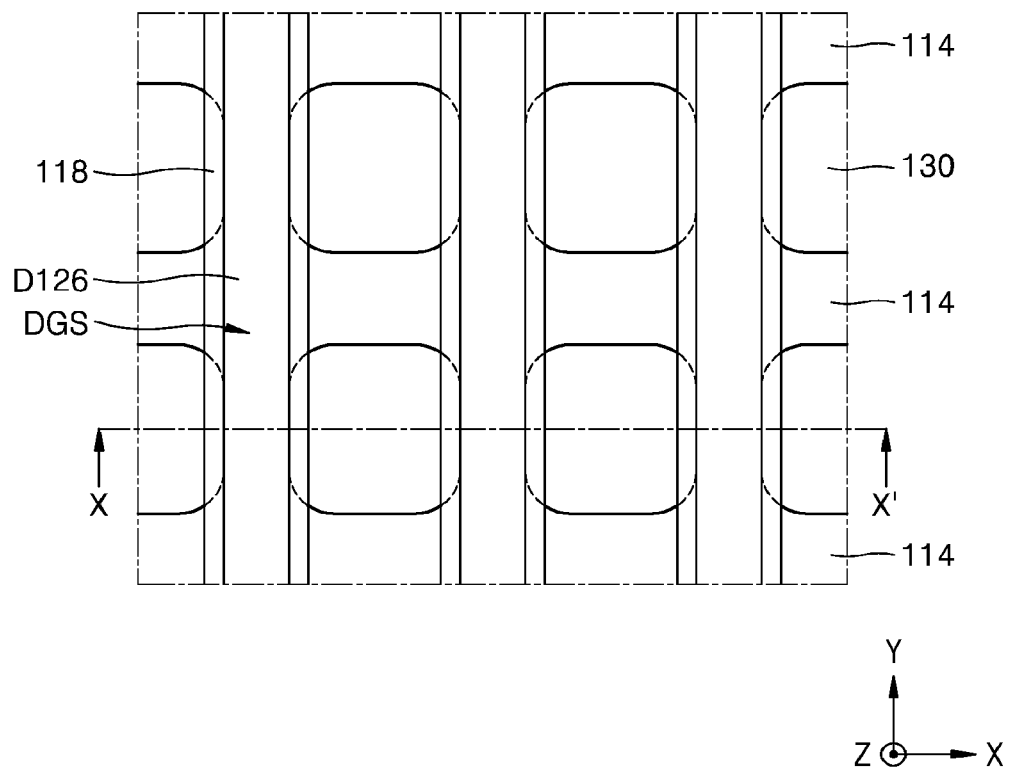
Figure 14B:
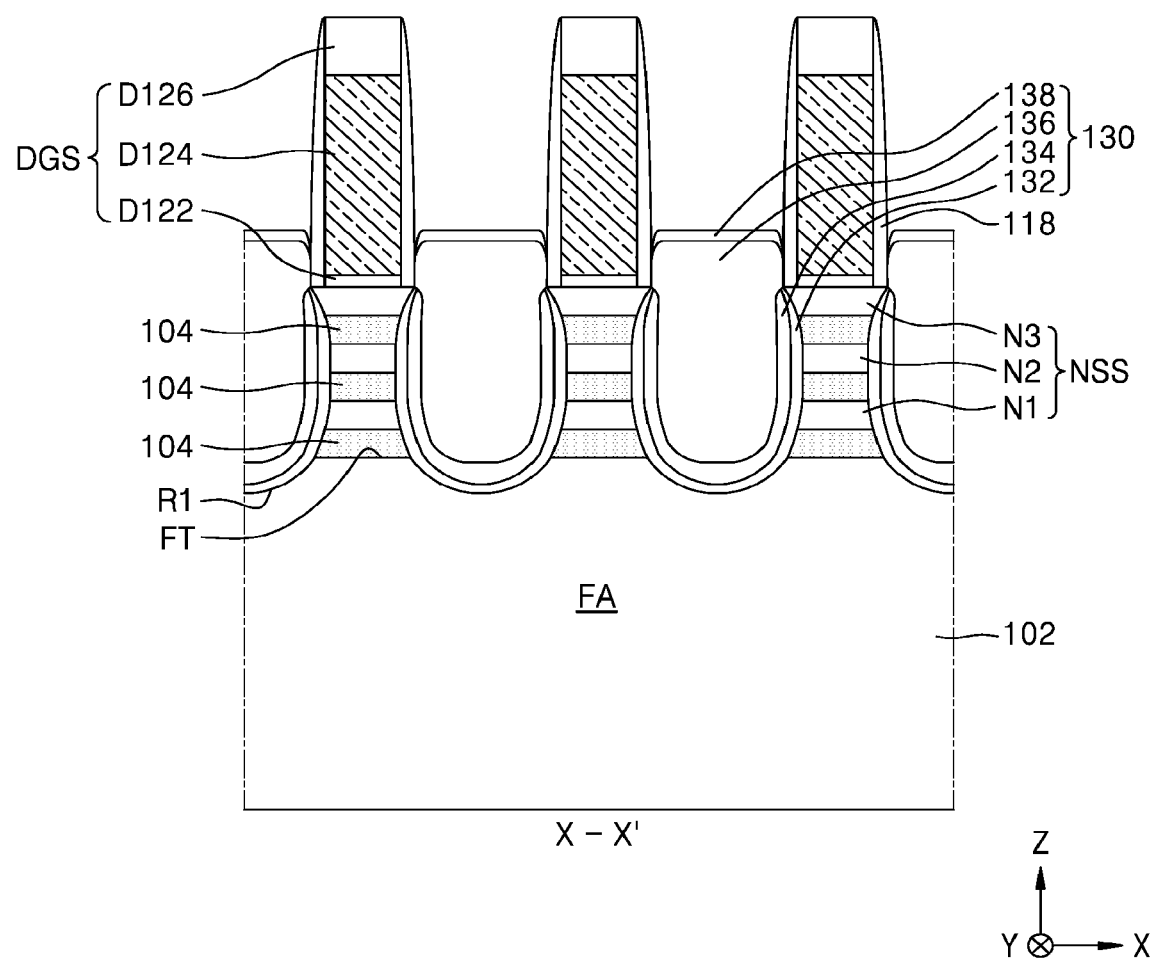

Referring to FIGS. 14A and 14B, the plurality of source/drain areas 130 are formed on the fin-type active area FA at both sides of each of the plurality of nanosheet stacks NSS. In order to form the plurality of source/drain areas 130, the outer blocking layer 132, the inner blocking layer 134, the main body layer 136, and the capping layer 138 may be sequentially formed in the plurality of recesses R1.

In order to form the plurality of source/drain areas 130, a semiconductor material may be epitaxially grown from a surface of the fin-type active area FA exposed from a bottom surface of the recess R1, a sidewall of each of the plurality of nanosheets N1, N2, and N3, and a sidewall of each of the plurality of sacrificial semiconductor layers 104.

In example embodiments, in order to form the plurality of source/drain areas 130, a low-pressure chemical vapor deposition (LPCVD) process, a selective epitaxial growth (SEG) process, or a cyclic deposition and etching (CDE) process may be performed using raw materials including an element semiconductor precursor. The element semiconductor precursor may include elements such as Si, Ge, and the like.

In forming the plurality of source/drain areas 130, a Si film that does not include a Ge element may be formed in each of a process of forming the inner blocking layer 134 and a process of forming the capping layer 138. Silane ($SiH_4$), disilane ($Si_2H_6$), trisilane ($Si_3H_8$), dichlorosilane ($SiH_2Cl_2$), and the like may be used as a Si source to form the Si film, but the Si source is not limited thereto. When at least one of the inner blocking layer 134 and the capping layer 138 includes a Si layer doped with B, a B source may be further included in addition to the Si source to form the Si layer doped with B. The B source may include, e.g., diborane ($B_2H_6$), triborane, tetraborane, pentaborane, and the like, but the B source is not limited thereto.

In forming the plurality of source/drain areas 130, the Si source and a Ge source may be used to form the outer blocking layer 132 and the main body layer 136 including a Si element and a Ge element. The Si source may be at least one of the materials exemplified above. The Ge source may include, e.g., germane ($GeH_4$), digermane ($Ge_2H_6$), trigermane ($Ge_3H_8$), tetragermane ($Ge_4H_{10}$), dichlorogermane ($Ge_2H_2Cl_2$), and the like, but the Ge source is not limited thereto. When the outer blocking layer 132 and the main body layer 136 include a SiGe layer doped with B, in addition to the Si source and the Ge source, the B source may be further included to form the outer blocking layer 132 and the main body layer 136. For example, during an epitaxial growth process for forming the outer blocking layer 132 and the main body layer 136, a B dopant ion implantation process using the B source may be performed in-situ.

In performing an epitaxial growth process for forming the inner blocking layer 134 of the plurality of source/drain areas 130, formation of facets in the inner blocking layer 134 may be suppressed by controlling process conditions such as a temperature, pressure, the type of Si source, and a flow rate of supply gas, or adding a process such as etchback or chemical treatment during or after the epitaxial growth process. Also, a thickness of a desired portion of the inner blocking layer 134, e.g., a thickness of a portion of the inner blocking layer 134 adjacent to the outer insulating spacer 118, or a portion of the inner blocking layer 134 covering a weak portion having a relatively small thickness due to a facet of the outer blocking layer 132 may be relatively increased.

As described with reference to FIG. 2B, the inner blocking layer 134 may be formed such that the thickness H2 of the second bottom portion B2 of the inner blocking layer 134 is greater than the thickness H1 of the first bottom portion B1 of the outer blocking layer 132, and at least a portion of the upper surface T2 of the second bottom portion B2 extends flatly in a horizontal direction, e.g., the first horizontal direction (X direction) and/or the second horizontal direction (Y direction). In addition, as described with reference to FIG. 2B, the thickness H2 of the second bottom portion B2 of the inner blocking layer 134 may be greater than the width 134W of a portion facing the nanosheet stack NSS in the first horizontal direction (X direction). By forming a relatively large thickness of the second bottom portion B2 of the inner blocking layer 134, when forming the main body layer 136 on the inner blocking layer 134, the main body layer 136 may effectively fill the recess R1 remaining on the inner blocking layer 134 without voids, and may contribute to increasing the volume of the main body layer 136 in the recess R1.

In other example embodiments, in order to manufacture the integrated circuit devices 200A, 200B, 300, 400A, 400B, 400C, 400D, and 400E illustrated in FIGS. 5A and 5B, 7, and 8A to 8E, the source/drain areas 130A, 130B, 130C, 130D, 130E, 230A, 230B, and 330 illustrated in FIGS. 5A and 5B, 7, and 8A to 8E may be formed instead of the source/drain area 130 illustrated in FIGS. 14A and 14B with reference to the description with reference to FIGS. 14A and 14B.

Figure 15:
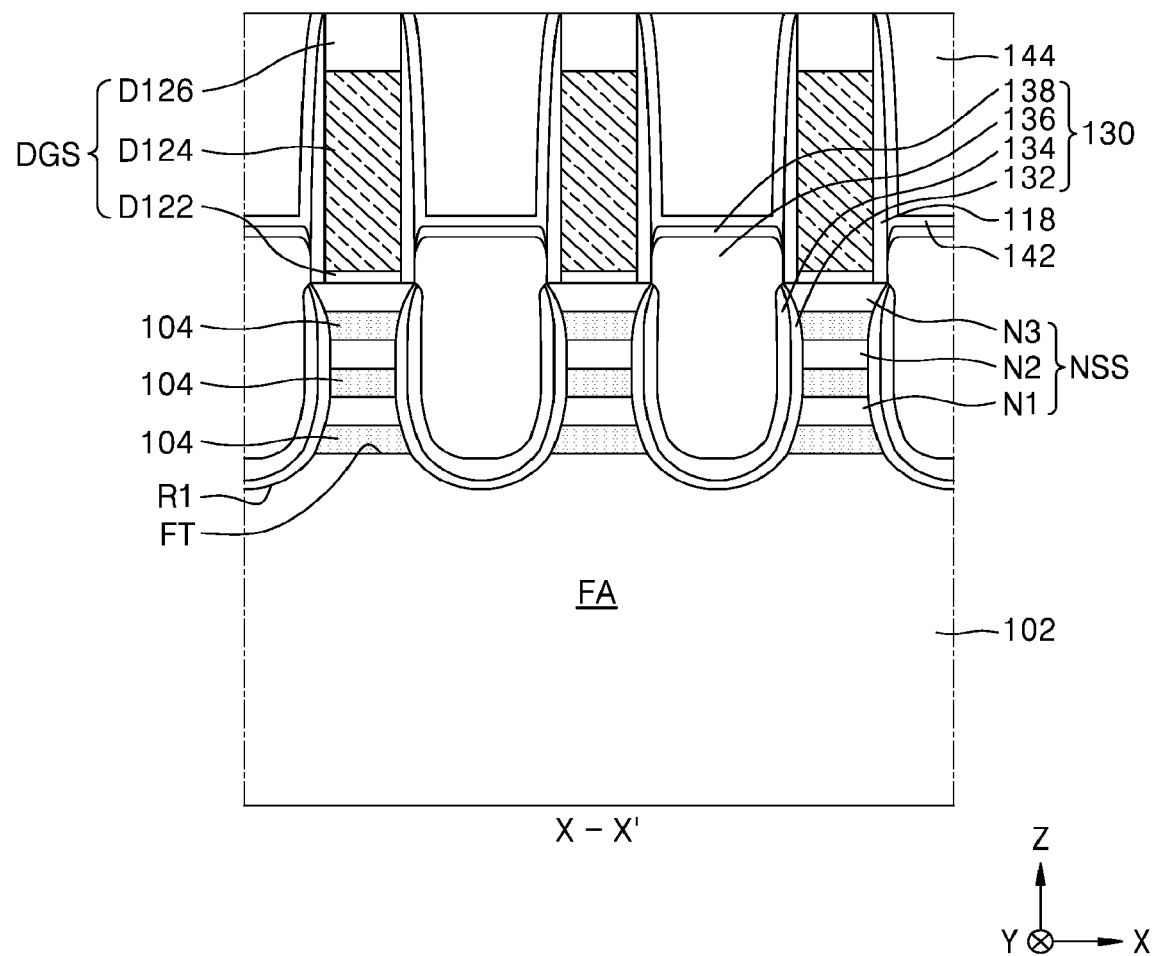

Referring to FIG. 15, after forming the protective insulating layer 142 covering the results of FIGS. 14A and 14B in which the plurality of source/drain areas 130 are formed, and forming the inter-gate insulating layer 144 on the protective insulating layer 142, the protective insulating layer 142 and the inter-gate insulating layer 144 are planarized to expose an upper surface of the capping layer D126.

Figure 16:
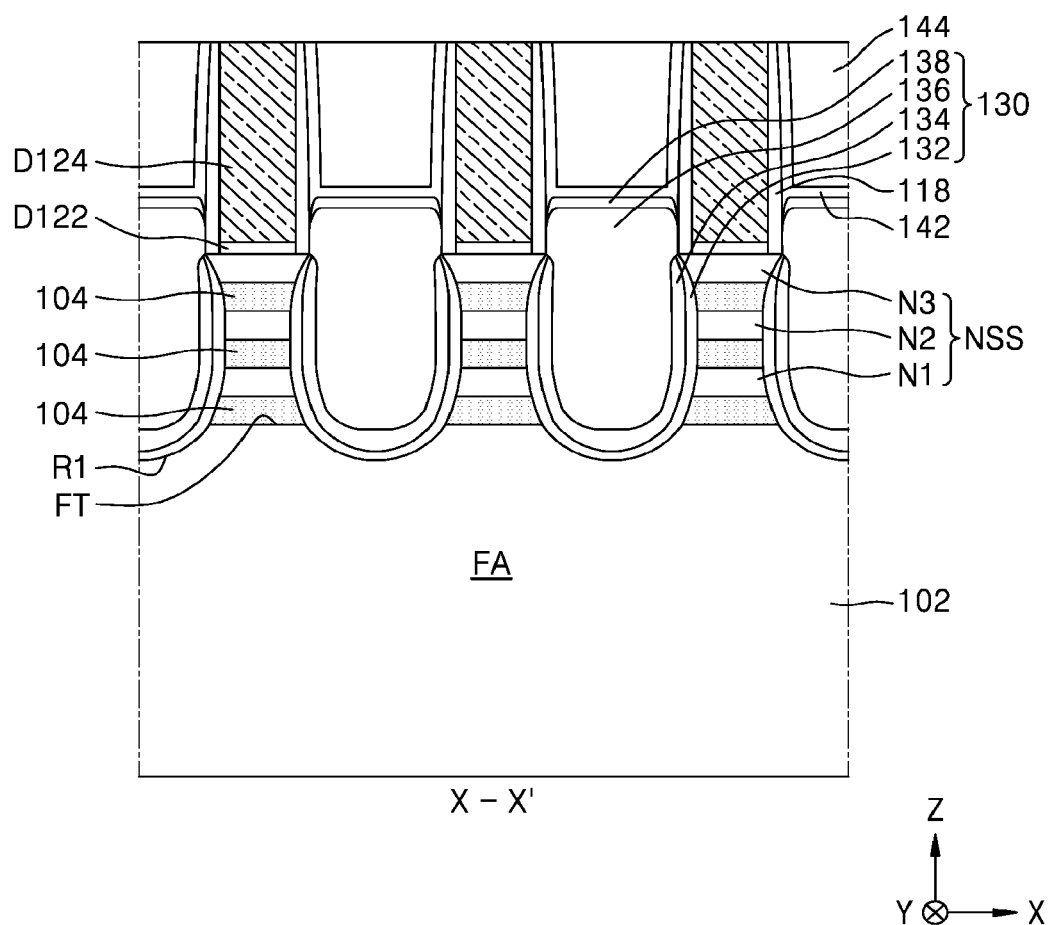

Referring to FIG. 16, the capping layer D126 is removed from the result of FIG. 15 to expose an upper surface of the dummy gate layer D124, and the protective insulating layer 142 and the inter-gate insulating layer 144 are partially removed so that an upper surface of the inter-gate insulating layer 144 and the upper surface of the dummy gate layer D124 become substantially the same level.

Figure 17:
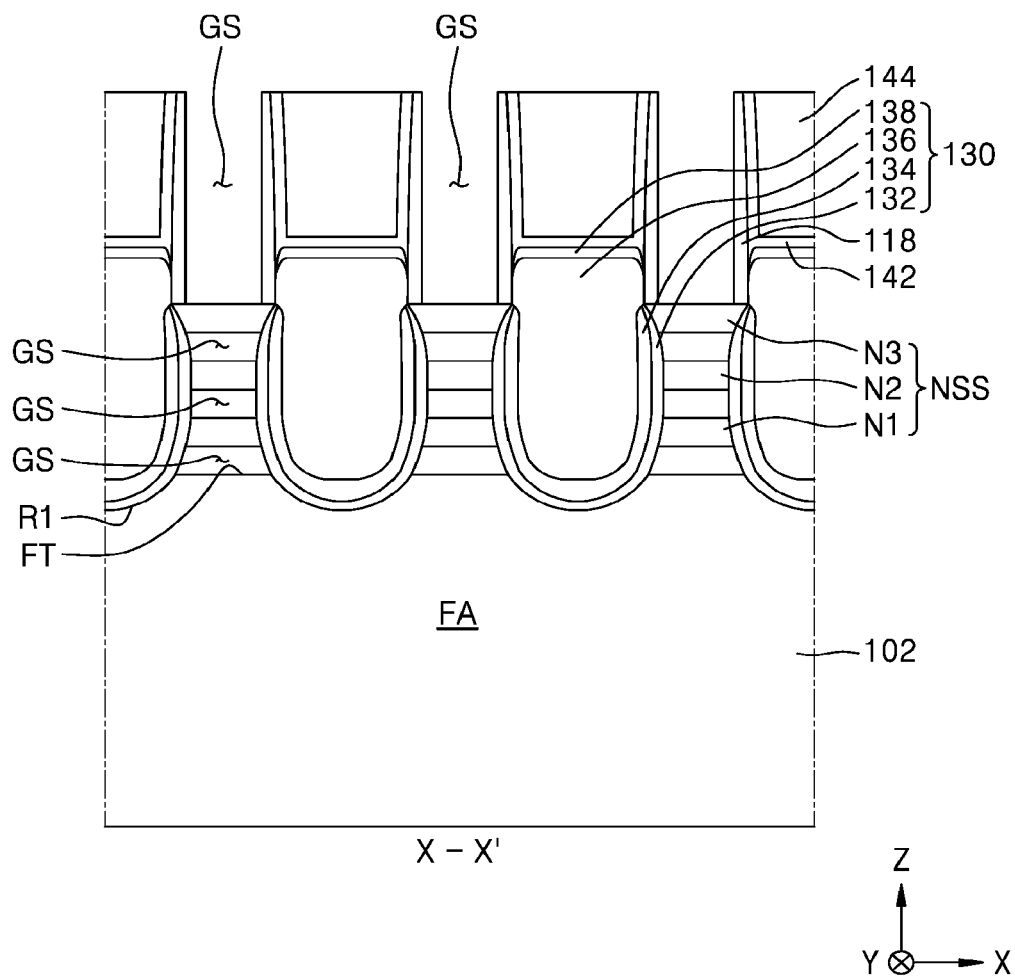

Referring to FIG. 17, the dummy gate layer D124 and the oxide layer D122 under the dummy gate layer D124 are removed from the result of FIG. 16 to provide a gate space GS, and the plurality of nanosheet stacks NSS are exposed through the gate space GS. Thereafter, the plurality of sacrificial semiconductor layers 104 remaining on the fin-type active area FA are removed through the gate space GS, so that the gate space GS is extended to a space between each of the plurality of nanosheets N1, N2, and N3 and a space between the first nanosheet N1 and the fin top FT.

In example embodiments, in order to selectively remove the plurality of sacrificial semiconductor layers 104, a difference in etch selectivity between the plurality of nanosheets N1, N2, and N3 and the plurality of sacrificial semiconductor layers 104 may be used. In order to selectively remove the plurality of sacrificial semiconductor layers 104, a liquid or gaseous etchant may be used. In example embodiments, in order to selectively remove the plurality of sacrificial semiconductor layers 104, a $CH_3COOH$-based etchant, e.g., an etchant including a mixture of $CH_3COOH$, $HNO_3$, and HF, or an etchant including a mixture of $CH_3COOH$, $H_2O_2$, and HF may be used, but are not limited thereto.

In a typical case, while removing the dummy gate layer D124, the oxide layer D122, and the plurality of sacrificial semiconductor layers 104 using a liquid or gaseous etchant according to the process of FIG. 17, the etchant may penetrate from a result including the ate space GS to the source/drain area through portions vulnerable to penetration of the etchant. In this case, in the case of a typical source/drain area, the inside of the source/drain area may be damaged by the etchant. In this state, when a gate dielectric layer 152 forming process and a gate forming conductive layer 160L forming process described later with reference to FIGS. 18 and 19 are performed, a metal-including material required for the formation of the gate dielectric layer 152 or the gate forming conductive layer 160L may penetrate into the damaged source/drain area through the weak portions, and thus a defect such as a short circuit between the damaged source/drain area and the gate line 160 formed in a subsequent process (e.g., processes of FIGS. 19 and 20) may occur.

According to embodiments, the source/drain area 130 formed by the process described with reference to FIGS. 14A and 14B includes a double-layered blocking layer, that is, the outer blocking layer 132 and the inner blocking layer 134, in order to protect the main body layer 136, which mainly applies strain to the plurality of nanosheets N1, N2, and N3, from an external attack. In particular, because the inner blocking layer 134 does not include a Ge element, the source/drain area 130 may have a structure that is not susceptible to attack by an etchant used when removing the plurality of sacrificial semiconductor layers 104 including a SiGe layer. In addition, the inner blocking layer 134 may supplement a weak portion of the outer blocking layer 132. Therefore, according to embodiments according to embodiments, while removing the dummy gate layer D124, the oxide layer D122, and the plurality of sacrificial semiconductor layers 104 using a liquid or gaseous etchant according to the process of FIG. 17, the source/drain area 130 may be prevented from being damaged or deteriorated by external attack.

Referring to FIG. 18, the gate dielectric layer 152 is formed to cover exposed surfaces of the plurality of nanosheets N1, N2, and N3 and the fin-type active area FA. An atomic layer deposition (ALD) process may be used to form the gate dielectric layer 152.

Figure 19:
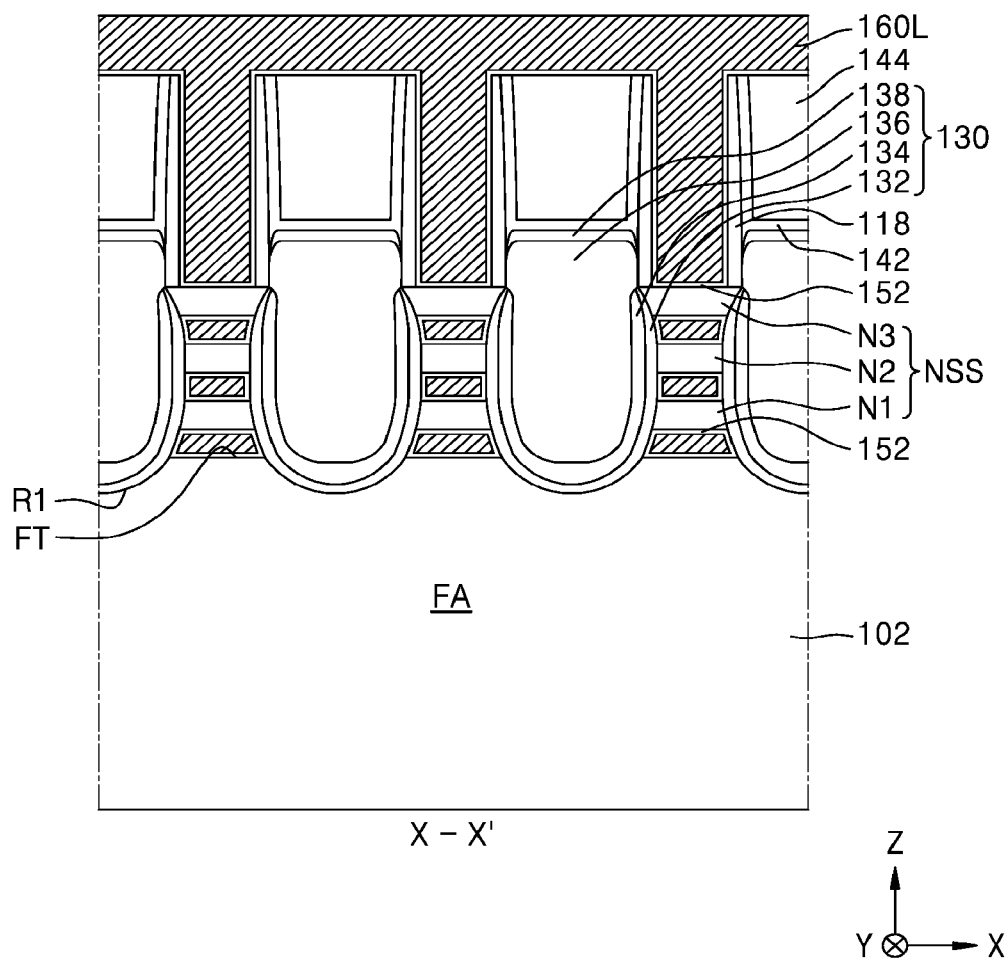

Referring to FIG. 19, the gate forming conductive layer 160L is formed on the gate dielectric layer 152 to fill the gate space GS (see FIG. 18) and cover the upper surface of the inter-gate insulating layer 144. The gate forming conductive layer 160L may include a metal, a metal nitride, a metal carbide, or a combination thereof. An ALD process may be used to form the gate forming conductive layer 160L.

Figure 20:
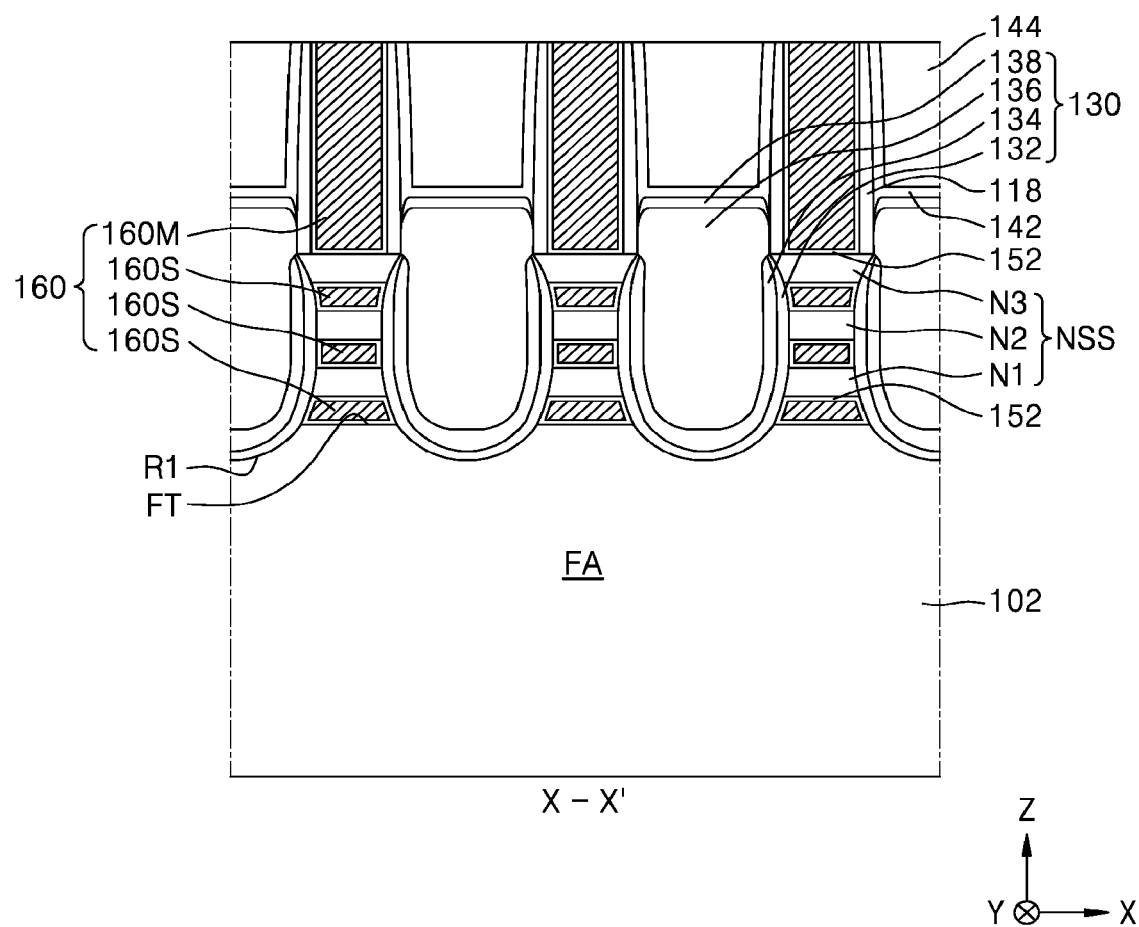

Referring to FIG. 20, in the result of FIG. 19, the gate forming conductive layer 160L and the gate dielectric layer 152 are partially removed from the upper surface of the inter-gate insulating layer 144 so that the upper surface of the inter-gate insulating layer 144 is exposed. As a result, the plurality of gate lines 160 filling the plurality of gate spaces GS (see FIG. 18) may be formed on the gate dielectric layer 152.

Each of the plurality of gate lines 160 may include a main-gate portion 160M and a plurality of sub-gate portions 160S. As a planarization process is performed while forming the plurality of gate lines 160, a level of an upper surface of each of the plurality of outer insulating spacers 118, the protective insulating layer 142, and the inter-gate insulating layer 144 may be lowered.

Figure 21:
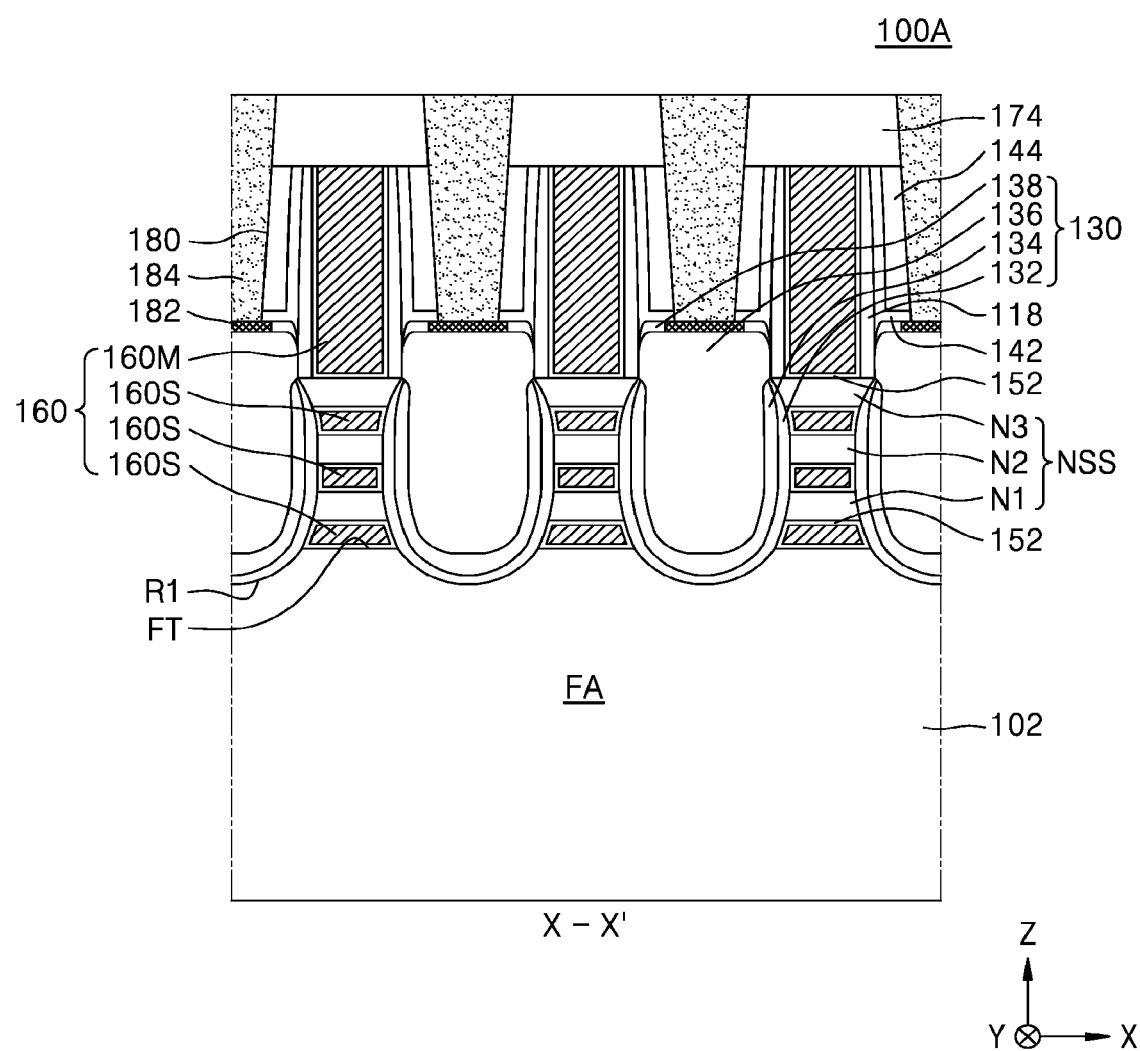

Referring to FIG. 21, the integrated circuit device 100 illustrated in FIGS. 1 and 2A to 2D may be manufactured by forming the interlayer insulating layer 174 covering the plurality of gate lines 160 in the result of FIG. 20.

Thereafter, a plurality of contact holes 180 exposing the plurality of source/drain areas 130 may be formed by etching a portion of each of the interlayer insulating layer 174, the inter-gate insulating layer 144, and the protective insulating layer 142. The integrated circuit device 100A illustrated in FIG. 4A may be manufactured by forming the metal silicide layer 182 on an upper surface of each of the plurality of source/drain areas 130 exposed through the plurality of contact holes 180 and by forming a contact plug 184 filling the contact hole 180 on the metal silicide layer 182.

In example embodiments, in the process of forming the metal silicide layer 182, a silicide reaction between a portion of the capping layer 138 of the source/drain area 130 and the metal may be induced. As a result, the metal silicide layer 182 may be obtained from the portion of the capping layer 138. In other example embodiments, the process of forming the metal silicide layer 182 may be omitted.

According to the method of manufacturing an integrated circuit device described with reference to FIGS. 11A to 21, even if there are structurally susceptible parts to penetration of a liquid or gaseous etchant during a manufacturing process of the integrated circuit device, a main body layer of a source/drain area may be prevented from being damaged or etched by a double-layered blocking layer including an outer blocking layer and an inner blocking layer included in the source/drain area. Accordingly, during the manufacturing process of the integrated circuit device, it is possible to suppress occurrence of defects such as deterioration of the source/drain area due to external attack or a short circuit between the source/drain area and the adjacent conductive area, e.g., a gate line, and improve reliability of the integrated circuit device.

FIGS. 22A to 22F are cross-sectional views of stages in a method of manufacturing the integrated circuit device 200C according to other embodiments. Each of FIGS. 22A to 22F illustrates a partial configuration corresponding to the cross-section of line X-X' line of FIG. 1. In FIGS. 22A to 22F, the same reference numerals as in FIGS. 1 to 6A denote the same elements, and descriptions thereof will not be given herein.

Figure 22A:
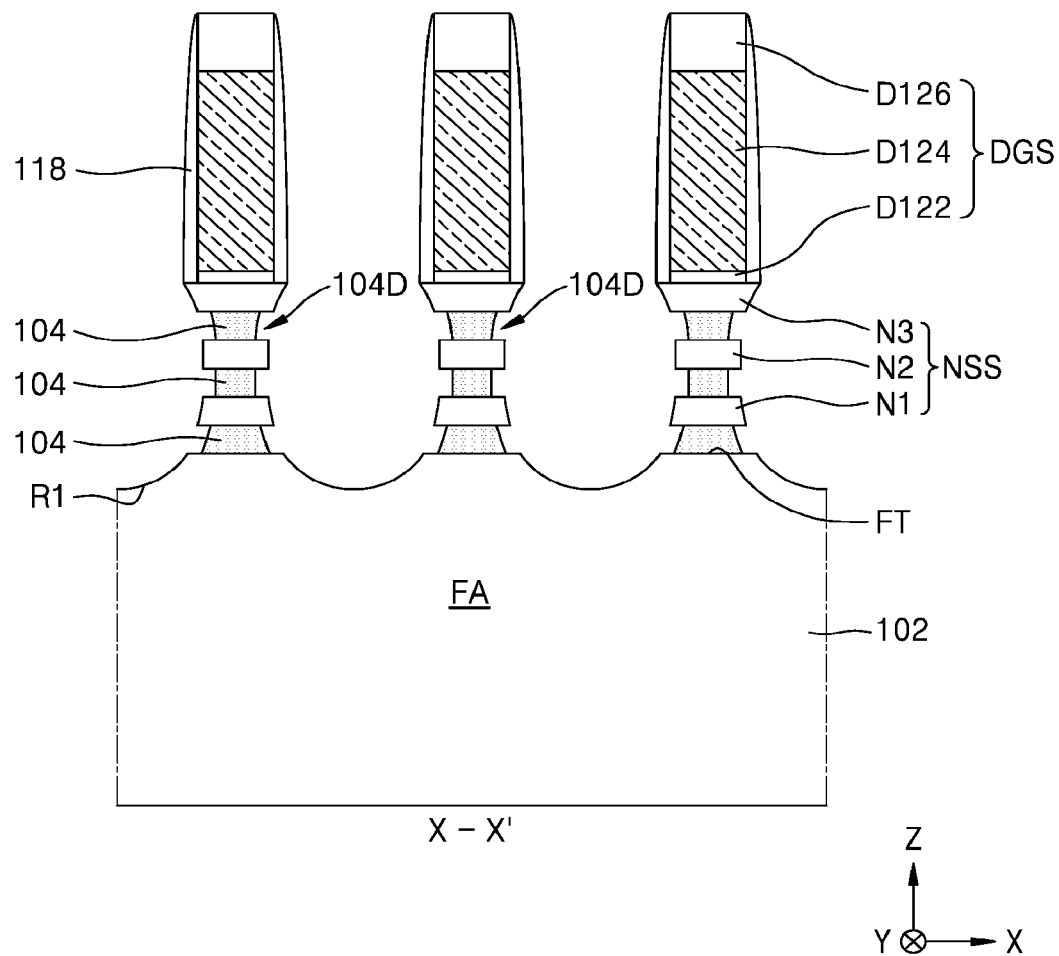
FIGS. 22A to 22F are cross-sectional views of stages in a method of manufacturing an integrated circuit device according to other embodiments.

Referring to FIG. 22A, after performing the processes described with reference to FIGS. 11A to 13B to form the plurality of nanosheet stacks NSS and the plurality of recesses R1, a plurality of indent areas 104D is formed between each of the plurality of nanosheets N1, N2, and N3 and between the first nanosheet N1 and the fin-type active area FA by partially removing the plurality of sacrificial semiconductor layers 104 exposed from both sides of each of the plurality of nanosheet stacks NSS through the plurality of recesses R1.

In order to form the plurality of indent areas 104D, a portion of the plurality of sacrificial semiconductor layers 104 may be selectively etched using a difference in etch selectivity between the plurality of sacrificial semiconductor layers 104 and the plurality of nanosheets N1, N2, and N3.

Figure 22B:
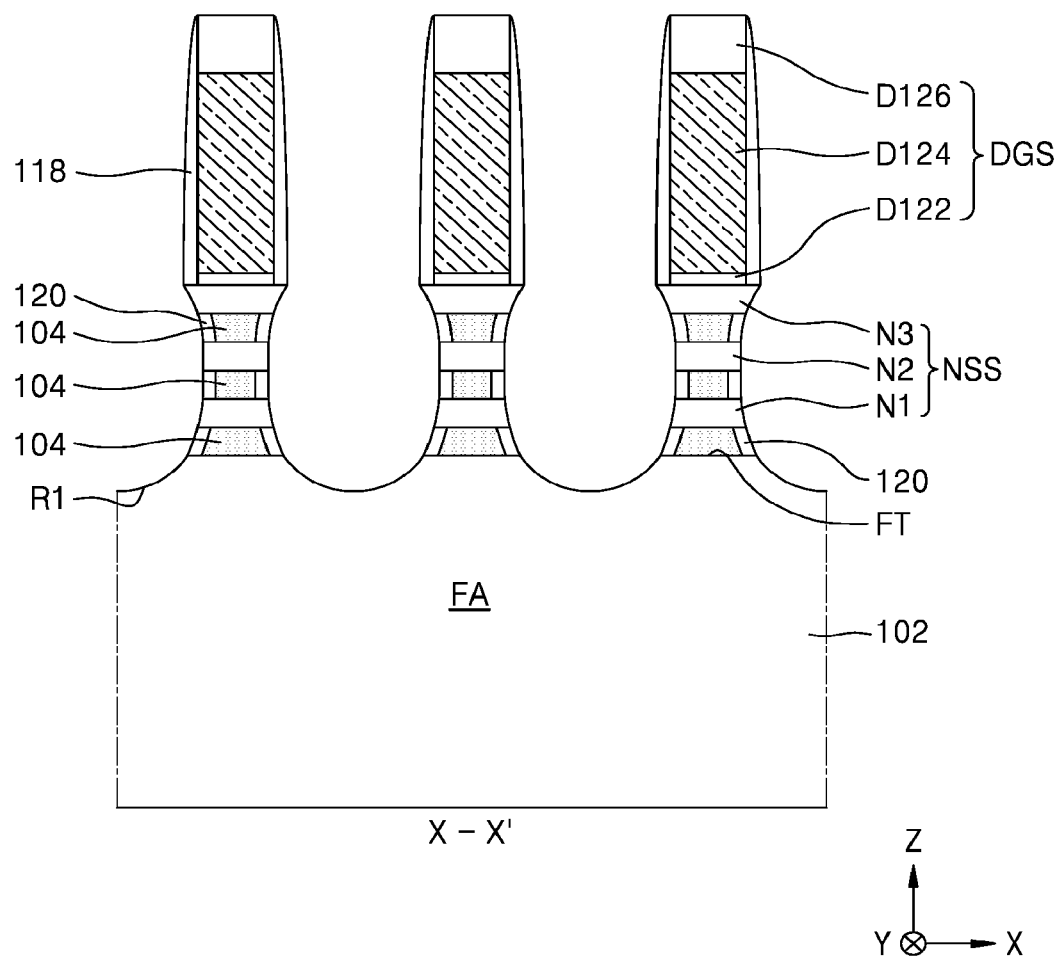

Referring to FIG. 22B, the plurality of inner insulating spacers 120 filling the plurality of indent areas 104D are formed in the result of FIG. 22A. In order to form the plurality of inner insulating spacers 120, an ALD process, a chemical vapor deposition (CVD) process, an oxidation process, or a combination thereof may be used.

Figure 22C:
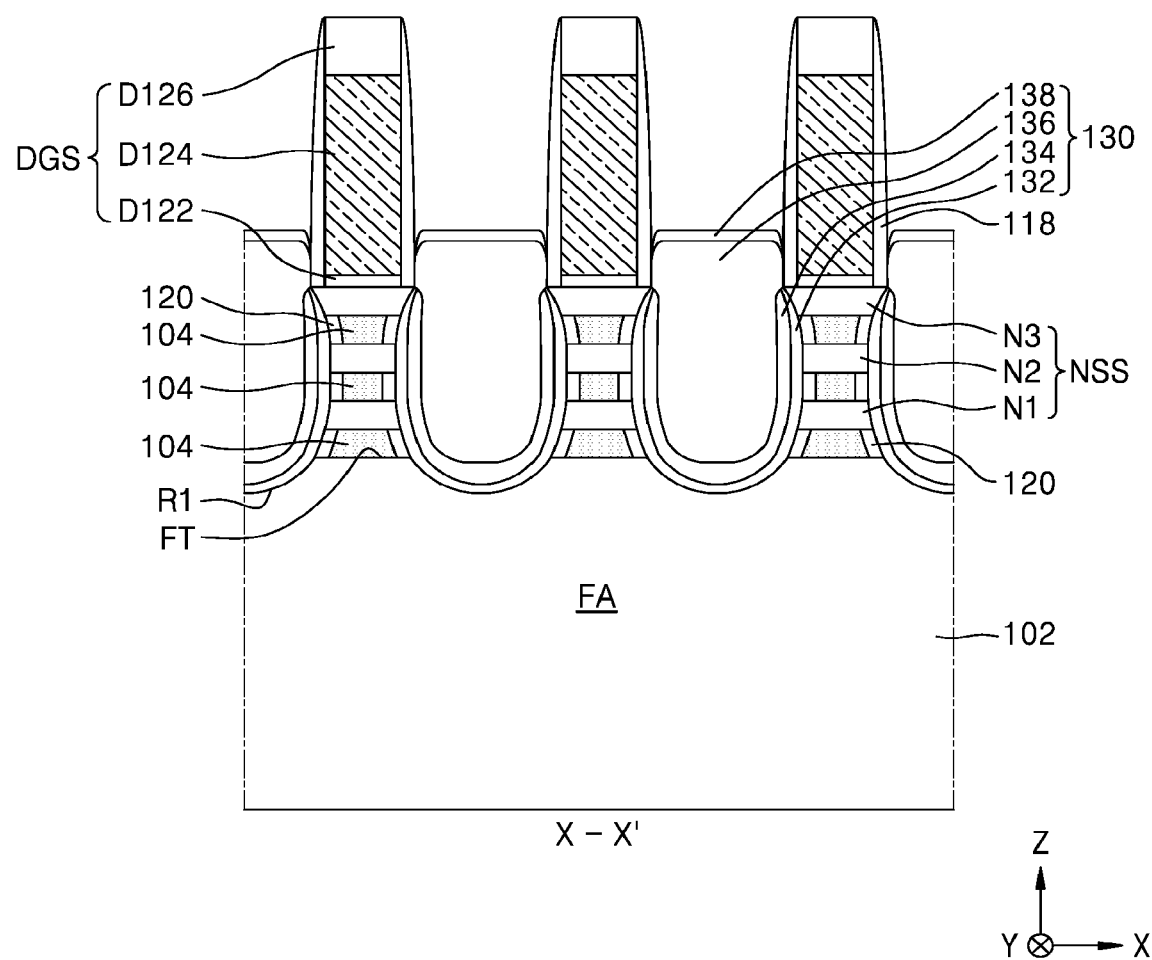

Referring to FIG. 22C, in a manner similar to that described with reference to FIGS. 14A and 14B, the plurality of source/drain areas 130 are formed on the fin-type active areas FA on both sides of each of the plurality of nanosheet stacks NSS of the result of FIG. 22B. In order to form the plurality of source/drain areas 130, the outer blocking layer 132, the inner blocking layer 134, the main body layer 136, and the capping layer 138 may be sequentially formed in the plurality of recesses R1.

In order to form the plurality of source/drain areas 130, a semiconductor material may be epitaxially grown from a surface of the fin-type active area FA exposed from a bottom surface of the recess R1, and a sidewall of each of the plurality of nanosheets N1, N2, and N3.

Figure 22D:
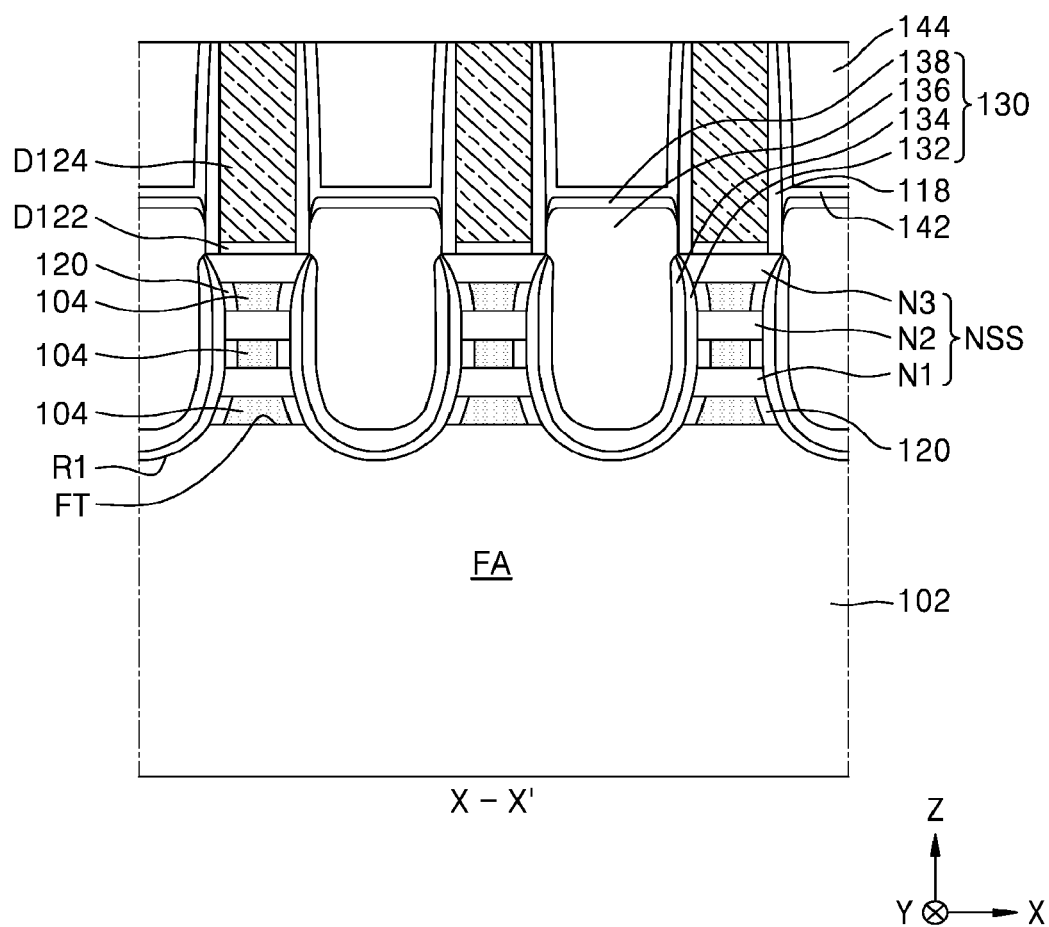

Referring to FIG. 22D, the processes as described with reference to FIGS. 15 and 16 are performed on the result of FIG. 22C to form a result in which upper surfaces of the protective insulating layer 142, the inter-gate insulating layer 144, and the dummy gate layer D124 are planarized to approximately the same level.

Figure 22E:
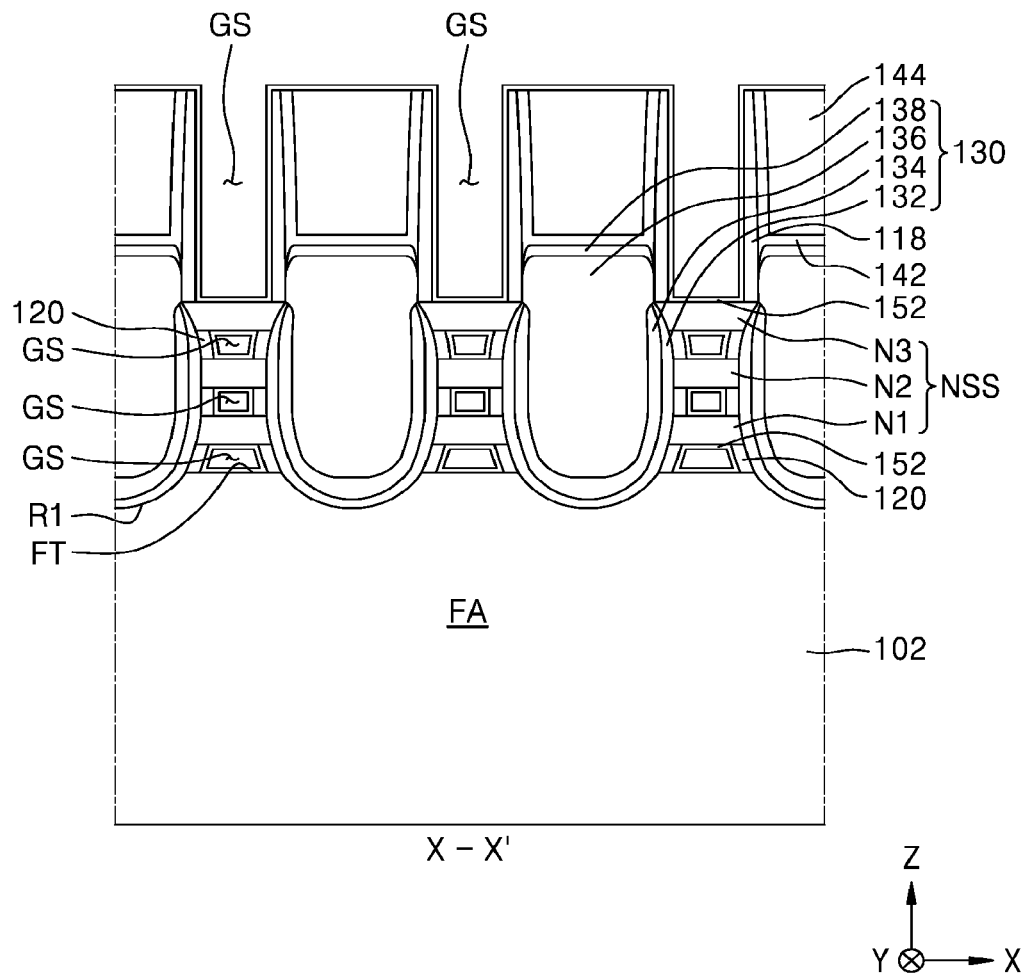

Referring to FIG. 22E, processes similar to those described with reference to FIGS. 17 and 18 are performed on the result of FIG. 22D to expose the plurality of inner insulating spacers 120 through the gate space GS and to form the gate dielectric layer 152 covering respective exposed surfaces of the plurality of nanosheets N1, N2, and N3, the fin-type active area FA, and the plurality of inner insulating spacers 120.

Figure 22F:
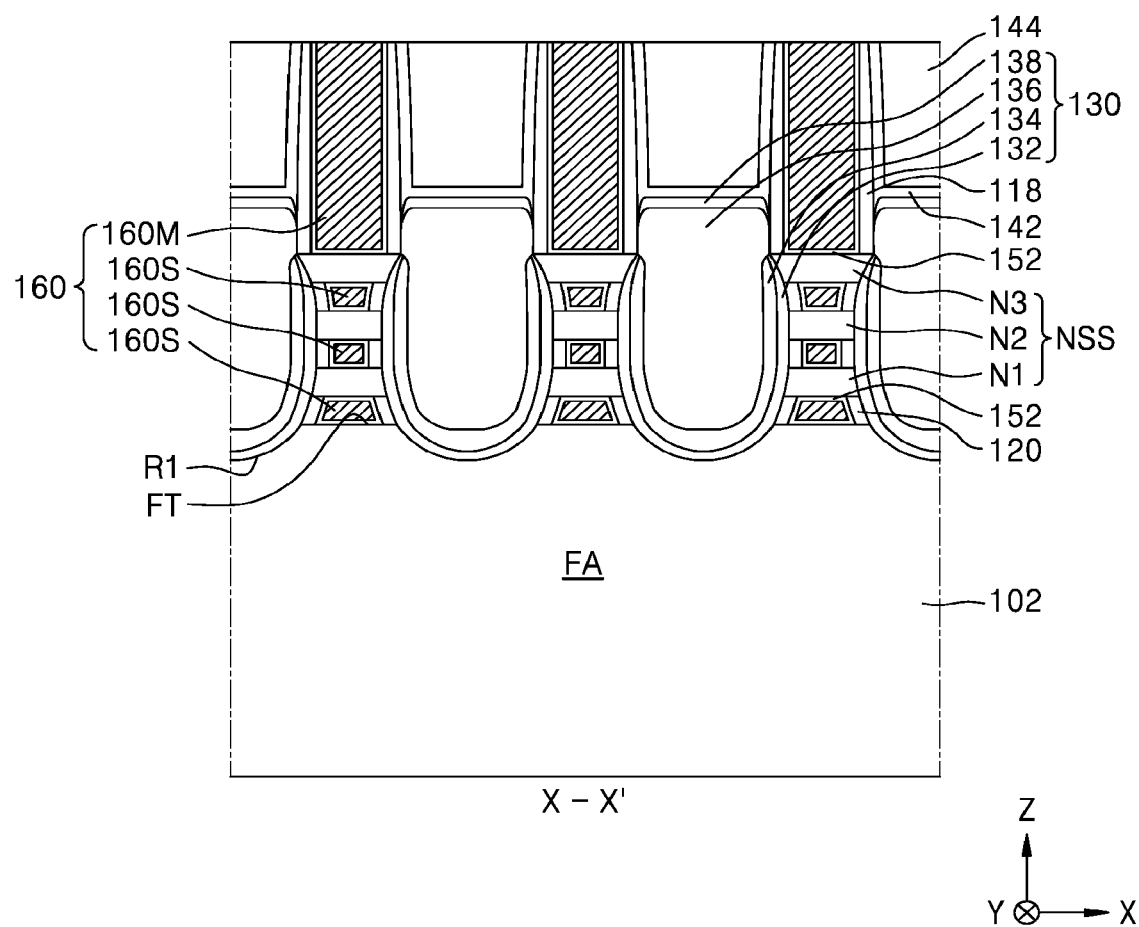

Referring to FIG. 22F, the processes described with reference to FIGS. 19 and 20 are performed on the result of FIG. 22E to form the plurality of gate lines 160 filling the gate space GS (see FIG. 22E). Thereafter, the integrated circuit device 200C may be manufactured by performing a process similar to that described with reference to FIG. 21 on the result of FIG. 22F.

In the above, the exemplary manufacturing method of the integrated circuit devices 100, 100A, and 200C illustrated in FIGS. 1, 2A to 2D, 4A, and 6A has been described with reference to FIGS. 11A to 22F. However, the integrated circuit device 100B in FIG. 4B, the integrated circuit device 200A in FIG. 5A, the integrated circuit device 200B in FIG. 5B, the integrated circuit device 200D in FIG. 6B, the integrated circuit device 300 in FIG. 7, the integrated circuit devices 400A, 400B, 400C, 400D, and 400E in FIGS. 8A to 8E, the integrated circuit device 500 in FIGS. 9A to 9C, and integrated circuit devices having various structures modified and changed therefrom may be easily manufactured by adding various modifications and changes to those described with reference to FIGS. 11A to 22F.

By way of summation and review, as the degree of integration of the semiconductor device increases and the size of the device decreases, occurrence of process defects in a manufacturing process of a nanosheet field effect transistor may increase. Accordingly, there is a need to develop a new structure capable of removing the possibility of occurrence of process defects and improving the performance and reliability of a nanosheet field effect transistor. In contrast, embodiments provide an integrated circuit device with stable performance and improved reliability in a horizontal nanosheet field effect transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
    forming a structure including a fin-type active region and a pair of nanosheet stacks, the fin-type active region extending lengthwise in a first horizontal direction, each of the pair of nanosheet stacks including a plurality of nanosheets which overlap each other in a vertical direction on a fin top of the fin-type active region; and
    forming a source/drain area between the pair of nanosheet stacks on the fin-type active region, the forming of the source/drain area comprising:
    forming an outer blocking layer;
    forming an inner blocking layer on the outer blocking layer; and
    forming a main body layer on the inner blocking layer,
    wherein each of the outer blocking layer and the main body layer includes a $Si_{1-x}Ge_x$ layer, where $x \neq 0$, and the inner blocking layer includes a Si layer, and
    wherein the inner blocking layer has a width greater than a width of the outer blocking layer.

2. The method of claim 1, wherein in the forming the source/drain area, the inner blocking layer includes an undoped Si layer.

3. The method of claim 1, wherein in the forming the source/drain area, the inner blocking layer includes a Si layer doped with a p-type dopant, the p-type dopant being boron (B) or gallium (Ga).

4. The method of claim 1, further comprising:
    after the forming of the source/drain area, forming a gate structure comprising a main gate portion extending in a second horizontal direction intersecting the first horizontal direction on the plurality of nanosheets and a plurality of sub-gate portions integrally connected to the main gate portion, the plurality of sub-gate portions being arranged one by one between the plurality of nanosheets on the fin-type active region.

5. The method of claim 1, wherein the forming of the source/drain area comprises performing a selective epitaxial growth (SEG) process to sequentially form the outer blocking layer, the inner blocking layer, and the main body layer, and
    wherein the inner blocking layer is spaced apart from the nanosheet stack with the outer blocking layer therebetween.

6. The method of claim 1, wherein in the forming of the structure, each of the pair of nanosheet stacks further includes a plurality of sacrificial semiconductor layers, the plurality of sacrificial semiconductor layers and the plurality of nanosheets being alternately stacked on the fin-type active region one by one, and
    wherein in the forming of the outer blocking layer, a width of a portion of the outer blocking layer covering each of the plurality of sacrificial semiconductor layers in the first horizontal direction is less than $\frac{1}{5}$ of a maximum width of the source/drain area in the first horizontal direction.

7. The method of claim 1, wherein in the forming of the structure, each of the pair of nanosheet stacks further includes a plurality of sacrificial semiconductor layers, the plurality of sacrificial semiconductor layers and the plurality of nanosheets being alternately stacked on the fin-type active region one by one, and
    wherein in the forming of the inner blocking layer, a width of a portion of the inner blocking layer covering each of the plurality of sacrificial semiconductor layers in the first horizontal direction is less than $\frac{1}{5}$ of a maximum width of the source/drain area in the first horizontal direction.

8. The method of claim 1, wherein the forming of the source/drain area further comprises forming a capping layer on the main body layer,
    wherein the capping layer is spaced apart from the inner blocking layer, and
    wherein the capping layer includes an undoped Si layer or a Si layer doped with a p-type dopant.

9. The method of claim 1, wherein in the forming of the source/drain area, a level of a lowermost surface of the source/drain area is lower than a level of the fin top of the fin-type active region in the vertical direction.

10. The method of claim 1, wherein in the forming of the outer blocking layer, the outer blocking layer is formed to include a first bottom portion contacting the fin-type active area, the first bottom portion having a first thickness in the vertical direction, and
    wherein in the forming of the inner blocking layer, the inner blocking layer is formed to include a second bottom portion contacting the first bottom portion of the outer blocking layer, the second bottom portion having a second thickness in the vertical direction, and the second thickness being equal to or greater than the first thickness.

11. The method of claim 1, wherein in the forming of the outer blocking layer, the outer blocking layer is formed to have a variable width in the first horizontal direction along the second horizontal direction.

12. The method of claim 1, wherein in the forming of the inner blocking layer, the inner blocking layer is formed to have a variable width in the first horizontal direction along the second horizontal direction.

13. The method of claim 1, wherein in the forming of the outer blocking layer, the outer blocking layer is formed to include a first middle portion covering the nanosheet stack on a central portion of the fin top in the second horizontal direction,
   wherein in the forming of the inner blocking layer, the inner blocking layer is formed to include a second middle portion in contact with the first middle portion, and
   wherein a width of the second middle portion in the first horizontal direction is equal to or greater than a width of the first middle portion.

14. A method of manufacturing an integrated circuit device, the method comprising:
   forming a stack structure including a plurality of sacrificial semiconductor layers and a plurality of nanosheet semiconductor layers alternately stacked on a fin top of a fin-type active region one by one, the fin-type active region extending lengthwise in a first horizontal direction;
   forming a plurality of dummy gate structures on the stack structure of the plurality of sacrificial semiconductor layers and the plurality of nanosheet semiconductor layers;
   forming a plurality of outer insulating spacers covering opposite sidewalls of each of the plurality of dummy gate structures;
   forming a plurality of nanosheet stacks from the plurality of nanosheet semiconductor layers by removing portions of each of the plurality of sacrificial semiconductor layers and the plurality of nanosheet semiconductor layers using the plurality of dummy gate structures and the plurality of outer insulating spacers as an etching mask; and
   forming a source/drain area between two adjacent nanosheet stacks among the plurality of nanosheet stacks on the fin-type active region, the forming of the source/drain area comprising:
   forming an outer blocking layer;
   forming an inner blocking layer on the outer blocking layer; and
   forming a main body layer on the inner blocking layer,
   wherein each of the outer blocking layer and the main body layer includes a $Si_{1-x}Ge_x$ layer, where $x \neq 0$, and the inner blocking layer includes a Si layer, and
   wherein the inner blocking layer has a width greater than a width of the outer blocking layer.

15. The method of claim 14, further comprising, after the forming of the plurality of nanosheet stacks, forming a recess between two adjacent nanosheet stacks among the plurality of nanosheet stacks on the fin-type active area by etching the fin-type active area,
   wherein in the forming of the source/drain area, the source/drain area is formed on the recess.

16. The method of claim 15, wherein in the forming of the recess, a level of a lowermost surface of the recess is less than a level of the fin top in a vertical direction,
   wherein in the forming of the outer blocking layer, the outer blocking layer is formed to include a first bottom portion contacting the lowermost surface of the recess, the first bottom portion having a first thickness in the vertical direction, and
   wherein in the forming of the inner blocking layer, the inner blocking layer is formed to include a second bottom portion contacting the first bottom portion of the outer blocking layer, the second bottom portion having a second thickness in the vertical direction, and the second thickness being equal to or greater than the first thickness.

17. The method of claim 14, wherein in the forming the source/drain area, the inner blocking layer includes an undoped Si layer.

18. The method of claim 14, wherein in the forming the source/drain area, the inner blocking layer includes a Si layer doped with a p-type dopant, the p-type dopant being boron (B) or gallium (Ga).

19. The method of claim 14, wherein in the forming of the outer blocking layer, a width of a portion of the outer blocking layer covering each of the plurality of sacrificial semiconductor layers in the first horizontal direction is less than ⅕ of a maximum width of the source/drain area in the first horizontal direction, and
   wherein in the forming of the inner blocking layer, a width of a portion of the inner blocking layer covering each of the plurality of sacrificial semiconductor layers in the first horizontal direction is less than ⅕ of a maximum width of the source/drain area in the first horizontal direction.

20. A method of manufacturing an integrated circuit device, the method comprising:
   forming a stack structure including a plurality of sacrificial semiconductor layers and a plurality of nanosheet semiconductor layers alternately stacked on a fin top of a fin-type active region one by one, the fin-type active region extending lengthwise in a first horizontal direction;
   forming a dummy gate structure on the stack structure;
   forming an outer insulating spacer covering both sidewalls of the dummy gate structure;
   forming a nanosheet stack from the plurality of nanosheet semiconductor layers by removing portions of each of the plurality of sacrificial semiconductor layers and the plurality of nanosheet semiconductor layers using the dummy gate structure and the outer insulating spacer as an etching mask; and
   forming a pair of source/drain areas covering both sidewalls of the nanosheet stack on the fin-type active region, the forming of each of the pair of source/drain areas comprising:
   forming an outer blocking layer contacting the fin-type active area and the nanosheet stack, the outer blocking layer having a first $Si_{1-x}Ge_x$ layer, where $0 < x < 0.15$, the first $Si_{1-x}Ge_x$ layer being doped with a first dopant;
   forming an inner blocking layer on the outer blocking layer, the inner blocking layer being devoid of a Ge element; and
   forming a main body layer on the inner blocking layer, the main body layer having a second $Si_{1-x}Ge_x$ layer, where $0.15 \leq x < 0.7$, the second $Si_{1-x}Ge_x$ layer being doped with the first dopant,
   wherein a level of a lowermost surface of each of the pair of source/drain areas is lower than a level of the fin top in the vertical direction.

* * * * *